United States Patent
Yamada et al.

(10) Patent No.: US 7,041,529 B2
(45) Date of Patent: May 9, 2006

(54) LIGHT-EMITTING DEVICE AND METHOD OF FABRICATING THE SAME

(75) Inventors: Masato Yamada, Annaka (JP); Jun-ya Ishizaki, Annaka (JP); Nobuhiko Noto, Annaka (JP); Kazunori Hagimoto, Annaka (JP); Shinji Nozaki, Kawasaki (JP); Kazuo Uchida, Tokyo (JP); Hiroshi Morisaki, Tsurugashima (JP)

(73) Assignees: Shin-Etsu Handotai Co., Ltd., Tokyo (JP); Nanoteco Corporation, Tokyo (JP)

( * ) Notice: Subject to any disclaimer, the term of this patent is extended or adjusted under 35 U.S.C. 154(b) by 50 days.

(21) Appl. No.: 10/690,453

(22) Filed: Oct. 22, 2003

(65) Prior Publication Data

US 2004/0135166 A1   Jul. 15, 2004

(30) Foreign Application Priority Data

Oct. 23, 2002  (JP) .............................. 2002-308956
Oct. 23, 2002  (JP) .............................. 2002-308970
Oct. 23, 2002  (JP) .............................. 2002-308989
Jan. 31, 2003  (JP) .............................. 2003-023480

(51) Int. Cl.
*H01L 21/00* (2006.01)
*H01L 21/30* (2006.01)

(52) U.S. Cl. ......................... 438/93; 438/455; 438/458

(58) Field of Classification Search ................. 438/22, 438/28, 29, 31, 34, 35, 46, 47, 93, 97, 104, 438/481, 482, 483, 488, 455, 458, 48, 57, 438/77, FOR. 157; 257/22–26, 30, 32, 80–90, 257/53, E25.032, 189–191, 200, 201, 279, 257/E27.012, E29.296, E29.298, E21.172, 257/E21.181
See application file for complete search history.

(56) References Cited

U.S. PATENT DOCUMENTS

| 5,442,203 A | 8/1995 | Adomi et al. |
| 5,481,122 A * | 1/1996 | Jou et al. ....................... 257/94 |
| 6,426,512 B1 * | 7/2002 | Ito et al. ....................... 257/12 |
| 6,465,809 B1 * | 10/2002 | Furukawa et al. ............ 257/94 |

FOREIGN PATENT DOCUMENTS

| JP | 7-66455 A | 3/1995 |
| JP | 2001-68731 A | 3/2001 |
| JP | 2001-339100 | 12/2001 |

* cited by examiner

*Primary Examiner*—Brook Kebede
(74) *Attorney, Agent, or Firm*—Snider & Associates; Ronald R. Snider

(57) ABSTRACT

In a light-emitting device, a light-emitting layer portion composed of a compound semiconductor is bonded on one main surface of a transparent conductive semiconductor substrate while placing a substrate-bonding conductive oxide layer composed of a conductive oxide in between. Between the light-emitting layer portion and the substrate-bonding conductive oxide layer, a contact layer for reducing junction resistance with the substrate-bonding conductive oxide layer so as to contact with the substrate-bonding conductive oxide layer. This is successful in providing the light-emitting device which is producible at low costs, has a low series resistance, and can attain a sufficient emission efficiency despite it has a thick current-spreading layer.

35 Claims, 31 Drawing Sheets

LIGHT-EMITTING DEVICE AND METHOD OF FABRICATING THE SAME

RELATED APPLICATION

This application claims the priorities of Japanese Patent Applications No. 2002-308956 filed on Oct. 23, 2002, No. 2002-308970 filed on Oct. 23, 2002, No. 2002-308989 filed on Oct. 23, 2002 and No. 2003-023480 filed on Jan. 31, 2003.

BACKGROUND OF THE INVENTION

1. Field of the Invention

The present invention relates to a light-emitting device and a method of fabricating the same.

2. Description of the Related Art (First Invention)

A light-emitting device having the light emitting layer portion composed of $(Al_xGa_{1-x})_yIn_{1-y}P$ (where, $0 \leq x \leq 1$, $0 \leq y \leq 1$; also referred to as AlGaInP, hereinafter) alloy can be realized as a high-luminance device by adopting a double heterostructure in which a thin AlGaInP active layer is sandwiched by an n-type AlGaInP cladding layer and a p-type AlGaInP cladding layer, both of which having a band gap energy larger than that of the active layer. Recent efforts have also succeeded in realizing a blue light-emitting device in which a similar double heterostructure is formed using $In_xGa_yAl_{1-x-y}N$ (where, $0 \leq x \leq 1$, $0 \leq y \leq 1$, $x+y \leq 1$; also referred to as InGaAlN, hereinafter).

In an exemplary case of an AlGaInP light-emitting device, the double-heterostructured, light-emitting layer portion is formed on an n-type GaAs substrate by hetero-formation, in which an n-type GaAs buffer layer, an n-type AlGaInP cladding layer, an AlGaInP active layer, and a p-type AlGaInP cladding layer are sequentially stacked in this order. Current supply to the light-emitting layer portion is achieved through a metal electrode formed on the surface of the device. The metal electrode herein serves as a light interceptor, so that it is formed so as to cover only a center portion of the main surface of the light-emitting layer portion, so as to extract light from the surrounding non-electrode-forming area.

In this case, it is advantageous to reduce the area of the metal electrode as possible in view of improving the light extraction efficiency, because the area of the light extraction region formed around the electrode can be enlarged. Although some conventional efforts have been directed to increase the amount of light extraction by effectively spreading the current throughout the device through improving shape of the electrode, increase in the electrode area is inevitable in anyway, and this causes a dilemma that the amount of light extraction is restricted instead by decrease in the narrowing of the light extraction area. What is worse, carrier concentration of dopant in the cladding layer, or conductivity, is suppressed somewhat to a lower level so as to optimize emission recombination of the carriers within the active layer, and this makes the current less likely to be spread in the in-plane direction. This undesirably results in concentration of current density to the electrode-formed portion, and reduction in the substantial amount of light extraction from the light extraction area. One known countermeasure relates to a method of forming a current-spreading layer having a raised carrier concentration and a low resistivity between the cladding layer and the electrode. The current-spreading layer necessarily has a thickness of at least 5 μm to 10 μm to ensure a sufficient current spreading efficiency, and is formed by the metal organic vapor phase epitaxy (MOVPE) process or the liquid phase epitaxy (LPE) process.

On the other hand, a variety of device structures allowing light extraction from both surfaces of the light-emitting layer portion are proposed in view of improving the light extraction efficiency. In the AlGaInP light-emitting device, a GaAs substrate is used as a growth substrate for light-emitting layer portion, where GaAs has a large light absorption in the emission wavelength region of the AlGaInP light-emitting layer portion. Japanese Laid-Open Patent Publication No. 2001-68731 discloses a method in which the GaAs substrate is once separated, and a transparent conductive substrate such as being composed of GaP or the like, which is transparent in the emission wavelength region, is newly bonded so as to make it possible to extract light from both surfaces of the light-emitting layer portion. The publication describes that the transparent conductive substrate is bonded to the light-emitting layer portion while placing a conductive oxide layer such as being composed of ITO (indium tin oxide) in between.

In the light-emitting device disclosed in the above publication, the light-emitting layer portion and the transparent conductive electrodes are directly bonded through the conductive oxide layer in contact with both of them. The conductive oxide layer such as being composed of ITO is, however, shows a large contact resistance with the compound semiconductor composing the light-emitting layer portion or the transparent conductive substrate, and the above-described direct bonding raises a problem in that the device will no more be operable at an appropriate operational voltage due to an excessively large forward series resistance.

Another disadvantage resides in that the conductive oxide layer in the above publication is formed by coating and baking of a colloidal solution containing ITO fine particles, where the conductive oxide layer formed by this method only shows a small bonding strength with respect to the transparent conductive substrate, and likely to cause separation.

(Second Invention)

There are also proposed a variety of device structures in which the light emitted towards the back surface of the light-emitting layer portion is reflected towards the light extraction surface side to thereby raise the light extraction efficiency. The reflective layer available for these structures is typically composed of a distributed Bragg reflector (DBR) in which a number of layers differing in the refractive indices are stacked (see Japanese Laid-Open Patent Publication No. 7-66455, for example). Such DBR can be formed by hetero epitaxial growth of a thin compound semiconductor layer on the substrate prior to formation of the light-emitting layer portion, but the largeness in the number of layers to be grown tends to raise the cost. It is also disadvantageous that the DBR, making use of difference in the refractive indices of the stacked semiconductor layers, can reflect the light incident at only a limited range of angle, so that a large increase in the light extraction efficiency is not expectable in principle. On the other hand, Japanese Laid-Open Patent Publication No. 2001-339100 discloses a device structure in which a metal reflective layer is interposed between the substrate and the light-emitting layer portion. The metal layer is advantageous in having a large reflectivity, and the reflectivity is less dependent on the angle of incidence and wavelength. It is, however, necessary in the method of fabrication disclosed in the publication that the light-emitting layer portion is formed by hetero-epitaxial growth on the light-emitting-layer-growing substrate (also referred to as "growth substrate"), typically composed of GaAs, and that another conductive substrate is bonded on the main surface of the light-emitting layer portion opposite to the growth substrate, while placing the metal layer in between. The light-emitting-layer-growing substrate is separated after the bonding, and the resultant separation surface side is used as the light extraction surface. In order to configure the device so that the current-spreading layer is formed on the separation surface side in this case, it is necessary to preliminarily form a semiconductor layer intended for becoming the current-spreading layer on the light-emitting-layer-growing substrate in advance to the hetero-epitaxial growth of the light-emitting layer portion.

The current-spreading layer in this method, formed in the early stage of the growth on the light-emitting-layer-growing substrate, must however satisfy a strict lattice matching condition as a consequence, and is restricted by various aspects. For instance, for the case where a GaAs substrate is used, AlGaAs is one of few candidates of a compound semiconductor for forming the current spreading layer capable of attaining lattice matching therewith. AlGaAs has, however, only a relatively small band gap energy, and is likely to cause light absorption (in particular at a yellowish green emission wavelength around 560 nm). It is also disadvantageous that Al contained therein is very likely to be oxidized at high temperatures during epitaxial growth of the light-emitting layer formed thereafter. It is also disadvantageous that the epitaxial growth of the AlGaAs layer inevitably increases the number of process steps using expensive MOVPE process. A large disadvantage resides in that a considerably thick current-spreading layer will be necessary to obtain a sufficiently large current spreading effect. Still another disadvantage resides in that the current spreading layer has a considerably large dopant concentration, and this is causative of quality degradation of the light-emitting layer portion epitaxially grown thereon, diffusion of the dopant from the current-spreading layer to the light-emitting layer portion, and auto-doping.

(Third Invention)

As a result of advancement which has been made for a long period on the materials and device structures adoptable to light-emitting devices such as light-emitting diodes or semiconductor lasers, the light-electricity conversion efficiency within the devices has gradually approached the theoretical limits. In order to achieve the devices having a further high luminance, it may therefore be very important to raise the light extraction efficiency. In an exemplary light-emitting device having the light-emitting layer portion thereof composed of an AlGaInP alloy, a high luminance can be realized by adopting a double heterostructure in which a thin AlGaInP (or GaInP) active layer is sandwiched by an n-type AlGaInP cladding layer and a p-type AlGaInP cladding layer, both of which having a band gap energy larger than that of the active layer. Such AlGaInP double heterostructure can be obtained by epitaxially growing the individual layers composed of AlGaInP alloy on a GaAs single crystal substrate by using AlGaInP alloy's lattice matching property with GaAs. As a general practice, the GaAs substrate is often remained intact and used as a device substrate in the light-emitting devices. AlGaInP alloy composing the light-emitting layer portion has, however, a larger band gap energy than GaAs has, and this raises a problem that the emitted light is absorbed by the GaAs substrate so as to make it difficult to attain a sufficient light extraction efficiency. To solve this problem, there is proposed a method in which the a reflective layer composed of a DBR is interposed between the substrate and the light-emitting device (see Japanese Laid-Open Patent Publication No. 7-66455, for example). A large improvement in the light extraction efficiency is, however, not expectable in principle, because this type of reflective layer, making use of difference in the refractive indices of the stacked semiconductor layers, can reflect the light incident at only a limited range of angle.

Various publications including Japanese Laid-Open Patent Publication No. 2001-339100 has proposed a technique in which the GaAs substrate used for the growth is separated, and a conductive substrate for reinforcement is bonded to the separation surface while placing a metal layer such as an Au layer, also available as a reflective layer, in between. The metal layer is advantageous in having a large reflectivity, and only a small dependence on the angle of incidence and wavelength.

When the metal layer is bonded to the light-emitting layer portion, it is necessary to place an alloyed layer for reducing contact resistance in between. The alloyed layer can be formed by forming a metal layer (referred to as contact metal layer, hereinafter) having a composition capable of distinctively exhibiting a contact resistance reducing effect through alloying with the light-emitting layer portion, and then by annealing for alloying. For example, for the case where the metal layer is formed on the n-type cladding layer side of the AlGaInP light-emitting layer portion, the contact metal layer can be composed of AuGe alloy and so forth. A problem may, however, arise in that the area where the alloying proceeded to a certain degree considerably lowers the reflectivity, so that an effect of raising the light extraction efficiency through reflection on the metal layer is not always ensured to a satisfactory degree.

(Fourth Invention)

The method disclosed in Japanese Laid-Open Patent Publication No. 2001-339100 in which the Au layer as the reflective layer is bonded to the light-emitting layer portion tends to cause separation or lowering in the reflectivity during the bonding. In particular for the case where a metallurgical reaction is likely to proceed during annealing for the bonding between the substrate (particularly Si substrate) and the Au layer, this problem becomes more distinctive.

A first subject of the first invention is therefore to provide a light-emitting device which is producible at low costs, has a low series resistance, and shows a sufficient emission efficiency despite it has a thick current-spreading layer, and to provide a method of fabricating such light-emitting device. A second subject is to provide a method of fabricating a light-emitting device, capable of allowing tight bonding of a transparent conductive semiconductor substrate, used in place of the current-spreading layer, to the light-emitting layer portion.

A subject of the second invention is to provide a method of light-emitting device in which the light-emitting device is fabricated by separating the growth substrate for the light-emitting layer from the light-emitting layer portion, which can make it no more necessary to previously form a thick current-spreading layer on the separation surface side which serves as the light extraction surface, and can fabricate the light-emitting device capable of keeping a large current spreading effect, and is to provide a light-emitting device producible by this method.

A subject of the third invention is to provide a method of fabricating a light-emitting device which can attain a desirable light extraction efficiency from the device by making use of a metal layer as a reflective layer, and successfully excludes a fear of decrease in the reflectivity due to alloying between the metal layer and the light-emitting layer portion, and is to provide a light-emitting device producible by this method.

A subject of the fourth invention is to provide a light-emitting device configured so as to bond the light-emitting layer portion and the device substrate while placing the metal layer in between, in which a metallurgical reaction between the device substrate and the metal layer during annealing for the bonding is successfully prevented, and is consequently less causative of failures ascribable to lowering of the bonding strength or reflectivity due to the reaction, an is to provide a method of fabricating such light-emitting device.

SUMMARY OF THE INVENTION (First Invention)

A light-emitting device of the first invention comprises a transparent conductive semiconductor substrate, and a light-emitting layer portion composed of a compound semiconductor and bonded on one main surface of the transparent conductive semiconductor substrate while placing a substrate-bonding conductive oxide layer composed of a conductive oxide in between; and further comprising a contact layer for reducing junction resistance of the substrate-bonding conductive oxide layer, disposed between the light-emitting layer portion and the substrate-bonding conductive oxide layer so as to contact with the substrate-bonding conductive oxide layer.

A first aspect of a method of fabricating a light-emitting device of the first invention is to fabricate a light-emitting device which comprises a transparent conductive semiconductor substrate, and a light-emitting layer portion composed of a compound semiconductor and bonded on one main surface of the transparent conductive semiconductor substrate while placing a substrate-bonding conductive oxide layer composed of a conductive oxide in between; and further comprises a contact layer for reducing junction resistance of the substrate-bonding conductive oxide layer, disposed between the light-emitting layer portion and the substrate-bonding conductive oxide layer so as to contact with the substrate-bonding conductive oxide layer; and the method comprises:

a light-emitting layer portion growth step for epitaxially growing the light-emitting layer portion composed of a compound semiconductor on a first main surface of a light-emitting-layer-growing substrate;

a contact layer forming step for forming a layer intended for becoming the contact layer for reducing junction resistance with the substrate-bonding conductive oxide layer;

a substrate-bonding conductive oxide layer forming step for forming the substrate-bonding conductive oxide layer on the bonding surface side of the light-emitting layer portion and/or transparent conductive semiconductor substrate;

a bonding step for bonding the light-emitting layer portion and the transparent conductive semiconductor substrate while placing the substrate-bonding conductive oxide layer in between, to thereby produce a substrate bond in which the layer intended for becoming the contact layer is disposed so as to contact with the substrate-bonding conductive oxide layer; and a separating step for separating the light-emitting-layer-growing substrate from the substrate bond.

The transparent semiconductor substrate is composed of a semiconductor transparent to the light emitted from the light-emitting layer portion. It is to be noted that "transparent to the light emitted from the light-emitting layer portion" in the context of this specification means that the transmissivity of the light emitted from the light-emitting layer portion is 50% or above, whereas the transmissivity less than 50% is referred to as "opaque to the light emitted from the light-emitting layer portion".

According to the first invention, after the light-emitting layer portion composed of a compound semiconductor is epitaxially grown on the first main surface of the light-emitting-layer-growing substrate, the transparent conductive semiconductor substrate is bonded to the main surface of the light-emitting layer portion on the side opposite to the light-emitting-layer-growing substrate side, while placing the conductive oxide layer in between. The transparent conductive semiconductor substrate is used typically as the current-spreading layer. Thereafter, the light-emitting-layer-growing substrate is separated from the resultant substrate bond. The light-emitting device can readily be fabricated because the conductive oxide layer can be used as the substrate-bonding conductive oxide layer for keeping a desirable conduction with the light-emitting layer portion, and there is no need to consider lattice matching between the light-emitting layer portion and the transparent conductive semiconductor substrate. The preliminary bonding of the transparent conductive semiconductor substrate having a sufficient thickness to the light-emitting layer portion is successful in securing a sufficient mechanical strength of the light-emitting layer portion required for enduring the separation of the light-emitting-layer-growing substrate. The method is less likely to cause increase in the costs and lowering in the fabrication efficiency, because a portion intended for becoming the current-spreading layer is not grown to a large thickness by the MOVPE process nor the LPE process, but is formed instead by bonding of the transparent conductive semiconductor substrate.

On the other hand, trial of directly bonding the conductive oxide layer, such as ITO or the like, to the compound semiconductor layer cannot always be successful in forming a desirable ohmic contact, and may result in lowered emission efficiency due to increase in the series resistance affected by the contact resistance. In contrast to this, disposition of the contact layer for reducing the junction resistance with the substrate-bonding conductive oxide layer so as to contact with the substrate-bonding conductive oxide layer is successful in lowering the contact resistance.

On the main surface on the non-bonding side of the transparent conductive semiconductor substrate, a metal electrode for applying voltage to the light-emitting layer portion can typically be formed so as to cover a partial area of the main surface. The transparent conductive semiconductor substrate functions as a light extraction layer and a current-spreading layer. In this case, after the bonding step, the electrode forming step may be carried out in which the metal electrode for applying voltage to the light-emitting layer portion can be formed on the main surface on the non-bonding side (also simply referred to as "main surface", hereinafter) of the transparent conductive semiconductor substrate so as to cover a part of the main surface.

The substrate-bonding conductive oxide layer can be configured as having a primary region located right under the metal electrode and the residual secondary region, and the contact layer may be formed with an ratio of formation area larger in the secondary region than in the primary region. It is to be noted that the ratio of formation area of the contact layer in the individual regions is a ratio obtained by dividing a total area of the contact layer in the region with the total area of the region. In this configuration, the ratio of formation area of the contact layer is set smaller in the region right under the metal electrode (primary region) which can yield only a less amount of light extraction, than in the residual region (secondary region) which can yield a larger amount of light extraction, so that contact resistance of the conductive oxide layer in the primary region increases. This allows a larger portion of the drive current of the device to bypass the primary region to reach the secondary region, and thus raises the light extraction efficiency to a large degree.

The main surface of the light-emitting layer portion, opposite to that facing to the transparent conductive semiconductor substrate can be covered with a electrode-forming conductive oxide layer also available as the transparent electrode. The electrode-forming conductive oxide layer, such as ITO described later, is superior to the transparent conductive semiconductor substrate, such as GaP substrate, in the current-spreading effect, and has a desirable light transmissivity, so that it is more effective to use this surface as the light extraction surface in view of enhancing the emission intensity. The electrode-forming conductive oxide layer can exhibit more distinctive enhancement effect of light extraction when formed on the n-type layer side of the light-emitting layer portion having a p-n junction formed therein.

In this case, the contact layer for reducing contact resistance can be formed also between the electrode-forming conductive oxide layer and the light-emitting layer portion so as to contact with the conductive oxide layer. This is successful in reducing the contact resistance of the electrode-forming conductive oxide layer. In this case, the metal electrode is formed so as to cover a part of the electrode-forming conductive oxide layer, and the residual region of the electrode-forming conductive oxide layer which locates around the metal electrode is used as the light extraction surface.

Also the electrode-forming conductive oxide layer can be configured as having a primary region right under the metal layer and the residual secondary region, and the contact layer may be formed again with an ratio of formation area larger in the secondary region than in the primary region. This allows a larger amount of current to bypass the primary region to reach the secondary region, and thus raises the light extraction efficiency to a large degree.

For the case where the aforementioned metal electrode is formed on the substrate-bonding conductive oxide layer or the electrode-forming conductive oxide layer, and the ratio of formation area of the contact layer is set larger in the secondary region than in the primary region, it is preferable in view of improving the light extraction efficiency that the primary region, capable of yielding only a less amount of light extraction, is not supplied as possible with drive current of the device. It is therefore preferable that the primary region has possibly no contact layer formed therein.

The configuration such that the ratio of formation area of the contact layer is set larger in the secondary region than in the primary region may be adopted by all contact layers, or may be adopted by a part of the contact layers while other portion of the contact layers are typically formed over the entire surface of the substrate-bonding conductive oxide layer. In particular the contact layer most close to the light-emitting layer portion can exhibit an especially distinct roundabout effect of the drive current towards the secondary region by setting the ratio of formation area larger in the secondary region than in the primary region.

On the junction interface of the conductive oxide layer, it is preferable to interlace the formation areas and non-formation areas of the contact layer at least in the secondary region through which a larger amount of light emitted from the light-emitting layer portion can be extracted. More specifically, the formation areas of the contact layer is preferably formed in a discrete manner. According to this configuration, the light emitted right under the formation area of the contact layer can leak through the adjacent non-formation area, so that effect of absorption of the light by the contact layer can be suppressed even when the contact layer, formed in order to reduce the contact resistance of the conductive oxide layer, has a large light absorption tendency. This is advantageous in raising the light extraction efficiency of the device as a whole.

The contact layer for reducing junction resistance of the substrate-bonding conductive oxide layer can be disposed also between the transparent conductive semiconductor substrate and the substrate-bonding conductive oxide layer, so as to contact with the substrate-bonding conductive oxide layer. This is successful in further reducing the junction resistance of the conductive oxide layer.

Beside the process of forming the electrode-forming conductive oxide layer on the separation-side main surface of the light-emitting layer portion, it is also allowable to adopt a method in which the current-spreading layer composed of a compound semiconductor is preliminarily grown on the light-emitting-layer-growing substrate by the epitaxial process, and the light-emitting-layer-growing substrate is then separated so as to leave the current-spreading layer on the device side. In this case, it is inevitable that the current-spreading layer to be formed in the early stage of the growth on the light-emitting-layer-growing substrate must satisfy strict lattice matching conditions with the substrate, and there are lot of restrictions. In an exemplary case where the GaAs substrate is used, AlGaAs can be one of few candidates of a compound semiconductor for composing the current-spreading layer which can establish lattice matching with the substrate. AlGaAs has, however, a relatively small band gap energy and is likely to cause a problem of light absorption (in particular for yellowish green emission wavelength of 560 nm or around). Because the material contains Al, it is also disadvantageous that it is likely to cause high temperature oxidization when the light-emitting layer is epitaxially grown thereafter. Still another problem resides in that the epitaxial growth of the AlGaAs layer inevitably increases the number of growth process steps based on the expensive MOVPE process. In contrast to this, adoption of the inventive method of forming the electrode-forming conductive oxide layer in the later process can completely make it unnecessary to consider the lattice matching to the substrate, for example, and can almost completely suppress the problem of light absorption. It is also less necessary to anticipate the oxidation of the compound semiconductor on the light-emitting-layer side, because the layer can be grown by an inexpensive method such as sputtering as described later, and the growth per se can be proceeded under relatively lower temperatures.

It is also allowable to adopt a configuration in which the transparent conductive semiconductor substrates are bonded on both main surfaces of the light-emitting layer portion while placing the substrate-bonding conductive oxide layer composed of a conductive oxide in between, although the process necessary therefor becomes slightly more complex than that for the method of forming the aforementioned electrode-forming conductive oxide layer. This configuration also makes it possible to effectively extract the light through both surfaces of the light-emitting layer portion. In this case, it is preferable, in view of reducing the series resistance, to form the above-described contact layer in contact to the individual substrate-bonding conductive oxide layers. It is also allowable to form the metal layer on the separation-side main surface of the light-emitting layer portion, so as to allow the light from the light-emitting layer portion to reflect thereon, and to extract the reflected light after being superposed on the light directly comes from the light-emitting layer portion.

The conductive oxide layer can specifically be composed of an ITO layer. The ITO layer is an indium oxide layer doped with tin oxide, and can give an electrode layer having a resistivity suppressed sufficiently to as low as $5\times10^{-4}$ $\Omega\cdot$cm by adjusting tin oxide content to 1 to 9 wt %. Besides the ITO electrode layer, a ZnO electrode layer having a large conductivity is applicable to the first invention. Other available materials for composing the conductive oxide layer include tin oxide doped with antimony oxide (so-called NESA), $Cd_2SnO_4$, $Zn_2SnO_4$, $ZnSnO_3$, $MgIn_2O_4$, $CdSb_2O_6$ doped with yttrium (Y) oxide and $GaInO_3$ doped with tin oxide. In short, the substrate-bonding conductive oxide layer can contain at least any one of indium, tin and zinc. These conductive oxide have a desirable transmissivity to the visible light (i.e., transparent), and are advantageous in that they are not obstructive to the light extraction even when they are used as a voltage-applying electrode for the light-emitting layer portion. The conductive oxide layer also has a role of spreading the current when it is applied with device drive voltage through the metal electrode such as bonding pad formed thereon.

The conductive oxide layer can be formed by publicly-known vapor phase growth processes such as chemical vapor deposition (CVD); physical vapor deposition (PVD) processes such as sputtering and vacuum evaporation; and molecular beam epitaxy (MBE). For example, ITO electrode layer and ZnO electrode layer can be formed by RF sputtering or vacuum evaporation, and NESA film can be formed by the CVD process. In place of these vapor phase growth processes, still other processes such as the sol-gel process is also applicable. It is, however, advantageous to form the substrate-bonding conductive oxide layer as an amorphous layer in view of raising the bonding strength as described later, and such layer can most preferably be formed by sputtering.

The thickness of the conductive oxide layer for use in the bonding can be determined mainly considering electric conduction in the thickness-wise direction, and it is preferably determined so as not to increase the series resistance, typically as thin as 50 nm to 200 nm (e.g., 100 nm). On the other hand, the thickness of the conductive oxide layer for use in the electrode on the main back surface side of the light-emitting layer portion can be determined considering current spreading in the in-plane direction, and it is preferably determined a little thicker than that, typically as thick as 100 nm to 500 nm (e.g., 200 nm).

The transparent conductive semiconductor substrate preferably used herein is such as having a refractive index of 4 or smaller to the light emitted from the light-emitting layer. Adjustment of the refractive index to the above-described smaller level can reduce the critical angle of total reflection on the light extraction surface and thereby improve the light extraction efficiency, for the case where the light is extracted through the transparent conductive semiconductor substrate.

The light-emitting layer portion can be configured as having a double heterostructure in which a first-conductivity-type cladding layer, an active layer and a second-conductivity-type cladding layer, respectively composed of $(Al_xGa_{1-x})_yIn_{1-y}P$ (where, $0\leq x\leq 1$, $0\leq y\leq 1$ and x+y=1), are stacked in this order. In this case, use of the transparent conductive semiconductor substrate such as having a refractive index of 3.5 or smaller for the light having a wavelength ranging from 550 to 650 nm is successful in increasing the critical angle of total reflection of the light in green to red wavelength region (550 nm to 650 nm) emitted from the double-heterostructured, light-emitting layer portion, and is successful in raising the light extraction efficiency. Specific examples of the transparent conductive semiconductor substrate preferably applicable to the first invention include any of GaP, ZnO, SiC and AlGaAs (particularly such as having an AlAs alloy composition of 0.75 or larger), all of which being a good conductor.

The above-described individual contact layers are preferably formed by adopting a compound semiconductor containing no Al at the junction interface with the conductive oxide layer, and having a band gap energy of less than 1.42 eV. Use of this sort of contact layer is successful in obtaining a desirable ohmic contact, and is less causative of increase in the resistivity due to oxidation of the Al component. More specifically, In-containing GaAs is available for the contact layer. A desired effect of reducing the contact resistance can be obtained if the compound semiconductor for composing the contact layer has a composition of $In_xGa_{1-x}As$ ($0<x\leq 1$) at the junction interface with the conductive oxide layer.

In the contact layer forming step in this case, the contact layer can be obtained as an In-containing GaAs layer by first forming a GaAs layer intended for becoming the contact layer, next forming an ITO layer for composing the substrate-bonding conductive oxide layer so as to contact with the GaAs layer, and by annealing the layers so as to allow In to diffuse from the ITO layer to the GaAs layer. In this case, the resultant light-emitting device is such as having the ITO layer as the conductive oxide layer, and having the contact layer which has a composition of $In_xGa_{1-x}As$ ($0<x\leq 1$) at the junction interface with the transparent conductive oxide layer, and has an In concentration profile continuously decreasing as receding from the ITO layer in the thickness-wise direction.

In this method, a GaAs layer is first formed on the light-emitting layer portion, transparent conductive semiconductor substrate or the like, on the side where the formation of the contact layer is desired, and an ITO layer is then formed so as to contact with the GaAs layer. For an exemplary successful case where the contact layer is to be formed on the light-emitting layer portion side, the light-emitting layer portion is first epitaxially grown on the light-emitting-layer-growing substrate, and further thereon (also interposition of some other layer permissible) the GaAs layer is epitaxially grown. Similarly, formation of the contact layer on the transparent conductive semiconductor substrate side is successful by epitaxially growing the GaAs layer on the transparent conductive semiconductor substrate.

Although it is also allowable to adopt a method of directly growing the InGaAs by the epitaxial process, the above-described method has the advantages as described below. That is, the GaAs layer can readily establish lattice matching with the light-emitting layer portion typically composed of AlGaInP or the transparent conductive semiconductor substrate typically composed of GaP, and can form a film having an excellent uniformity and continuity as compared with the case where InGaAs is directly grown by the epitaxial process. The ITO layer is then formed on the GaAs layer, and annealed so as to allow In to diffuse from the ITO layer towards the GaAs layer, thereby form the contact layer. The contact layer composed of In-containing GaAs obtained by the annealing is effectively prevented from becoming excessive in the In content, and from causing quality degradation such as lowered emission intensity, ascribable to lattice mismatching with the light-emitting layer portion. Because the lattice matching between the GaAs layer and the light-emitting layer portion becomes particularly excellent when the light-emitting layer portion is composed of $(Al_xGa_{1-x})_yIn_{1-y}P$ (where, $0 \leq x \leq 1$, $0.45 \leq y \leq 0.55$), it can be said that the light-emitting layer portion (cladding layer or active layer) is preferably formed by adjusting the alloy composition y within the above-described range.

The annealing is preferably carried out so that the In concentration profile in the thickness-wise direction of the contact layer shows a continuously decreasing pattern (that is, shows a graded In concentration profile) as receding from the ITO layer in the thickness-wise direction, as indicated by curve (1) in FIG. 3. This structure can be formed by annealing in which In is allowed to diffuse from the ITO side towards the contact layer side.

The In concentration profile in the thickness-wise direction of the contact layer adjusted so as to continuously decrease as receding from the ITO layer is advantages in the following points. For the case where the contact layer is formed on the AlGaInP light-emitting layer portion side or on the GaP transparent conductive semiconductor substrate side, the In concentration becomes low on the light-emitting layer side or on the transparent conductive semiconductor substrate side, to thereby reduce difference in the lattice constants with that of the light-emitting layer portion or of the transparent conductive semiconductor substrate, and to thereby further improve the lattice matching property. Any excessively elevated annealing temperature or excessively prolonged annealing time, however, undesirably promotes the In diffusion from the ITO layer, and this makes the In concentration profile in the contact layer kept constant at a relatively high level as shown by curve (3) in FIG. 3, where the above-described effects become not attainable (it is to be noted that any excessively lower annealing temperature or excessively shorter annealing time results in shortage of In concentration in the contact layer as shown by curve (2) in FIG. 3).

Referring now to FIG. 3, assuming that In concentration of the contact layer in the vicinity of the interface with the ITO transparent electrode layer as $C_A$, and In concentration in the vicinity of the opposite interface as $C_B$, it is preferable to adjust a value $C_B/C_A$ to 0.8 or below, and so that it is preferable to carry out the aforementioned annealing so as to attain the In concentration profile as described in the above. Any value $C_B/C_A$ exceeding 0.8 may result in only a limited effect of improving the lattice matching property with the light-emitting layer potion by virtue of gradient in the In concentration profile. Compositional distribution (In concentration profile or Ga concentration profile) of the contact layer in the thickness-wise direction is can be measured by publicly-known techniques for surface analysis such as secondary ion mass spectroscopy (SIMS), Auger electron spectroscopy (AES) and X-ray photoelectron spectroscopy (XPS) while gradually etching the contact layer in the thickness-wise direction.

The In concentration of the contact layer in the vicinity of the interface with the ITO transparent electrode layer is preferably adjusted to 0.1 to 0.6 when expressed by an atomic ratio of In to a total concentration of In and Ga, so that the above-described annealing is preferably carried out so as to attain such In concentration. Any In concentration based on the above definition less than 0.1 may result in only an insufficient effect of reducing the contact resistance of the contact layer, and exceeding 0.6 may considerably worsen the quality degradation such as lowered emission intensity due to lattice mismatching between the contact layer and the light-emitting layer portion. So far as the In concentration of the contact layer in the vicinity of the interface with the ITO transparent electrode layer is kept within the above desirable range (0.1 to 0.6) expressed by an atomic ratio of In to a total concentration of In and Ga, it is of no problem if the In concentration $C_B$ of the contact layer falls to zero in the vicinity of the interface opposite to that facing to the ITO transparent electrode layer, that is, as shown in FIG. 4, it is of no problem if the InGaAs layer is formed on the ITO transparent electrode layer side of the contact layer, and the GaAs layer is formed on the opposite side.

ITO film is an indium oxide film doped with tin oxide as described in the above, and can produce the contact layer having the aforementioned desirable In concentration when it is formed on the GaAs layer and then annealed under an appropriate temperature range. The annealing is successful in further reducing the electric resistivity of the ITO layer. The annealing is preferably carried out at 600° C. to 750° C. Any annealing temperature exceeding 750° C. may result in an excessive diffusion velocity of In into the GaAs layer, and this is highly causative of an excessive In concentration in the contact layer. This also results in saturation of the In concentration and makes it difficult to obtain the In concentration profile graded in the thickness-wise direction of the contact layer. All of these are causative of degraded lattice matching between the contact layer and the light-emitting layer portion. The excessive In diffusion into the GaAs layer also drains In in the ITO layer in the vicinity of the contact portion with the contact layer, and inevitably raises electric resistance of the electrode. In addition, too high annealing temperature described in the above allows oxygen in ITO to diffuse towards the GaAs layer and oxidize it, and this tends to raise the series resistance of the device. All of these are causative of nonconformities such that the light-emitting device is not operable at an appropriate voltage. An extremely high annealing temperature may also impair the conductivity of the ITO transparent electrode layer. On the contrary, any annealing temperature less than 600° C. may result in too small In diffusion velocity into the GaAs layer and considerably lower the production efficiency, because a longer time will be necessary to obtain the contact layer with sufficiently lowered contact resistance.

The annealing time is preferably set within a range from 5 seconds to 120 seconds. Any annealing time exceeding 120 seconds tends to make the amount of In diffusion into the GaAs layer excessive in particular for the case where the annealing temperature is set close to the upper limit value (a longer annealing time (typically as long as 300 seconds or around) is, however, allowable if the annealing temperature is set to a relatively lower level). On the other hand, the annealing time shorter than 5 seconds may result in only an insufficient amount of In diffusion into the GaAs layer, and this makes it difficult to obtain the contact layer with sufficiently lowered contact resistance.

It is also allowable to bond the light-emitting layer portion or the transparent conductive semiconductor substrate to the contact layer on the main surface thereof opposite to that facing to the conductive oxide layer, while placing the intermediate layer in between. The intermediate layer is composed of a compound semiconductor having a band gap energy intermediate between those of the light-emitting layer portion or the transparent conductive semiconductor substrate and the contact layer.

In the light-emitting layer portion having a double heterostructure, it is necessary to raise the barrier height between the cladding layer and the active layer to a certain level or more in order to enhance the effect of confining carriers in the active layer. As shown in a schematic band chart in FIG. 5 (where, Ec and Ev represent energy levels of the bottom of the conduction band and the upper end of the valence band, respectively), the cladding layer (e.g., AlGaInP layer) directly bonded with the contact layer (e.g., InGaAs layer) can occasionally produce a relatively high hetero-barrier between the cladding layer and the contact layer, which is ascribable to bend in the band structure caused by the bonding. The barrier height $\Delta E$ increases as the discontinuity value of the band ends between the cladding layer and the contact layer increases, and this enhances blocking effect on carrier movement, in particular the movement of holes having a larger effective mass. In an exemplary case where the metal electrode is used, it is unavoidable to form the metal electrode so as to cover only a part of the cladding layer, because the coverage of the entire surface of the cladding layer disables light extraction. In this case, it is indispensable anyhow to enhance current spreading within the in-plane direction outwardly from the electrode in order to raise the light extraction efficiency. The metal electrode is often formed on the light-emitting layer portion while placing the contact layer, typically composed of GaAs, in between, where in this case, formation of the barrier between the contact layer and the light-emitting layer portion so as to have a certain level of height is more advantageous in view of promoting the in-plane current spreading by virtue of carrier damming effect ascribable to the barrier. Formation of the high barrier, however, inevitably increases the series resistance.

In contrast to this, use of the ITO transparent electrode layer desirably makes it almost unnecessary to consider the barrier damming effect by the barrier, because the ITO transparent electrode layer per se has a very large current spreading ability. In addition, use of the ITO transparent electrode can also ensure a far larger light extraction area as compared with the case where the metal electrode is used. Referring now to FIG. 6, interposition of the intermediate layer having a band gap energy intermediate between those of the contact layer and the cladding layer can reduce the discontinuity, values of the band ends between the contact layer and the intermediate layer, and between the intermediate layer and the cladding layer, and this successfully reduces the individual barrier heights $\Delta E$. As a consequence, it is made possible to reduce the series resistance, and to attain a sufficiently large emission intensity even under a relatively low drive voltage.

These effects of adoption of the intermediate layer becomes most distinctive when the light-emitting layer portion is composed of $(Al_xGa_{1-x})_yIn_{1-y}P$ (where, $0 \leq x \leq 1$, $0 \leq y \leq 1$), which shows a relatively desirable lattice matching property with In-containing GaAs which composes the double-heterostructured, light-emitting layer portion, in particular the contact layer. Specifically in this case, the intermediate layer having a band gap energy intermediate between those of the light-emitting layer portion and the contact layer can preferably be formed as a layer containing at least any one of an AlGaAs layer, GaInP layer and AlGaInP (compositions thereof being adjusted so as to make the band gap energies smaller than that of the cladding layer), and most typically formed as a layer containing the AlGaAs layer. The intermediate layer is also applicable to other light-emitting layer portion, which is exemplified by the double-heterostructured, light-emitting layer portion composed of $In_xGa_yAl_{1-x-y}N$. In this case, adoptable examples of the intermediate layer is such as containing an InGaAlN layer (compositions thereof being adjusted so as to make the band gap energies smaller than that of the cladding layer).

The conductive oxide layer used for bonding the transparent conductive semiconductor substrate and the light-emitting layer portion may be an amorphous oxide layer. A second aspect of a method of fabricating a light-emitting device of the first invention is to fabricate a light-emitting device which comprises a transparent conductive semiconductor substrate, and a light-emitting layer portion composed of a compound semiconductor and bonded on one main surface of the transparent conductive semiconductor substrate while placing a substrate-bonding conductive oxide layer composed of a conductive oxide in between; and comprises:

a light-emitting layer portion growth step for epitaxially growing the light-emitting layer portion composed of a compound semiconductor on a first main surface of a light-emitting-layer-growing substrate;

a substrate-bonding conductive oxide layer forming step for forming by sputtering an amorphous substrate-bonding conductive oxide layer on the bonding surface side of the light-emitting layer portion and/or transparent conductive semiconductor substrate;

a bonding step for bonding the light-emitting layer portion and the transparent conductive semiconductor substrate while placing the substrate-bonding conductive oxide layer in between, to thereby produce a substrate bond; and a separating step for separating the light-emitting-layer-growing substrate from the substrate bond.

The interposition of the amorphous conductive oxide layer can facilitate the bonding between the light-emitting layer portion and the transparent conductive semiconductor substrate based on thermal diffusion or the like. In particular, the light-emitting layer portion and the transparent conductive semiconductor substrate can more readily and tightly be bonded if the bonding-side main surface of the transparent conductive semiconductor substrate and the bonding-side main surface of the light-emitting layer portion are respectively covered with the amorphous conductive oxide layers, and the light-emitting layer portion and the transparent conductive semiconductor substrate are bonded so as to bring both conductive oxide layers in contact. The substrate-bonding conductive oxide layer is successfully obtained as an amorphous layer by sputtering having an advantage that the substrate temperature is less likely to elevate.

(Second Invention)

To solve the aforementioned subject, a method of fabricating light-emitting device of the second invention is such as comprising:

a light-emitting layer portion growth step for epitaxially growing the light-emitting layer portion composed of a compound semiconductor on a main surface of a light-emitting-layer-growing substrate;

a separating step for separating the light-emitting-layer-growing substrate from the light-emitting layer portion;

a transparent conductive oxide layer forming step for covering a separation-side main surface, which is defined as the main surface on the light-emitting layer portion side exposed after the separation of the light-emitting-layer-growing substrate, with a transparent conductive oxide layer also available as a transparent electrode for applying voltage to the light-emitting layer portion; and a contact layer forming step for forming a layer intended for becoming a contact layer for reducing junction resistance of the transparent conductive oxide layer on the separation-side main surface prior to the transparent conductive oxide layer forming step.

Because the light-emitting-layer growing substrate is separated, and thereafter the transparent conductive oxide layer having an excellent current spreading effect is formed in this method, it is no more necessary to consider the lattice matching property with the light-emitting-layer-growing substrate, unlike the conventional case where the current-spreading layer is formed by hetero-epitaxial growth. This makes it possible to arbitrarily select transparent conductive materials having small light absorption and desirable conductivity, such as ITO (indium tin oxide). The problem of light absorption thus becomes less likely to occur as compared with the conventional case where a thick current-spreading layer had to be grown, the cost can be suppressed because the transparent conductive oxide can be formed by adopting sputtering or vacuum evaporation which can be proceeded at relatively low temperatures, and the problem of high-temperature oxidation of the light-emitting layer portion during the epitaxial growth. Selection of a transparent conductive oxide excellent in conductivity is efficient since the growth thickness thereof can considerably be reduced as compared with the conventional current-spreading layer.

On the other hand, the conductive oxide layer such as the ITO layer may sometimes fail in forming a desirable ohmic contact in direct bonding with the compound semiconductor layer, and may lower the emission efficiency due to increased series resistance based on the contact resistance. However, the contact resistance of the conductive oxide layer can successfully be reduced by disposing the contact layer for reducing the contact resistance of the conductive oxide layer so as to contact with the compound semiconductor layer side of the conductive oxide layer.

In the method of the second invention, it is also allowable to leave the main layer of the light-emitting layer portion side opposite to that facing to the light-emitting-layer-growing substrate unbonded with any other substrate, and use the main surface as the light extracting surface, which means formation of the device structure allowing light extraction from both surfaces of the light-emitting layer portion. On the other hand, the method of the second invention can also include the bonding step for producing a substrate bond by bonding a conductive substrate to the light-emitting layer portion on the main surface thereof opposite to that facing to the light-emitting-layer-growing substrate. The bonding of the conductive substrate can be carried out for a variety of purposes. In an exemplary case where the light-emitting-layer-growing substrate is composed of a GaAs substrate which is known to show a large light absorption, bonding with the transparent conductive substrate such as a GaP substrate is successful in raising the light extraction effect from the device-side surface through the such substrate, and in enhancing the current-spreading effect.

On the other hand, it is also allowable to bond a conductive substrate (where, the substrate per se may not always be transparent). The first aspect of the light-emitting device of the second invention is realized only after the latter fabrication method is proposed, and comprises a conductive substrate, and a light-emitting layer portion composed of a compound semiconductor and bonded on one main surface of the conductive substrate while placing a metal layer as a reflective layer in between; the light-emitting layer portion is covered with a transparent conductive oxide layer, also available as a light-extraction-surface-side electrode, on the main surface thereof opposite to that facing to the conductive substrate; and further comprises a contact layer for reducing junction resistance of the transparent conductive oxide layer, disposed between the light-emitting layer portion and the transparent conductive oxide layer so as to contact with the transparent conductive oxide layer. According to this configuration of the light-emitting device, the light emitted through the light extraction surface side, having formed thereon the electrode composed of the transparent conductive oxide layer (also referred to as "a transparent oxide electrode hereafter"), can be superposed with the backwardly emitted light after being reflected, and this successfully raises the emission efficiency. The device also has, on the light extraction surface side thereof, a thin transparent oxide electrode having a larger light transmissivity and a larger conductivity than those of the generally-used, current-spreading layer, to thereby attain a further improved light extraction efficiency by virtue of an excellent current-spreading effect of the electrode. Still another advantage is given by the contact layer formed between the light-emitting layer portion and the transparent conductive oxide electrode, and this is successful in reducing the contact resistance of the conductive oxide layer.

The transparent conductive oxide layer can typically be composed of ITO. Besides ITO, ZnO having a large conductivity is applicable to the second invention. Other available materials for composing the transparent conductive oxide layer include tin oxide doped with antimony oxide (so-called NESA), $Cd_2SnO_4$, $Zn_2SnO_4$, $ZnSnO_3$, $MgIn_2O_4$, $CdSb_2O_6$ doped with yttrium (Y) oxide and $GaInO_3$ doped with tin oxide.

The conductive substrate may be an Si substrate or a metal substrate. As the metal substrate, those typically composed of Al, Cu or alloys thereof, having a desirable conductivity and inexpensiveness, are preferably applicable to the second invention. The Si substrate (polycrystal or single crystal substrate) on the other hand is still more advantageously used in the second invention, by virtue of its desirable conductivity and further inexpensiveness (the former is especially inexpensive).

The reflective layer may be an Au-base metal layer (containing Au as a major component (50 wt % or more): Au layer, for example). The Au-base metal is highly reflective, chemically stable and is less likely to be degrade in the metallic gross due to reactions during the growth.

For the case where the Si substrate is used for the conductive substrate, the reflective layer is preferably composed of the Au-base metal layer in contact with both of the light-emitting layer portion and the Si substrate. The Au-base metal is advantageous in having a desirable reflectivity and a good affinity with the Si substrate, and can ensure a large bonding strength. In this case, it is preferable to bond the Si substrate and the light-emitting layer portion while placing the Au-base metal layer in contact with the Si substrate in between, by annealing for bonding at 80° C. to 360° C. Any annealing temperature lower than 80° C. may result in only an insufficient bonding strength. The annealing temperature exceeding 360° C. (eutectic temperature of Au—Si binary alloy is about 363° C.) considerably promotes the eutectic reaction between Au on the metal layer side and Si on the substrate side, and this raises a nonconformity of a large drop in the reflectivity of the metal layer.

For the case where the transparent conductive oxide layer is formed on the separation-side main surface after the above-described annealing, it is preferable to adopt sputtering, characterized by its relatively low growth temperature, in view of suppressing the eutectic reaction between the Au-base metal layer and the Si substrate. Formation of the transparent conductive oxide layer as an amorphous oxide layer is advantageous because the growth temperature can further be lowered. A preferable material for composing the transparent conductive oxide layer is ITO, which is particularly readily be obtained as a uniform and highly-conductive material. In this case, the light-emitting device of the second invention is configured so as to use the ITO layer as the transparent conductive oxide layer also available as the light-extraction-surface-side electrode. In other words, bonding of the Si substrate and the light-emitting layer portion while placing the Au-base metal layer in between, and formation of the transparent conductive oxide layer using ITO can effectively suppress the eutectic reaction of the Au-base metal layer, and raise the reflectivity thereof to a large degree.

It is to be noted that the transparent conductive oxide layer such as the ITO layer may sometimes fail in forming a desirable ohmic contact in direct bonding with the compound semiconductor layer on the device side, and may lower the emission efficiency due to increased series resistance based on the contact resistance. The light-emitting device of the second invention is, however, successful in reducing the contact resistance of the transparent conductive oxide layer by disposing the contact layer for reducing the contact resistance of the transparent conductive oxide layer so as to contact with the transparent conductive oxide layer. The contact layer is preferably formed by adopting a compound semiconductor containing no Al at the junction interface with the transparent conductive oxide layer, and having a band gap energy of less than 1.42 eV. Use of this sort of contact layer is successful in obtaining a desirable ohmic contact, and is less causative of increase in the resistivity due to oxidation of the Al component.

The contact layer can specifically be formed using In-containing GaAs. In this case, a desirable ohmic contact is obtained if the compound semiconductor composing the contact layer has a composition of $In_xGa_{1-x}As$ ($0<x\leq 1$) (at least) at the junction interface with the transparent conductive oxide layer.

For the case where the transparent conductive oxide layer is formed as an ITO layer, the In-containing GaAs contact layer can be formed by growing the GaAs layer on the separation-side main surface, the ITO layer as the transparent conductive oxide layer is formed so as to contact with the GaAs layer, and by annealing the layers so as to allow In to diffuse from the ITO layer to the GaAs layer.

The annealing is preferably carried out so that the In concentration profile in the thickness-wise direction of the contact layer shows a continuously decreasing pattern (that is, shows a graded In concentration profile) as receding from the ITO layer in the thickness-wise direction, as indicated by curve (1) in FIG. 17. This structure can be formed by annealing in which In is allowed to diffuse from the ITO side towards the contact layer side. The resultant light-emitting device of the second invention is such as having the transparent conductive oxide layer formed as the ITO layer, having the contact layer formed between the light-emitting layer portion and the ITO layer so as to contact with the ITO layer, and having the contact layer having a composition of $In_xGa_{1-x}As$ ($0<x\leq 1$) at the junction interface with the transparent conductive oxide layer, and having the In concentration profile continuously decreasing as receding from the ITO layer in the thickness-wise direction.

Formation of the contact layer having the aforementioned In concentration profile is successful in improving the lattice matching property thereof with the light-emitting layer portion. In particular for the case where the light-emitting layer portion is configured as having a double heterostructure in which a first-conductivity-type cladding layer, an active layer and a second-conductivity-type cladding layer, respectively composed of $(Al_xGa_{1-x})_yIn_{1-y}P$ (where, $0\leq x\leq 1$, $0\leq y\leq 1$), are stacked in this order, lowering in the In concentration on the light-emitting layer side results in reduced difference in the lattice constants with that of the light-emitting layer portion, and this ensures a large effect of improving the lattice matching property. Any excessively elevated annealing temperature or excessively prolonged annealing time, however, undesirably promotes the In diffusion from the ITO layer, and this makes the In concentration profile in the contact layer kept constant at a relatively high level as shown by curve (3) in FIG. 17, where the above-described effects become not attainable (it is to be noted that any excessively lower annealing temperature or excessively shorter annealing time results in shortage of In in the contact layer as shown by curve (2) in FIG. 17).

Referring now to FIG. 17, assuming that In concentration of the contact layer in the vicinity of the interface with the ITO layer as $C_A$, and In concentration in the vicinity of the opposite interface as $C_B$, it is preferable to adjust a value $C_B/C_A$ to 0.8 or below, and so that it is preferable to carry out the aforementioned annealing so as to attain the In concentration profile as described in the above. Any value $C_B/C_A$ exceeding 0.8 may result in only a limited effect of improving the lattice matching property with the light-emitting layer potion by virtue of gradient in the In concentration profile.

The In concentration of the contact layer in the vicinity of the interface with the ITO transparent electrode layer is preferably adjusted to 0.1 to 0.6 when expressed by an atomic ratio of In to a total concentration of In and Ga, so that the above-described annealing is preferably carried out so as to attain the above In concentration. Any In concentration based on the above definition less than 0.1 may result in only an insufficient effect of reducing the contact resistance of the contact layer, and exceeding 0.6 may considerably worsen the quality degradation such as lowered emission intensity due to lattice mismatching between the contact layer and the light-emitting layer portion. So far as the In concentration of the contact layer in the vicinity of the interface with the ITO transparent electrode layer is kept within the above desirable range (0.1 to 0.6) expressed by an atomic ratio of In to a total concentration of In and Ga, it is of no problem if the In concentration $C_B$ of the contact layer falls to zero in the vicinity of the interface opposite to that facing to the ITO transparent electrode layer, that is, as shown in FIG. 18, it is of no problem if the InGaAs layer is formed on the ITO transparent electrode layer side of the contact layer, and the GaAs layer is formed on the opposite side.

The annealing is preferably carried out at lower temperatures and within shorter time as possible so that the In concentration in the contact layer will not be excessive. In an exemplary case where the Si substrate is used as the conductive substrate, and the Si substrate is bonded to the light-emitting layer portion while placing the Au-base metal layer in contact with the Si substrate in between at annealing for bonding at 80° C. to 360° C. as described in the above, it is preferable that the annealing for the In diffusion into the GaAs layer is carried out after the annealing for bonding. A sufficient effect of suppressing the eutectic reaction between the Au-base metal layer and the Si substrate is obtained only when the annealing for In diffusion is carried out at lower temperatures and within shorter duration of time.

The annealing for In diffusion is preferably carried out at 600° C. to 750° C., similarly to as described in the first invention.

The annealing time is preferably set within a range from 5 seconds to 120 seconds. Any annealing time exceeding 120 seconds tends to make the amount of In diffusion into the GaAs layer excessive in particular for the case where the annealing temperature is set close to the upper limit value (a longer annealing time (typically as long as 300 seconds or around) is, however, allowable if the annealing temperature is set to a relatively lower level). On the other hand, the annealing time shorter than 5 seconds may result in only an insufficient amount of In diffusion into the GaAs layer, and this makes it difficult to obtain the contact layer with sufficiently lowered contact resistance. The annealing for diffusing In into the GaAs layer carried out at 600° C. to 750° C. for 5 seconds to 120 seconds is successful in desirably suppress the eutectic reaction between the Au-base metal layer and the Si substrate, and in keeping the reflectivity of the metal layer at a high level even after the annealing.

The contact layer is preferably formed so that the formation areas and non-formation areas thereof are interlaced at the junction interface with the transparent oxide electrode. The contact layer if formed over the entire portion of the bonding surface to the device side of the transparent oxide electrode may undesirably result in the following nonconformities:

(1) The transparent oxide electrode needs a small metal electrode for wire bonding to be formed thereon. If the contact resistance between the transparent oxide electrode and the light-emitting layer portion becomes lowered also in the area right under the metal electrode to a considerable degree, the drive current and, as a consequence, the emitted light become more likely to concentrate into the area, so that a large portion of the emitted light is intercepted by the metal electrode, and this result in lowering of the light extraction efficiency.

(2) Depending on material species adopted for the contact layer, the contact layer may act as a light absorber, and this again results in lowering of the light extraction efficiency.

A light-emitting device of the second invention is therefore configured so that the metal electrode for applying voltage to the light-emitting layer portion is formed on the main surface of the transparent conductive oxide layer opposite to that facing to the light-emitting layer portion, so as to cover a partial area of the main surface; and the transparent conductive oxide layer has a primary region right under the metal electrode and the residual secondary region, and the contact layer is formed with an ratio of formation area larger in the secondary region than in the primary region. It is to be noted that the ratio of formation area of the contact layer in the individual regions is a ratio obtained by dividing a total area of the contact layer in the region with the total area of the region. In this configuration, the ratio of formation area of the contact layer formed in the junction interface of the transparent oxide electrode is set smaller in the region right under the metal electrode (primary region) which can yield only a less amount of light extraction, than in the residual region (secondary region) which can yield a larger amount of light extraction, so that contact resistance of the conductive oxide layer in the primary region increases. This allows a larger portion of the drive current of the device to bypass the primary region to reach the secondary region, and thus raises the light extraction efficiency to a large degree. It is preferable, in view of improving the light extraction efficiency, that the emission drive current does not flow as possible in the primary region which can yield only a less amount of light extraction. It is therefore preferable that the contact layer is not formed as possible in the primary region.

The light-emitting device of the second invention can be configured so that the formation areas and non-formation areas of the contact layer are interlaced at least in the secondary region, out of the junction interface of the transparent oxide electrode, through which a larger amount of light emitted from the light-emitting layer portion can be extracted. The formation areas of the contact layer herein is preferably formed in a discrete manner. It is to be noted that, by assuming the secondary region as the residual region excluding the area (primary region) right under the metal electrode, the second aspect can be combined with the first aspect. According to this configuration, the light emitted right under the formation area of the contact layer can leak through the adjacent non-formation area, so that effect of absorption of the light by the contact layer can be suppressed even when the contact layer, formed in order to reduce the contact resistance of the conductive oxide electrode, has a large light absorption tendency. This is advantageous in raising the light extraction efficiency of the device as a whole.

It is also allowable to bond the light-emitting layer portion to the contact layer on the main surface thereof opposite to that facing to the transparent conductive oxide layer, while placing the intermediate layer in between. The intermediate layer is composed of a compound semiconductor having a band gap energy intermediate between those of the light-emitting layer portion and the contact layer.

The second aspect of the light-emitting device of the second invention comprises a transparent conductive semiconductor substrate, and a light-emitting layer portion composed of a compound semiconductor and bonded on one main surface of the transparent conductive semiconductor substrate; the light-emitting layer portion is covered with a transparent conductive oxide layer, also available as a light-extraction-surface-side electrode, on the main surface thereof opposite to that facing to the conductive substrate; and further comprises a contact layer for reducing junction resistance of the transparent conductive oxide layer, disposed between the light-emitting layer portion and the transparent conductive oxide layer so as to contact with the transparent conductive oxide layer. The transparent conductive semiconductor substrate is composed of a semiconductor transparent to the light emitted from the light-emitting layer portion. It is to be noted that "transparent to the light emitted from the light-emitting layer portion" in the context of this specification means that the transmissivity of the light emitted from the light-emitting layer portion is 50% or above, whereas the transmissivity less than 50% is referred to as "opaque to the light emitted from the light-emitting layer portion". The transparent conductive semiconductor substrate can be used as the back-surface-side light extraction surface. On the other hand, by covering the entire portion of the transparent conductive semiconductor substrate on the main surface thereof opposite to that bonded to the light-emitting layer portion with the metal electrode, it is made possible not only to superpose the backwardly emitted light after being reflected to the light extraction surface side, having formed thereon the electrode (transparent oxide electrode) composed of the transparent conductive oxide layer, but also to extract the light additionally from the side surface of the transparent conductive semiconductor substrate, and this successfully raises the emission efficiency. The device also has, on the light extraction surface side thereof, a thin transparent oxide electrode having a larger light transmissivity and a larger conductivity than those of the generally-used, current-spreading layer, to thereby attain a further improved light extraction efficiency by virtue of an excellent current-spreading effect of the electrode. Still another advantage is given by the contact layer formed between the light-emitting layer portion and the transparent conductive oxide electrode, and this is successful in reducing the contact resistance of the conductive oxide layer.

(Third Invention)

To solve the aforementioned subject, a method of fabricating light-emitting device of the third invention is such as comprising:

a light-emitting layer portion growth step for epitaxially growing the light-emitting layer portion composed of a compound semiconductor on a light-emitting-layer-growing substrate;

a metal layer forming step for forming a metal layer on a first main surface side of the conductive substrate;

a bonding-use transparent conductive oxide layer forming step for forming a bonding-use transparent conductive oxide layer on the first main surface side of the light-emitting layer portion; and a bonding step for bonding the conductive substrate and the light-emitting layer portion so as to allow the metal layer to contact with the bonding-use transparent conductive oxide layer, where all steps are sequentially carried out in this order.

A light-emitting device of the third invention is such as comprising a metal layer, a bonding-use transparent conductive oxide layer in contact with the metal layer, a light-emitting layer portion composed of a compound semiconductor, and an electrode for applying voltage to the light-emitting layer portion sequentially stacked in this order on one main surface of a conductive substrate.

In the third invention, the bonding-use transparent conductive oxide layer is formed on the first main surface side of the light-emitting layer portion, on which the conductive substrate is to be bonded while placing the metal layer in between. This is successful in suppressing alloying between the metal layer and the compound semiconductor composing the light-emitting layer portion, and thereby in raising the reflectivity of the metal layer.

In the bonding step, the bonding can be proceeded between the bonding-use transparent conductive oxide layer and the metal layer. An advantage of this step resides in that the process can be simplified because the bonding-use transparent conductive oxide layer is directly bonded to the metal layer on the conductive substrate.

The metal layer can be configured so that a portion thereof (after bonding) in contact with the bonding-use transparent conductive oxide layer is composed of an Au-base metal layer (containing Au as a major component (50 wt % or more)). The Au-base metal layer is advantageous in that it is less reactive with the bonding-use transparent conductive oxide layer, and can readily keep a high reflectivity even after the bonding. For the case where the ITO (indium tin oxide) layer is used as the bonding-use transparent conductive oxide layer, the bonding strength with the ITO layer can successfully be raised, and the contact resistance can further be reduced, if the metal layer is composed of an Sn-containing, Au-base metal layer (e.g., Au—Sn alloy) in a portion thereof in contact with the bonding-use transparent conductive oxide layer.

Although metal substrates such as those composed of Al, Cu and the like are available as the conductive substrate, inexpensive Si (silicon) substrate (polycrystal substrate or single crystal substrate: the former is especially inexpensive) is more advantageous by virtue of its large effect of cost reduction. The metal layer to be disposed at the bonding surface is preferably composed of the Au-base metal layer (containing Au as a major component (50 wt % or more): Au layer, for example) by virtue of its large reflectivity. In this case, bonding between the Si substrate and the light-emitting layer portion while placing the Au-base metal layer in between is preferably carried out by the annealing for bonding at 80° C. to 360° C. Any annealing temperature lower than 80° C. may result in only an insufficient bonding strength. The annealing temperature exceeding 360° C. (eutectic temperature of Au—Si binary alloy is about 363° C.) considerably promotes the eutectic reaction between Au on the metal layer side and Si on the substrate side, and this raises a nonconformity of a large drop in the reflectivity of the metal layer.

The light-emitting-layer-growing substrate can be separated from the light-emitting layer portion after bonding of the conductive substrate. Assuming the main surface on the light-emitting layer portion side exposed after the separation of the light-emitting-layer-growing substrate as a second main surface, it is allowable to carry out the electrode-forming transparent conductive oxide layer forming step for covering the second main surface with the electrode-forming transparent conductive oxide layer also available as the light-extraction-surface-side electrode. This process yields the light-emitting device having the light-emitting layer portion, of which main surface opposite to that facing to the conductive substrate is covered with the electrode-forming transparent conductive oxide layer also available as the electrode. According to this configuration of the light-emitting device, the light emitted through the light extraction surface side, having formed thereon the electrode-forming transparent conductive oxide layer, can be superposed with the backwardly emitted light after being reflected, and this successfully raises the emission efficiency. The device also has, on the light extraction surface side thereof, a thin electrode-forming transparent conductive oxide layer having a larger light transmissivity and a larger conductivity than those of the generally-used, current-spreading layer, to thereby attain a further improved light extraction efficiency by virtue of an excellent current-spreading effect of the oxide layer.

For the case where the electrode-forming transparent conductive oxide layer is formed on the second main surface (main surface exposed after the light-emitting-layer-growing substrate is separated), it is preferable to adopt sputtering, characterized by its relatively low growth temperature, in view of suppressing the eutectic reaction between Au on the metal layer side and Si on the substrate side. A preferable material for composing the electrode-forming transparent conductive oxide layer is ITO, which is particularly readily be obtained as a uniform and highly-conductive material. In other words, bonding of the Si substrate and the light-emitting layer portion while placing the Au-base metal layer in between, and formation of the ITO layer as the electrode-forming transparent conductive oxide layer by sputtering is successful in suppressing the eutectic reaction of the Au-base metal layer, and in raising the reflectivity thereof to a large degree.

It is to be noted that the transparent conductive oxide layer such as the ITO layer may sometimes fail in forming a desirable ohmic contact in direct bonding with the compound semiconductor layer on the light-emitting layer portion side, and may lower the emission efficiency due to increased series resistance based on the contact resistance. The light-emitting device of the third invention is, however, successful in reducing the contact resistance of the transparent conductive oxide layer by disposing the contact layer for reducing the contact resistance of the transparent conductive oxide layer so as to contact with the transparent conductive oxide layer. More specifically, the light-emitting device of the third invention is configured so as to have the contact layer for reducing the junction resistance of the bonding-use transparent conductive oxide layer formed between the bonding-use transparent conductive oxide layer and the light-emitting layer portion, so as to contact with the bonding-use transparent conductive oxide layer. In this case, the contact layer forming step for forming a contact layer, which is provided for reducing junction resistance of the bonding-use transparent conductive oxide layer, on the first main surface side of the light-emitting layer portion is carried out prior to the bonding-use transparent conductive oxide layer forming step.

It is also allowable to configure the light-emitting device so that the light-emitting layer portion is covered with an electrode-forming transparent conductive oxide layer, also available as a light-extraction-surface-side electrode, on the main surface thereof opposite to that facing to the conductive substrate, and the contact layer for reducing junction resistance of the electrode-forming transparent conductive oxide layer is disposed between the light-emitting layer portion and the electrode-forming transparent conductive oxide layer so as to contact with the electrode-forming transparent conductive oxide layer. In this case, the contact layer forming step for forming a contact layer, which is provided for reducing junction resistance of the bonding-use transparent conductive oxide layer, on the second main surface side of the light-emitting layer portion is carried out prior to the bonding-use transparent conductive oxide layer forming step.

The contact layer on the electrode-forming transparent conductive oxide layer side is preferably formed so that the formation areas and non-formation areas thereof are interlaced at the junction interface with the electrode-forming transparent conductive oxide layer. The contact layer if formed over the entire portion of the bonding surface to the light-emitting layer portion side of the electrode-forming transparent conductive oxide layer may undesirably result in the following nonconformities:

(1) The electrode-forming transparent conductive oxide layer needs a small metal electrode for wire bonding to be formed thereon. If the contact resistance between the electrode-forming transparent conductive oxide layer and the light-emitting layer portion becomes lowered also in the area right under the metal electrode to a considerable degree, the drive current and, as a consequence, the emitted light become more likely to concentrate into the area, so that a large portion of the emitted light is intercepted by the metal electrode, and this result in lowering of the light extraction efficiency.

(2) Depending on material species adopted for the contact layer, the contact layer may act as a light absorber, and this again results in lowering of the light extraction efficiency.

A light-emitting device of the third invention is therefore configured so that the a metal electrode for applying voltage to the light-emitting layer portion is formed on the main surface of the electrode-forming transparent conductive oxide layer so as to cover a partial area of the main surface; and the electrode-forming transparent conductive oxide layer has a primary region right under the metal electrode and the residual secondary region, and the contact layer is formed with an ratio of formation area larger in the secondary region than in the primary region. It is to be noted that the ratio of formation area of the contact layer in the individual regions is a ratio obtained by dividing a total area of the contact layer in the region with the total area of the region. In this configuration, the ratio of formation area of the contact layer formed in the junction interface of the electrode-forming transparent conductive oxide layer is set smaller in the region right under the metal electrode (primary region) which can yield only a less amount of light extraction, than in the residual region (secondary region) which can yield a larger amount of light extraction, so that contact resistance of the electrode-forming transparent conductive oxide layer in the primary region increases. This allows a larger portion of the drive current of the device to bypass the primary region to reach the secondary region, and thus raises the light extraction efficiency to a large degree. It is preferable, in view of improving the light extraction efficiency, that the emission drive current does not flow as possible in the primary region which can yield only a less amount of light extraction. It is therefore preferable that the contact layer is not formed as possible in the primary region.

The light-emitting device of the third invention can be configured so that the formation areas and non-formation areas of the contact layer are interlaced at least in the secondary region, out of the junction interface of the electrode-forming transparent conductive oxide layer, through which a larger amount of light emitted from the light-emitting layer portion can be extracted. The formation areas of the contact layer herein is preferably formed in a discrete manner. It is to be noted that, by assuming the secondary region as the residual region excluding the area (primary region) right under the metal electrode, the second aspect can be combined with the first aspect. According to this configuration, the light emitted right under the formation area of the contact layer can leak through the adjacent non-formation area, so that effect of absorption of the light by the contact layer can be suppressed even when the contact layer, formed in order to reduce the contact resistance of the electrode-forming transparent conductive oxide layer, has a large light absorption tendency. This is advantageous in raising the light extraction efficiency of the device as a whole.

In either junction interfaces with the bonding transparent oxide layer or with the electrode-forming transparent conductive oxide layer, the contact layer is preferably formed by adopting a compound semiconductor containing no Al, and having a band gap energy of less than 1.42 eV. Use of this sort of contact layer is successful in obtaining a desirable ohmic contact, and is less causative of increase in the resistivity due to oxidation of the Al component.

The contact layer can specifically be formed using In-containing GaAs. In this case, a desirable ohmic contact is obtained if the compound semiconductor composing the contact layer has a composition of $In_xGa_{1-x}As$ ($0<x\leq1$) (at least) at the junction interface with the transparent conductive oxide layer.

For the case where the bonding-use transparent conductive oxide layer is composed of the ITO layer, prior to the formation of the bonding-use transparent conductive oxide layer, a GaAs layer is formed on the first main surface side of the light-emitting layer portion, the ITO layer as the bonding-use transparent conductive oxide layer is then formed so as to contact with the GaAs layer, and the layers are annealed so as to diffuse In from the ITO layer into the GaAs layer to thereby form the contact layer composed of In-containing GaAs. On the other hand, for the case where the electrode-forming transparent conductive oxide layer is composed of the ITO layer, prior to the formation of the electrode-forming transparent conductive oxide layer, a GaAs layer is formed on the second main surface side of the light-emitting layer portion, the ITO layer as the electrode-forming transparent conductive oxide layer is then formed so as to contact with the GaAs layer, and the layers are annealed so as to diffuse In from the ITO layer into the GaAs layer to thereby form the contact layer composed of In-containing GaAs.

(Fourth Invention)

To solve the aforementioned subject, a light-emitting device of the fourth invention is such as comprising a compound semiconductor layer having a light-emitting layer portion, of which first main surface being used as a light extraction surface, and a device substrate bonded to the second main surface side of the compound semiconductor layer while placing a main metal layer having a reflective surface for reflecting light from the light-emitting layer portion towards the light extraction surface side;

and further comprising a diffusion-blocking layer, which is composed of an inorganic conductive material, and is provided for blocking diffusion of components derived from the device substrate into the main metal layer, interposed between the device substrate and the main metal layer. It is to be noted that, in this patent specification, "main metal layer" refers to a metal layer located between the compound semiconductor layer and the diffusion-blocking layer, and serves not only as a reflective surface but also a metal layer responsible for bonding between the compound semiconductor layer and the diffusion-blocking layer. It is therefore defined that the bonding metal layer on the light-emitting-layer-portion side described later is not included in the main metal layer.

According to the configuration of the light-emitting device of the fourth invention, diffusion of components from the device substrate towards the main metal layer, which possibly proceeds when the device substrate and the compound semiconductor layer are bonded while placing the main metal layer in between, is blocked by the diffusion-blocking layer composed of an inorganic conductive material, and denaturation of main metal layer due to reaction (metallurgical reaction such as eutectic reaction) with the components in the device substrate can effectively be suppressed. This is successful in effectively suppressing nonconformities such as lowering in the reflectivity of the reflective surface formed by the main metal layer, and decrease in the contact strength between the main metal layer and the compound semiconductor layer, and further successful in suppressing lowering in the production yield of the light-emitting device ascribable to these nonconformities.

Configuration of the diffusion-blocking layer using an inorganic conductive material is advantageous in suppressing chemical or metallurgical reaction between the diffusion-blocking layer and the device substrate and/or main metal layer up to relatively high temperatures, and also in expanding the temperature range of the annealing for bonding between the device substrate and the compound semiconductor layer while placing the main metal layer in between towards high temperatures. The annealing for bonding enabled at higher temperatures typically ensures a desirable bonded status and enhances the bonding strength between the device substrate and the compound semiconductor layer, without degrading status of the reflective surface formed on the main metal layer. Expansion of the temperature range affording desirable bonded status is also advantageous in terms of increasing degree of freedom of the process steps, and of reducing proportion of the bonding failure due to variation in the annealing temperature. Further simplification of the process steps can be realized if the higher-temperature annealing which has been intended for other processes is used also for the annealing for bonding.

It is preferable that the diffusion-blocking layer is specifically composed of a conductive oxide in view of readily obtaining a large conductivity and ensuring easy production. The conductive oxide layer can specifically be configured using ITO (indium tin oxide).

The thickness of the diffusion-blocking layer is preferably set within a range from 1 nm to 10 μm. Any thickness less than 1 nm may result in only an insufficient diffusion blocking effect, and exceeding 10 μm result in only unnecessary increase in the production cost due to saturation of the effect.

Between the diffusion-blocking layer and the device substrate, it is allowable to interpose a substrate-side bonding metal layer for reducing junction resistance between the diffusion-blocking layer and the device substrate. This is successful in reducing the contact resistance between the diffusion-blocking layer composed of a conductive material and the device substrate, and in effectively suppressing the series resistance as well as an excessive increase in the forward voltage of the light-emitting device despite the diffusion-blocking layer is additionally interposed.

An especially large merit of the fourth invention can be obtained when the main metal layer is composed of an Au-base layer containing Au as a major component at least at the portion thereof including the interface with the diffusion-blocking layer, and the device substrate is an Si substrate. That is, the Si substrate is readily given with a sufficient conductivity for use in the light-emitting device by doping, and is inexpensive. Si and Au, however, are likely to cause eutectic reaction at relatively low temperatures (eutectic temperature of an Au—Si binary alloy is 363° C., but may be lowered if any other alloy components exist), and the annealing for bonding is highly causative of diffusion of Si on the substrate side towards the Au-base layer side. This is highly causative of disturbance on the reflective surface of the main metal layer and lowering in the reflectivity due to eutectic reaction of the Au-base layer in the main metal layer with Si composing the device substrate. Whereas provision of the diffusion-blocking layer between the Au-base layer and the Si substrate as in the fourth invention is successful in effectively preventing the reflectivity of the reflective surface of the main metal layer from being lowered. It is to be noted now that the "main component" in the context of this patent specification means a component contained at a largest content by weight.

For the case where an n-type Si substrate is used as the device substrate, it is preferable to interpose a substrate-side bonding metal layer composed of an AuSb alloy or an AuSn alloy between the diffusion-blocking layer and the Si substrate, in order to reduce the junction resistance between the Si substrate and the diffusion-blocking layer. In this case, a larger effect of reducing the contact resistance is obtained if the annealing for alloying between the substrate-side bonding metal layer and the Si substrate is carried out within a temperature range from 100° C. to 500° C.

In the light-emitting device of the fourth invention, the reflective surface can be composed of the Au-base layer. The Au-base layer is preferable as a material for composing the reflective surface because it is chemically stable and is less causative of degradation of the reflectivity due to oxidation or the like. In particular for the case where the Si substrate is used, there has been a large risk that Au in the first Au-base layer composing the reflective surface and Si composing the Si substrate undergo eutectic reaction to thereby lower the reflectivity. In contrast to this, the disposition of the diffusion-blocking layer between the Si substrate and the Au-base layer as in the fourth invention can very effectively suppress this nonconformity and can form the reflective surface having a desirable reflectivity using the Au-base layer without causing any problems. For the case where the reflective layer is composed of the Au-base layer, it is allowable to form the light-emitting-layer-portion-side bonding metal layer containing Au as a major component between the Au-base layer and the compound semiconductor layer, so as to be arranged in a discrete manner on the main surface of the Au-base layer. The Au-base layer composes a part of the current supply route to the light-emitting layer portion. Direct bonding of the Au-base layer to the light-emitting layer portion composed of a compound semiconductor, however, may undesirably raise the contact resistance, and this may consequently increase the series resistance and lower the emission efficiency. In contrast to this, bonding of the Au-base layer to the light-emitting layer portion while placing the Au-base bonding metal layer in between is successful in reducing the contact resistance. It is, however, to be noted that the Au-base bonding metal layer necessarily contains a relatively large amount of alloying component in order to ensure a desirable contact, and this inevitably limits the reflectivity to some lower level. The discrete arrangement of the light-emitting-layer-portion-side bonding metal layer on the main surface of the Au-base layer is now advantageous in ensuring the a large reflectivity of the Au-base layer in the non-formation area of the light-emitting-layer-portion-side bonding metal layer.

Adoption of an AuGeNi bonding metal layer as the light-emitting-layer-portion-side bonding metal layer is particularly advantageous in enhancing the effect of reducing the contact resistance particularly for the case where the adjacent compound semiconductor layer is composed of an n-type, Group III–V compound semiconductor (e.g., the aforementioned $(Al_xGa_{1-x})_yIn_{1-y}P$ (where, $0 \leq x \leq 1$, $0 \leq y \leq 1$)). In this case, it is allowable to form the AuGeNi bonding metal layer on the bonding-side main surface of the compound semiconductor layer, and to form the Au-base layer so as to cover the AuGeNi bonding metal layer.

To thoroughly raise the light extraction effect, it is preferable to adjust the ratio of formation area of the light-emitting-layer-portion-side bonding metal layer to the Au-base layer (which is a ratio obtained by dividing a formation area of the light-emitting-layer-portion-side bonding metal layer with the total area of the Au-base layer) within a range from 1% to 25%. Any ratio of formation area less than 1% may result in only an insufficient effect of lowering the contact resistance, and exceeding 25% may result in reduction in the reflection intensity. The Au-base layer can further be enhanced in the reflectively thereof in the non-formation area of the light-emitting-layer-portion-side bonding metal layer, by setting the Au content thereof larger than that of the light-emitting-layer-portion-side bonding metal layer.

In the fourth invention, the reflective layer can also be formed with an Ag-base layer containing Ag as a major component interposed between the Au-base layer and the compound semiconductor layer. The Ag-base layer is not so expensive as the Au-base layer, and has only a small wavelength dependence of the reflectivity, showing a desirable reflectivity almost over the entire wavelength region of the visible light (350 nm to 700 nm). This is consequently successful in realizing a large light extraction efficiency irrespective of emission wavelength of the device. The Ag-base layer is also advantageous in that it is less causative of lowering in the reflectivity due to formation of oxide layer and so forth, unlike other metals such as Al.

FIG. 36 is a graph showing reflectivity of some kinds of metals having mirror-polished surfaces, where plot "■" represents the reflectivity of Ag, plot "Δ" represents the reflectivity of Au, plot "♦" represents the reflectivity of Al (comparative example), and plot "X" represents the reflectivity of AgPdCu alloy. The reflectivity of Ag is desirable within a range from 350 nm to 700 nm (as well as in the infrared region on the longer wavelength side), and particularly within a visible light range from 380 nm to 700 nm.

On the other hand, Au is a colored metal and, as clearly shown in FIG. 36, exhibits a strong absorption in the visible region of 670 nm or shorter (particularly in a wavelength region of 650 nm or shorter, and still larger absorption observed in a region of 600 nm or shorter), so that Au will considerably lower the reflectivity if a peak emission wavelength of the light-emitting layer portion resides at 670 nm or shorter wavelength. This tends to lower the emission intensity, may alter the spectrum of the extracted light from that of the originally-expectable light, and may be more causative of changes in the emission color tone. On the contrary, Ag shows a good reflectivity also in the visible region of 670 nm or shorter wavelength. In other words, Ag can realize a far better light extraction efficiency than the Au-base metal can, for the case where the peak emission wavelength of the light-emitting layer portion resides at 670 nm or shorter wavelength (particularly in a wavelength region of 650 nm or shorter, and more preferably 600 nm or shorter).

On the other hand, Al shows no absorption peak as is clear from FIG. 36, but shows a slightly lowered reflectivity (typically 85 to 92%) in the visible light region due to formation of oxide film. In contrast to this, the Ag-base metal is less causative of the oxide film formation, and can ensure a reflectivity larger than that of Al. More specifically, it is obvious that the Ag-base metal exhibits better reflectivity than that shown by Al in the wavelength region of 400 nm or longer (particularly 450 or longer).

It is to be noted now that the reflectivity of Al shown in FIG. 36 is measured for the mirror-polished surface obtained after mechanical polishing and chemical polishing, on which formation of the oxide film is suppressed, so that the actual measurement in the presence of a thick oxide film may show further lower values than those shown in FIG. 36. Although Ag seems to be inferior to Al in the reflectivity in the short wavelength region from 350 nm to 400 nm as judged from FIG. 36, Ag is far less likely to produce the oxide film thereon than Al is. The Ag-base layer adopted to the reflective metal layer in the actual light-emitting device, therefore, makes it possible to achieve the reflectivity superior to that of Al also in this wavelength region. In this wavelength region, Ag again shows reflectivity higher than that of Au.

In conclusion, it can be said that the Ag-base layer shows a distinct effect in improving the light extraction efficiency superior to that of Al and Au, for the case where the light-emitting layer portion has a peak emission wavelength within a wavelength range from 350 nm to 670 nm (more preferably from 400 nm to 670 nm, and still more preferably from 450 nm to 600 nm). The light-emitting layer portion causative of the above-described peak emission wavelength is typically configured as having a double heterostructure in which a first-conductivity-type cladding layer, an active layer, and a second-conductivity-type cladding layer, which are composed of $(Al_xGa_{1-x})_yIn_{1-y}P$ (where, $0 \leq x \leq 1$, $0 \leq y \leq 1$) or $In_xGa_yAl_{1-x-y}N$ (where, $0 \leq x \leq 1$, $0 \leq y \leq 1$, $x+y \leq 1$), are stacked in this order.

For the case where the Ag-base layer is used for forming the reflective layer, it is allowable to dispose an Ag-base bonding metal layer containing Ag as a major component between the Ag-base layer and the compound semiconductor layer in a discrete manner on the main surface of the Ag-base layer. Adoption of an AgGeNi bonding metal layer as the Ag-base bonding metal layer is particularly advantageous in enhancing the effect of reducing the contact resistance particularly for the case where the adjacent compound semiconductor layer is composed of an n-type, Group III–V compound semiconductor (e.g., the aforementioned $(Al_xGa_{1-x})_yIn_{1-y}P$ (where, $0 \leq x \leq 1$, $0 \leq y \leq 1$)). The ratio of formation area of the Ag-base bonding metal layer on the light-emitting-layer-portion side to the Ag-base layer is preferably set within a range from 1% to 25%, similarly to as described in the above.

A method of fabricating a light-emitting device according to the fourth invention is a method of fabricating a light-emitting device which comprises a compound semiconductor layer having a light-emitting layer portion, of which first main surface being used as a light extraction surface, and a device substrate bonded to the second main surface side of the compound semiconductor layer while placing a main metal layer having a reflective surface for reflecting light from the light-emitting layer portion towards the light extraction surface side; and comprises the steps of:

forming a diffusion-blocking layer, which is composed of an inorganic conductive material, and is provided for blocking diffusion of components derived from the device substrate into the main metal layer, on the device substrate on the side to which the compound semiconductor layer is to be bonded;

forming the main metal layer on at least either one of the second main surface of the compound semiconductor layer, and the main surface of the diffusion-blocking layer formed on the device substrate; and thereafter bonding the device substrate and the compound semiconductor layer while placing the diffusion-blocking layer and the main metal layer in between.

According to this method, diffusion of components from the device substrate towards the main metal layer, which possibly proceeds when the device substrate and the compound semiconductor layer are bonded while placing the main metal layer in between, is blocked by the diffusion-blocking layer, and denaturation of main metal layer due to reaction with the components in the device substrate can effectively be suppressed. This is successful in effectively suppressing nonconformities such as lowering in the reflectivity of the reflective surface formed by the main metal layer, and decrease in the contact strength between the main metal layer and the compound semiconductor layer, and further successful in suppressing lowering in the production yield of the light-emitting device ascribable to these nonconformities. Configuration of the diffusion-blocking layer using an inorganic conductive material is advantageous in suppressing chemical or metallurgical reaction between the diffusion-blocking layer and the device substrate and/or main metal layer up to relatively high temperatures, and also in expanding the temperature range of the annealing for bonding between the device substrate and the compound semiconductor layer while placing the main metal layer in between towards high temperatures. The annealing for bonding enabled at higher temperatures typically ensures a desirable bonded status and enhances the bonding strength between the device substrate and the compound semiconductor layer, without degrading status of the reflective surface formed on the main metal layer. Expansion of the temperature range affording desirable bonded status is also advantageous in terms of increasing degree of freedom of the process steps, and of reducing proportion of the bonding failure due to variation in the annealing temperature. Further simplification of the process steps can be realized if the higher-temperature annealing which has been intended for other processes is used also for the annealing for bonding. Possible process in this case is such as stacking the device substrate and the compound semiconductor layer while placing the diffusion-blocking layer and the main metal layer in between, and then annealing the stack in this status to thereby bond the device substrate and compound semiconductor substrate. Despite the above-described component is more likely to diffuse by the annealing, the interposition of the diffusion-blocking layer can effectively suppress the nonconformities ascribable to the diffusion.

The method of fabricating a light-emitting device of the fourth invention may arbitrarily be added with the following options:

(1) configuring the diffusion-blocking layer with a conductive oxide;

(2) using ITO as the conductive oxide;

(3) adjusting the thickness of the diffusion-blocking layer to 1 nm to 10 μm;

(4) forming the substrate-side bonding metal layer for reducing the junction resistance between the device substrate and the diffusion-blocking layer on the main surface of the device substrate, and then forming the diffusion-blocking layer on the substrate-side bonding metal layer;

(5) composing the main metal layer with an Au-base layer containing Au as a major component at least at the portion thereof including the interface with the diffusion-blocking layer, and using an Si substrate as the device substrate; and (6) using an n-type Si substrate as the device substrate, and interposing a substrate-side bonding metal layer, which is composed of an AuSb alloy or an AuSn alloy, and is provided for reducing junction resistance between the diffusion-blocking layer and the Si substrate.

Operations and effects expected from the addition of these options have already explained above in the disclosure of the light-emitting device of the fourth invention, so that explanation thereof will not be repeated.

In the method of fabricating a light-emitting device of the fourth invention, it is allowable to dispose a first Au-base layer intended for becoming the main metal layer and containing Au as a major component on a bonding-side surface of the compound semiconductor layer, where the bonding-side surface being assumed as the main surface of the compound semiconductor layer opposite to that serves as the light extraction surface;

to dispose a second Au-base layer intended for becoming the main metal layer and containing Au as a major component on a bonding-side surface of the device substrate, where the bonding-side surface being assumed as the main surface of the device substrate intended for being located on the light-emitting layer portion side; and to bond the first Au-base layer and the second Au-base layer under close contact.

In the method of fourth invention, the first and second Au-base layers are divisionally formed on the compound semiconductor layer side and device substrate side, and the Au-base layers are then bonded under close contact. Because the Au-base layers can readily unite with each other under relatively low temperatures, a sufficient bonding strength can be obtained even under a low annealing temperature for bonding, and the metal reflective layer including the Au-base layer can readily be formed so as to have a well-conditioned reflective surface.

In this case, the annealing for bonding can be proceeded at 80° C. or above if the first and second Au-base layers used herein respectively have an Au content of 95 wt % or above. By selecting the first and second Au-base layers so as to have an Au content of 95 wt % or above, the lower limit of the temperature range in the annealing for bonding, which is carried out to bond the first Au-base layer and the second Au-base layer, can be lowered to as low as 80° C. or around. This further facilitates the bonding of the device substrate and the compound semiconductor layer, and further increases the bonding strength. These effects are more enhanced if pure Au (where, inevitable impurities contained in an amount of 1 wt % or less is allowable) is specifically used as the material composing the Au-base layer (that is, first Au-base layer and second Au-base layer). The temperature of the annealing for bonding is more preferably set to 100° C. or above.

The effect of lowering the temperature of the annealing for bonding by the above-described method, despite using the Au-base layer, becomes particularly distinctive when the Si substrate is used as the device substrate. While the Si substrate react with Au at a relatively low eutectic temperature, mutual bonding between the Au-base layers can proceed at temperatures sufficiently lower than the eutectic temperature, and this successfully ensures a desirable reflectivity and bonding strength. Such lowering of the temperature of the annealing for bonding, as being combined with the disposition of the diffusion-blocking layer, is successful in more effectively suppressing the Si diffusion into the Au-base layer (directly towards the second Au-base layer), and in forming the reflective layer of the finally obtained main metal layer so as to have a desirable reflectivity. This effect becomes more distinct when the reflective surface is composed of the first Au-base layer, or in other words, the reflective surface per se is configured as the Au-base layer. For the case where the Si substrate is used, and both of the first Au-base layer and the second Au-base layer respectively have an Au content of 95 wt % or above, it is preferable to set the temperature of the annealing for bonding to 380° C. or below. Any temperature of the annealing for bonding exceeding 380° C. may result in excessive alloying between the compound semiconductor layer and Au, to thereby considerably degrade the reflectivity of the metal layer.

For the case where the Si substrate is used for the device substrate, it is allowable to form the substrate-side bonding metal layer on the bonding-side main surface of the Si substrate, to form the second Au-base layer so as to cover the substrate-side bonding metal layer, and to anneal the substrate-side bonding metal layer and the Si substrate for alloying. When the n-type Si substrate is used, the substrate-side bonding metal layer can preferably be composed of an AuSb alloy or AuSn alloy. In this case, the effect of reducing the contact resistance can be raised by allowing the annealing for alloying the substrate-side bonding metal layer and the Si substrate to proceed typically within a temperature range from 100° C. to 500° C.

For the case where the compound semiconductor layer in contact with the metal layer on the light-emitting-layer-portion side is composed of an n-type Group III–V compound semiconductor (aforementioned $(Al_xGa_{1-x})_yIn_{1-y}P$ (where, $0 \leq x \leq 1$, $0 \leq y \leq 1$)), the metal layer on the light-emitting-layer-portion side preferably comprises an AuGeNi bonding metal layer, as descried in the above. A possible configuration in this case is such as forming the AuGeNi bonding metal layer on the bonding-side main surface of the compound semiconductor layer, and forming a the aforementioned first Au-base layer so as to cover the AuGeNi bonding metal layer. The annealing for alloying between the AuGeNi bonding metal layer and the compound semiconductor layer is successful in enhancing reducing effect of the contact resistance if it is proceeded typically at 350° C. to 660° C. On the other hand, for the case where the Ag-base layer is used for forming the reflective surface, the AgGeNi bonding metal layer can be adopted as the bonding metal layer on the light-emitting-layer-portion side, where the annealing for alloying between the AuGeNi bonding metal layer and the compound semiconductor layer is successful in enhancing reducing effect of the contact resistance if it is proceeded typically at 350° C. to 550° C.

Specific methods for forming the metal layer in the fourth invention include vapor phase film forming methods such as vacuum evaporation and sputtering, and electrochemical film forming methods such as electroless plating and electrolytic plating.

DESCRIPTION OF THE PREFERRED EMBODIMENTS (First Invention)

The following paragraphs will describe embodiments of the first invention referring to the attached drawings.

Figure 1:
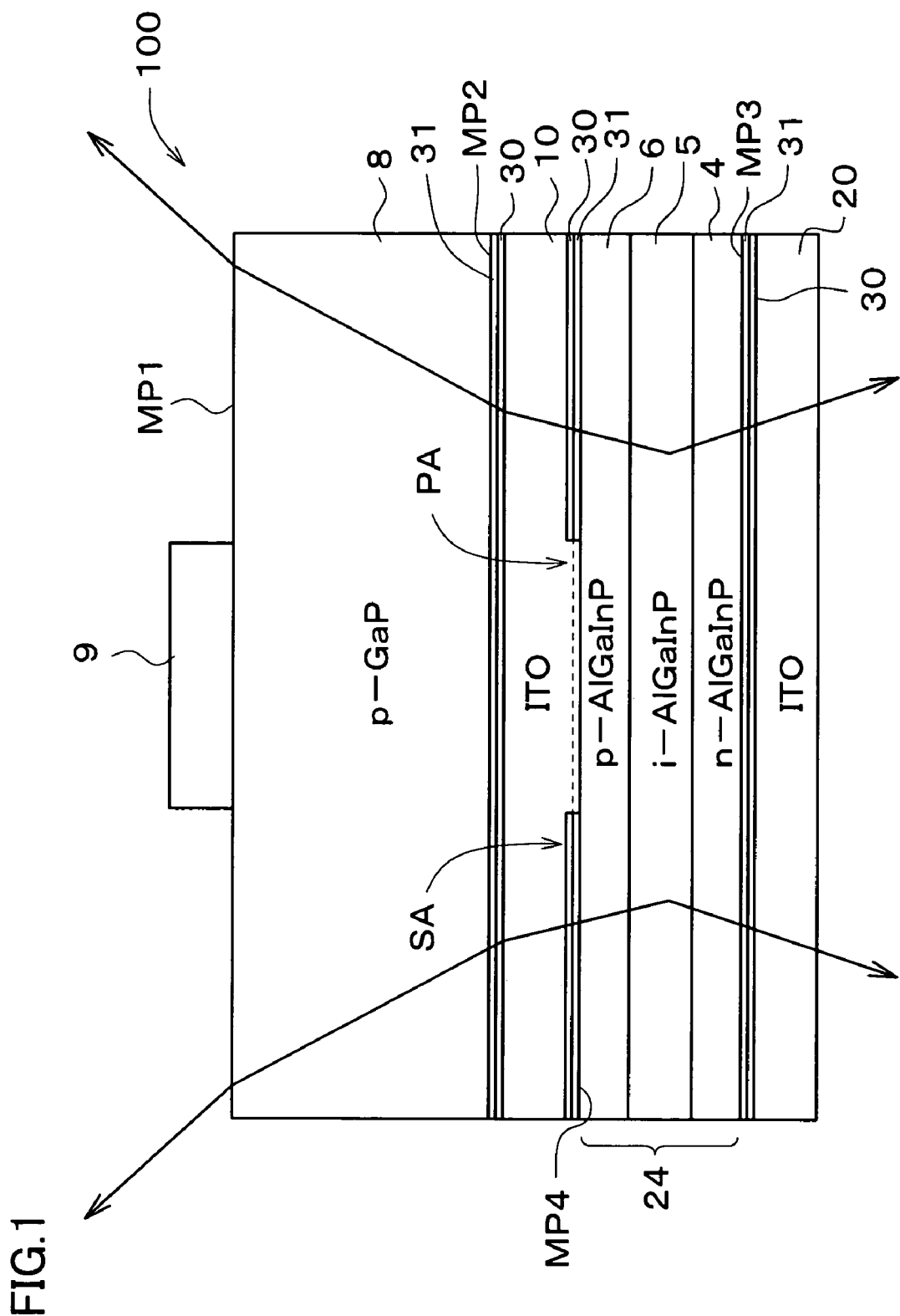
FIG. 1 is a schematic drawing showing a stacked structure of a first embodiment of the light-emitting device according to the first invention.

FIG. 1 is a conceptual drawing of a light-emitting device 100 of one embodiment according to the first invention. The light-emitting device 100 comprises a p-GaP single crystal substrate 8 as the transparent conductive semiconductor substrate, and a light-emitting layer portion 24 disposed on the main back surface MP2 thereof. The entire portion of the main back surface MP3 of the light-emitting layer portion 24 is covered with an ITO layer 20. The p-GaP single crystal substrate 8 functions as a current-spreading layer and a light extraction layer, and at around the center of the main surface MP1 thereof, a metal electrode (e.g., Au electrode) 9 for applying emission drive voltage to the light-emitting layer portion 24 is formed so as to cover a portion of the main surface MP1. The area around the metal electrode 9 on the main surface MP1 of the p-GaP single crystal substrate 8 serves as an extraction area of the light emitted from the light-emitting layer portion 24. The light extraction is also available from the entire portion of the back surface MP3 of the light-emitting layer portion 24 through the ITO layer 20.

The light-emitting layer portion 24 is configured so that an active layer 5 composed of non-doped $(Al_xGa_{1-x})_yIn_{1-y}P$ (where, $0 \leq x \leq 0.55$, $0.45 \leq y \leq 0.55$) alloy is sandwiched by a p-type cladding layer 6 (first-conductivity-type cladding layer) composed of p-type $(Al_xGa_{1-z})_yIn_{1-y}P$ (where, $x<z \leq 1$) and an n-type cladding layer 4 (second-conductivity-type cladding layer) composed of n-type $(Al_zGa_{1-z})_yIn_{1-y}P$ (where, $x<z \leq 1$), and so as to adjust the emission wavelength from green to red regions (emission wavelength (center wavelength) of 550 nm to 650 nm) depending on the composition of the active layer 5. In the light-emitting device 100 shown in FIG. 1, the p-type AlGaInP cladding layer 6 is disposed on the metal electrode 9 side, and the n-type AlGaInP cladding layer 4 is disposed on the ITO layer 20 side. The device thus has positive polarity on the metal electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

The p-GaP single crystal substrate 8 is typically fabricated by slicing and polishing a p-type GaP single crystal ingot typically containing Zn as a p-type dopant, has a thickness typically within a range from 100 μm to 500 μm, and has a refractive index of 3.35 or around for the light ranging from a wavelength of 550 nm to 650 nm emitted from the light-emitting layer portion 24. The p-GaP single crystal substrate 8 is bonded to the main surface MP4 of the light-emitting layer portion 24 while placing an ITO layer 10 in between. Both of the ITO layers 20 and 10 are composed as amorphous layers.

The ITO layers 10, 20 in contact with the light-emitting layer portion 24 have formed thereon contact layers 30 which are composed of InGaAs or the like, on the side thereof in contact with the light-emitting layer portion 24 and on the side in contact with the p-GaP single crystal substrate 8, so as to contact with the ITO layers 10, 20. The contact layers 30 are made as thin as 1 nm to 20 nm (preferably 5 nm to 10 nm) so as to reduce influence of light absorption.

Between the individual contact layers 30 and the light-emitting layer portion 24 or the p-GaP single crystal substrate 8, intermediate layers 31 having a band gap energy intermediate between those of the contact layers and the light-emitting layer portion 24 (cladding layer) or the p-GaP single crystal substrate 8 are formed. The intermediate layer 31 can be configured so as to contain at least any one of AlGaAs layer, GaInP layer and AlGaInP layer. In this embodiment, all of the intermediate layers 31 are respectively composed of a single AlGaAs layer.

With respect to the ITO layer 10 formed as the substrate-bonding conductive oxide layer, the contact layer 30 on the side close to the light-emitting layer portion 24 is not formed in a primary region PA which locates right under the metal electrode 9 and can yield only a less amount of light extraction, and instead selectively formed only in a secondary region SA therearound which can yield a larger amount of light extraction. This selectively increases the series resistance in the primary region PA, consequently increases the roundabout current density in the secondary region SA, that is at around the metal electrode 9, and thus raises the light extraction efficiency. The contact layers 30 can be formed by patterning a metal layer using publicly-known photolithographic technique so as not to remain the metal layer in the primary region PA.

In this embodiment, the contact layer 30 in contact with the ITO layer 10 on the p-GaP single crystal substrate 8 side, and the contact layer 30 in contact with the ITO layer 20 disposed on the back surface side of the light-emitting layer portion 24 are formed so as to cover the entire portion of the ITO layers 10 and 20. It is, however, allowable herein to adopt a configuration in which also these contact layers 30 are selectively formed only in the secondary region SA in a similar manner. This is further successful in enhancing the light extraction efficiency. As for the intermediate layers 31, they may be patterned corresponding to the contact layers 30, or may be formed on the entire portion of the ITO layer 10 while patterning the contact layer 30 only.

Figure 7A:
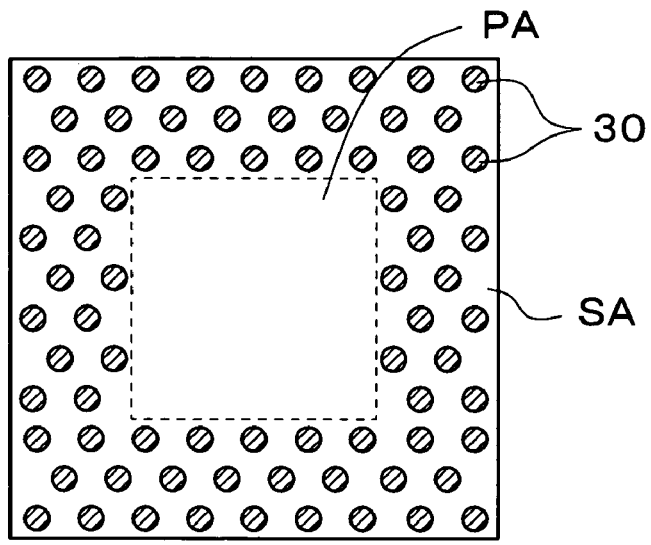
FIG. 7A is a schematic drawing of a first example of various patterned form of the contact layer in the light-emitting device shown in FIG. 1.
Figure 7B:
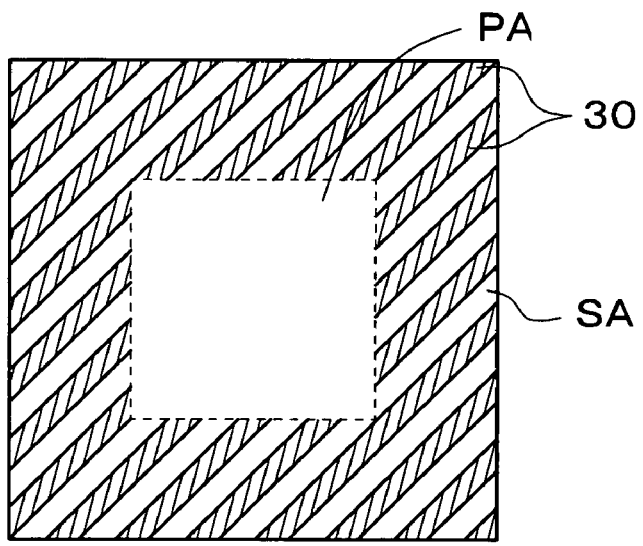
FIG. 7B is a schematic drawing of a second example of various patterned form of the contact layer in the light-emitting device shown in FIG. 1.
Figure 7C:
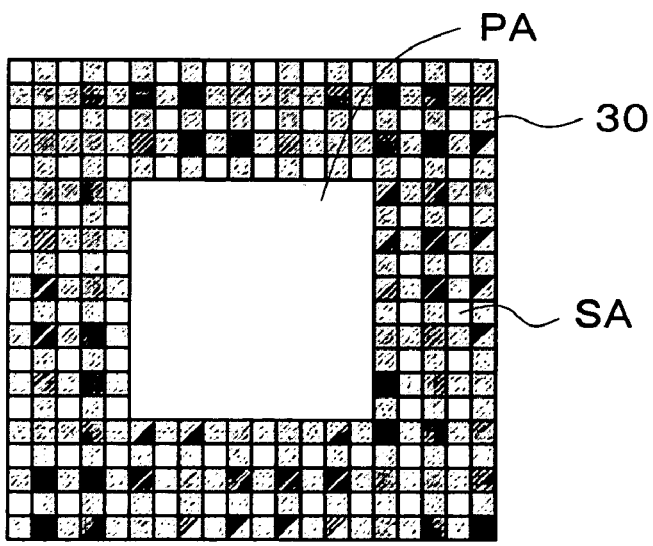
FIG. 7C is a schematic drawing of a third example of various patterned form of the contact layer in the light-emitting device shown in FIG. 1.

It is also allowable in the secondary region SA to form the contact layer 30 in contact with the ITO layer 10 on the p-GaP single crystal substrate 8 side, so as to be interlaced with the formation area and the non-formation area of the contact layer 30, as shown in FIGS. 7A to 7C. In this case, the ITO layer 10 and the light-emitting layer portion 24 are brought into direct contact in the non-formation area of the contact layer. Such discrete formation of the contact layer 30 at the contacting interface with the ITO layer 10 is successful in equalizing the light emission by the light-emitting layer portion 24, and in extracting more uniform light through the non-formation area of the contact layer 30. FIG. 7A shows the contact layer 30 formed in a scattered-dot pattern, and FIG. 7B shows thin-stripe-patterned formation areas of the contact layer 30 disposed alternatively with same-patterned, non-formation areas. FIG. 7C shows an inverted pattern of FIG. 7A, in which the non-formation areas having a scattered-dot pattern are arranged on the background of the formation area of the contact layer 30. The formation area of the contact layer 30 herein has a lattice pattern. It is now also allowable to pattern other contact layers 30 shown in FIG. 1 so that the formation areas and non-formation areas thereof are interlaced in a similar manner. The intermediate layers 31 may be patterned corresponding to the contact layers 30, or only the contact layers 30 may be patterned. The patterning can be effected by any publicly-known photolithographic techniques. The above-described structures are completely applicable also to the contact layer 30 in the device configuration shown in FIG. 12 as described later, in which the ITO layer 20 as the electrode-forming conductive oxide layer is to be formed on the contact layer 30, where similar operations and effects are attainable.

The following paragraphs will describe a method of fabricating the light-emitting device 100 shown in FIG. 1.

Figure 2:
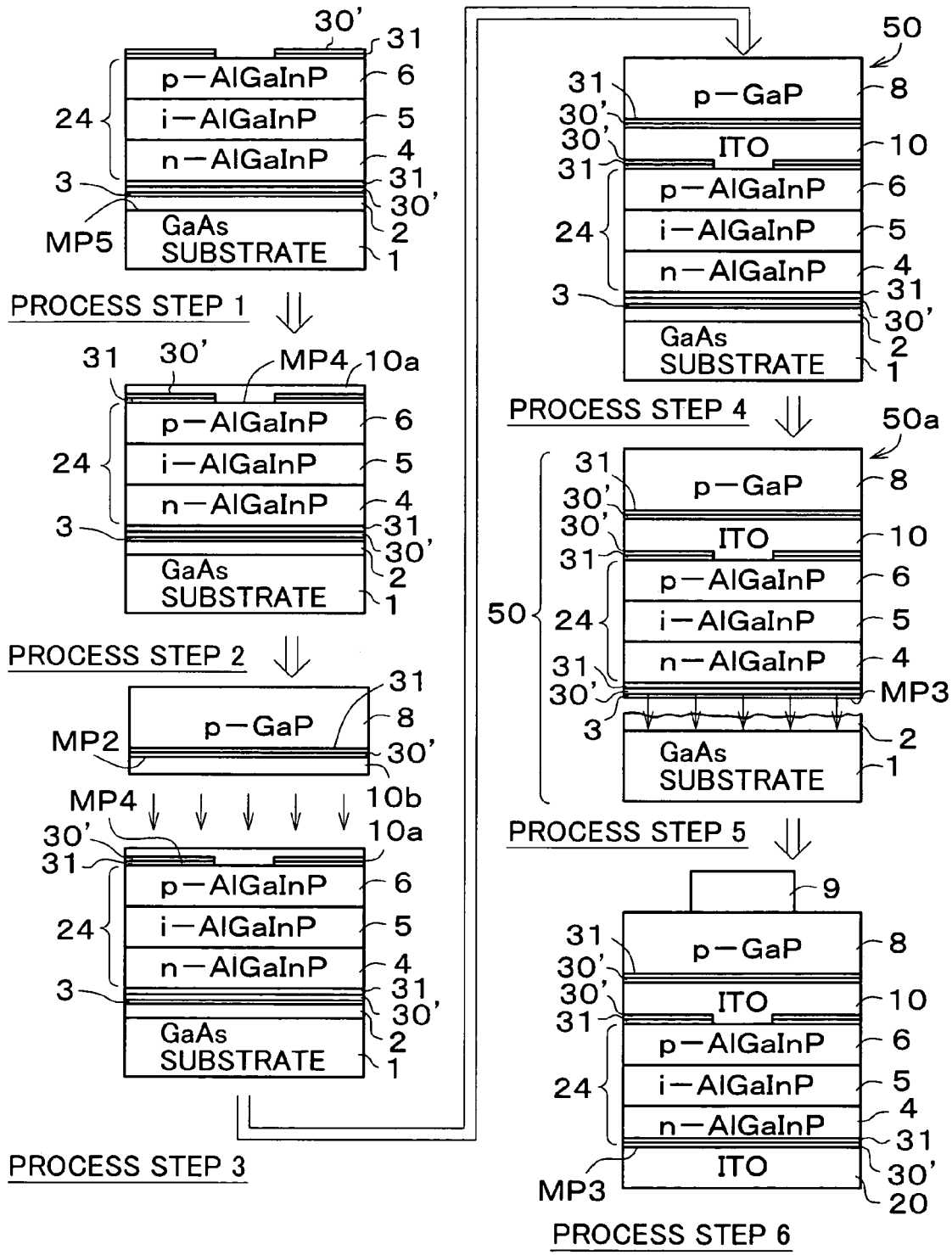
FIG. 2 is a drawing showing process steps of fabrication of the light-emitting device shown in FIG. 1.

First as shown in process step 1 in FIG. 2, on the main surface MP5 of a GaAs single crystal substrate 1 which is a semiconductor single crystal substrate used as the light-emitting-layer-growing substrate, an n-type GaAs buffer layer 2 typically of 0.5 μm thick, and a separating layer 3 composed of AlAs typically of 0.5 μm thick are formed by epitaxial growth. A GaAs layer 30' intended for later becoming the contact layer 30 and the intermediate layer 31 are then epitaxially grown thereon sequentially in this order, and the light-emitting layer portion 24 is formed further thereon by epitaxially growing the n-type AlGaInP cladding layer 4 of 1 μm thick, the (non-doped) AlGaInP active layer 5 of 0.6 μm thick, and the p-type AlGaInP cladding layer 6 of 1 μm thick in this order. Further on the p-type AlGaInP cladding layer 6, the intermediate layer 31 and the GaAs layer 30' similar to as described in the above are epitaxially grown sequentially in this order. It is to be noted that the intermediate layer 31 and GaAs layer 30' to be formed in the last stage are patterned by photolithography so as to be removed only in the area (primary region) corresponding to the metal electrode 9 (FIG. 1).

Both of the intermediate layer 31 and GaAs layer 30' can basically be formed by the MOVPE process or the like. In particular for the GaAs layer 30', a process step as described in the next is applicable considering that it is formed in contact with the In-containing ITO layer 10 or 20. That is, as shown in process step 2 in FIG. 2, the intermediate layer 31 and the GaAs layer 30' are sequentially formed on the p-type cladding layer 6, and an ITO layer 10a is then formed. Also in process steps 3 and 6, the intermediate layer 31 and the GaAs layer 30' are formed respectively on the p-GaP single crystal substrate 8 and the n-type cladding layer 4, and the an ITO layers 10b and 20 are then respectively formed thereon. The ITO layers 10a and 10b are bonded to be united as the ITO layer 10, and then subjected to annealing at high temperatures for a short time, to thereby allow In to diffuse from the individual ITO layers 10, 20 towards the correspondent GaAs layers 30'. The process will be described in more detail below.

First as shown in process step 2, the ITO layer 10a as the transparent conductive oxide layer is formed on the main surface MP4 of the light-emitting layer portion 24 by RF sputtering. On the other hand, as shown in process step 3, the ITO layer 10b is formed on the main surface MP2 of the p-GaP single crystal substrate 8 separately obtained. The p-GaP single crystal substrate 8 and the light-emitting layer portion 24 are then stacked and pressed so as to oppose the ITO layers 10b and 10a, and the stack is then annealed under predetermined conditions (e.g., at 450° C. for 30 minutes), to thereby obtain a substrate bond 50. The ITO layer 10a and the ITO layer 10b are united to give the substrate-bonding conductive oxide layer 10.

The process then advances to process step 5, where the substrate bond 50 is dipped in an etching solution typically comprising a 10% aqueous hydrofluoric acid solution, so as to selectively etch the AlAs separating layer 3 formed between the buffer layer 2 and the light-emitting layer portion 24, to thereby separate the GaAs single crystal substrate 1 (opaque to the light from the light-emitting layer portion 24) from the stack 50a which comprises the light-emitting layer portion 24 and the p-GaP single crystal substrate 8 bonded thereto. Another possible process is such that the etching stop layer composed of AlInP is formed in place of the AlAs separating layer 3, the GaAs single crystal substrate 1 is then etched off together with the GaAs buffer layer 2 using a first etching solution (e.g., ammonia/hydrogen peroxide mixed solution) having an etching selectivity to GaAs, and the etching stop layer is then etched off using a second etching solution (e.g., hydrochloric acid, where addition of hydrofluoric acid for removing Al oxide layer also allowable) having an etching selectivity to AlInP.

Next as shown in process step 6, the ITO layer 20 is formed so as to cover the intermediate layer 31 and GaAs layer 30' which have been formed on the main back surface MP3 of the light-emitting layer portion 24 exposed after the separation of the GaAs single crystal substrate 1. Thus-obtained stacked wafer (either status having or not having the metal electrode 9 allowable) is then disposed in a furnace, and annealed under an inert gas atmosphere such as containing nitrogen or Ar, at a temperature as low as 600° C. to 750° C. (typically at 700° C.) for a duration of time as short as 5 seconds to 120 seconds (typically for 30 seconds). This allows In to diffuse from the individual ITO layers 10, 20 towards the GaAs layer 30' to thereby form the contact layer 30 (FIG. 1, etc.) composed of In-containing GaAs. While the annealing may be carried out every time the GaAs layer and the ITO layer covering it are formed, the aforementioned single-time annealing effected after all of the ITO layers are formed is more advantageous because the process can be simplified, and also because it can avoid a problem in that the GaAs layer 30' formed earlier will have a larger amount of diffused In possibly accumulated by the successive annealing.

Figure 3:
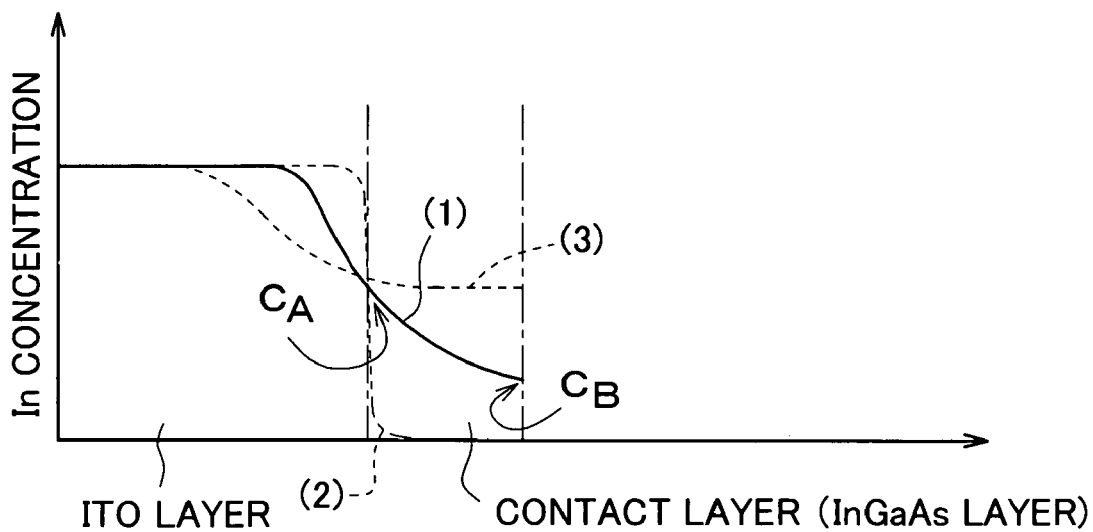
FIG. 3 is a conceptual drawing of an exemplary In concentration profile of the contact layer.
Figure 4:
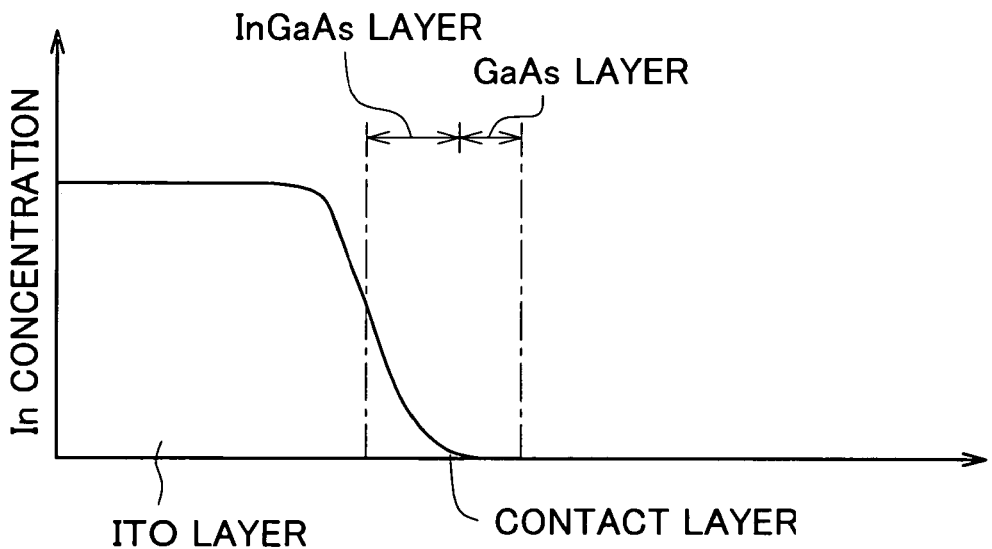
FIG. 4 is a conceptual drawing of a modified example of In concentration profile of the contact layer.

The contact layer 30 has an In concentration profile, as indicated by curve (1) in FIG. 3, in which In concentration, expressed by an atomic ratio of In to a total concentration of In and Ga, of 0.1 to 0.6 in the vicinity of the interface with the ITO transparent electrode layer. The In concentration continuously decreases as receding from the ITO layer in the thickness-wise direction, and is adjusted as having a ratio $C_B/C_A$ of 0.8 or below, where $C_A$ is In concentration in the vicinity of the interface with the ITO layer, and $C_B$ is In concentration in the vicinity of the opposite interface.

The contact layer 30 will have an appropriate In content, not excessive, a desirable uniformity and continuity when formed in such a way that the GaAs layer 30' showing a desirable lattice matching with the light-emitting layer portion 24 composed of AlGaInP or with the p-GaP substrate 8 is first formed, the ITO layer is formed thereon, and annealing is carried out at relatively low temperatures for a relatively short duration of time. This is successful in effectively preventing quality degradation such as lowering in the emission intensity ascribable to the lattice mismatching. Thereafter, the dicing is carried out according to the general practice to thereby obtain semiconductor chips, and each chip is then mounted on a support, wire-bonded with lead wires, and molded with a resin to thereby produce a final product form of the light-emitting device.

The ITO layer 20 finally formed herein is used as an electrode on the back surface side, and use of ITO, a transparent conductive oxide, is advantageous enough to realize light extraction function and current spreading function. Further enhancement in the current spreading function essentially needs reduction in the sheet resistance (or resistivity) of the ITO layer 20, and further enhancement in the light extraction function essentially needs security of a sufficient light transmissivity even if the ITO layer 20 is formed to a large thickness if occasion demands. For an exemplary case where the ITO layer 20 is formed by sputtering, the sheet resistance thereof can be reduced by setting the sputtering voltage to as low as possible. This is because negative ions contained in plasma (mainly oxygen ions) tend to undesirably form insulating InO when impinged at a high speed into the ITO layer under deposition, but the lowered voltage can suppress the formation of InO. The sputtering voltage can preferably be reduced by raising a magnetic field intensity during the sputtering at least to a predetermined level (e.g., 0.8 kG or above, where setting up to 2,000 G is preferable since the voltage reducing effect will saturate thereabove). Reduction in the sheet resistance becomes distinctive when absolute value of the cathode voltage is set to 350 V or below, and more preferably 250 V or below. By setting the magnetic field intensity at 1,000 G or above, for example, it becomes easier to adjust the sputtering voltage to 250 V or below in terms of absolute value of the cathode voltage.

To obtain a uniform and highly transmissible ITO layer, and to bond the light-emitting layer portion with the transparent conductive semiconductor substrate in an easy and tight manner, it is advantageous to make the ITO layer as an amorphous layer having no distinct crystal grain boundary. To obtain an amorphous ITO layer, it is necessary to proceed the film growth at temperatures as low as 200° C. or below so as to prevent crystallization of ITO. In this case, combination with the aforementioned sputtering conditions is effective in terms of obtaining a low-resistivity ITO layer, and in particular, introduction of water vapor (typically at a partial pressure of $3\times10^{-3}$ Pa to $15\times10^{-3}$ Pa) into a sputtering atmosphere is effective in view of obtaining a uniform and low-resistivity ITO layer even under low temperatures. Too low partial pressure of water vapor in the sputtering atmosphere tends to promote micro-crystallization of the resultant ITO layer, and this consequently results in lowering in the light transmissivity and elevation in the sheet resistance, whereas the partial pressure of water vapor kept at a least necessary level can successfully suppress the micro-crystallization. This is successful in realizing the ITO layer having a light transmissivity of 90% or above (more preferably 95% or above) and a resistivity of 1,000 $\mu\Omega\cdot$cm or below (more preferably 800 $\mu\Omega\cdot$cm or below).

To realize a uniform and large emitting efficiency, it is also important for the ITO layer 20 to have a uniform and large current spreading effect. For this purpose, it is necessary to improve the surface smoothness of the ITO layer, besides efforts for improving the uniformity and reducing the resistivity of the ITO layer. Degraded surface smoothness of the ITO layer tends to cause formation of a large number of protrusions to which electric field is readily concentrated, and this makes it more likely to cause local darkness due to non-equalized applied voltage to the light-emitting layer portion 24, or to cause lowering of the emission efficiency per se due to leakage current. To prevent these nonconformities, it is therefore preferable to suppress the surface roughness of the ITO layer specifically to as small as 10 nm (e.g., 4 nm to 7 nm) as being expressed by $R_{max}$ value evaluated in a 0.2-μm square area by three-dimensional topography observed under atomic force microscope (AFM).

To smoothen the surface of the ITO layer, it is effective to polish the surface of the ITO layer after it is formed, where chemical polishing is preferably adopted since mechanical polishing generally costs high. Chemical polishing fluids available for ITO include a mixed solution of hydrochloric acid and nitric acid, and an aqueous oxalic acid solution. The ITO layer causing an advanced degree of the aforementioned micro-crystallization is likely to be etched at the crystal grain boundary, and tends to cause surface roughening due to grain boundary erosion or grain dropping. It is therefore considered that the introduction of water vapor into the sputtering atmosphere in order to obtain a uniform amorphous layer may be an effective technique for reducing the surface roughness of the ITO layer after the chemical polishing.

For instance, to maximize the emission intensity of a large-area, planar type light emitting device (e.g., 300-μm square), it is important to supply current as large as possible to the large-area ITO layer. It can thus be said that adoption of the ITO layer which is smooth, low in the resistivity and high in the light transmissivity is particularly advantageous in view of applying the first invention to the large-area, planar type light emitting device.

While the contact layers 30 on the light-emitting-layer-portion 24 side shown in FIG. 1 can be added with appropriate dopants so as to respectively have the same conductivity types with the cladding layers 6 and 4 in contact therewith, the contact layer 30 having a small thickness as described in the above can also be formed as a low-doped layer having a small dopant concentration (e.g., $10^{17}/cm^3$ or below; or non-doped layer ($10^{13}/cm^3$ to $10^{16}/cm^3$)) without causing any problems because such layer does not excessively increase the series resistance. Moreover, adoption of the low-doped layer can attain the effects as described in the next depending on the operational voltage of the light-emitting device. That is, adoption of the low-doped layer as the contact layer 30 increases the electric resistivity thereof, and raises an electric field (that is, voltage per unit distance) applied in the thickness-wise direction of the contact layer 30 relative to the low-resistivity cladding layer or the ITO layers 10, 20 holding thereof in between. The contact layer 30 herein composed of In-containing GaAs having a relatively small band gap energy is advantageous in view of achieving better ohmic contact, because application of the electric field causes an appropriate bend in the band structure of the contact layer 30. This effect becomes more distinctive by the In concentration of the contact layer 30 raised on the side in contact with the ITO layers 10, 20 as shown in FIG. 3.

Figure 8:
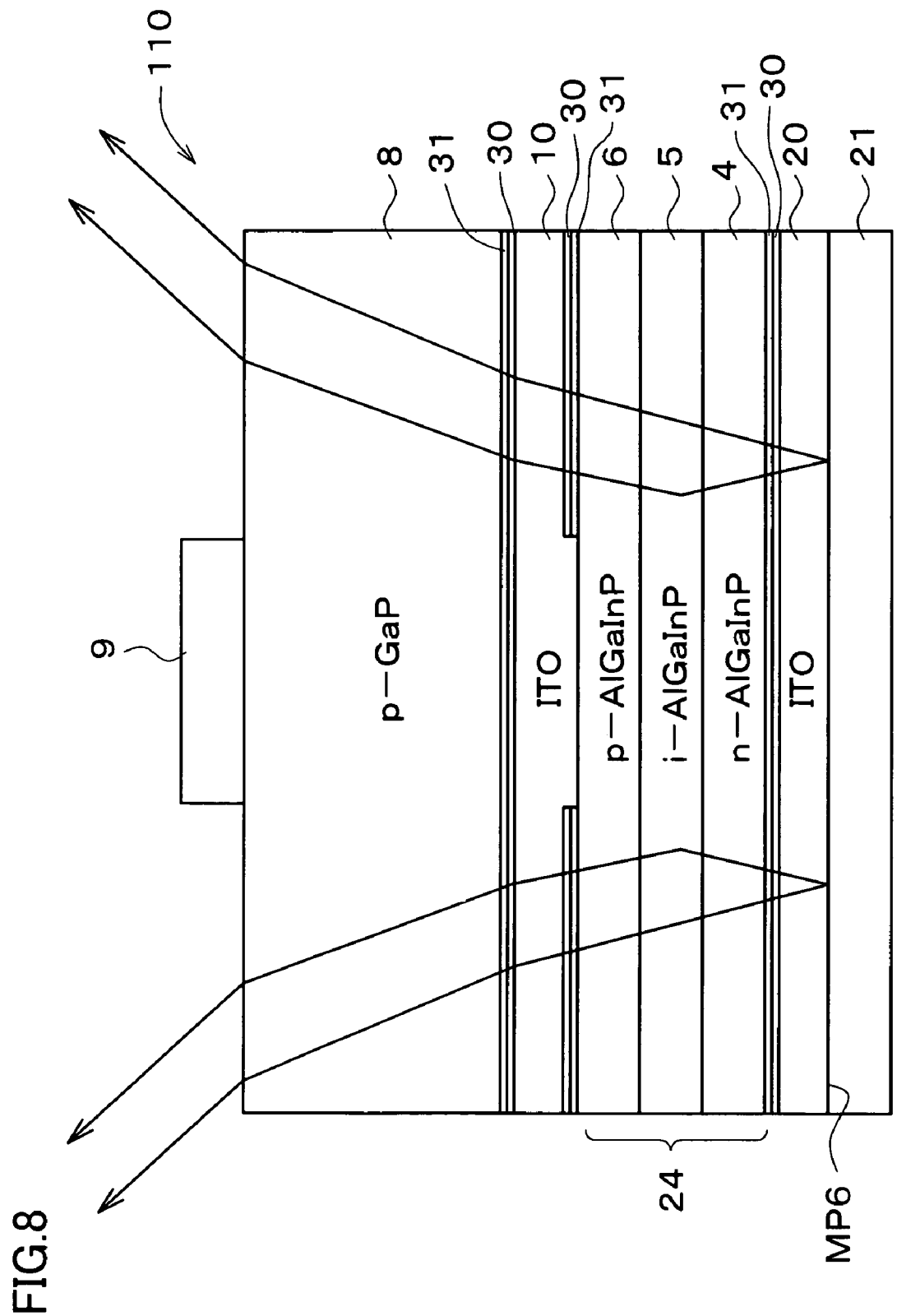
FIG. 8 is a schematic drawing showing a stacked structure of a second embodiment of the light-emitting device according to the first invention.
Figure 9:
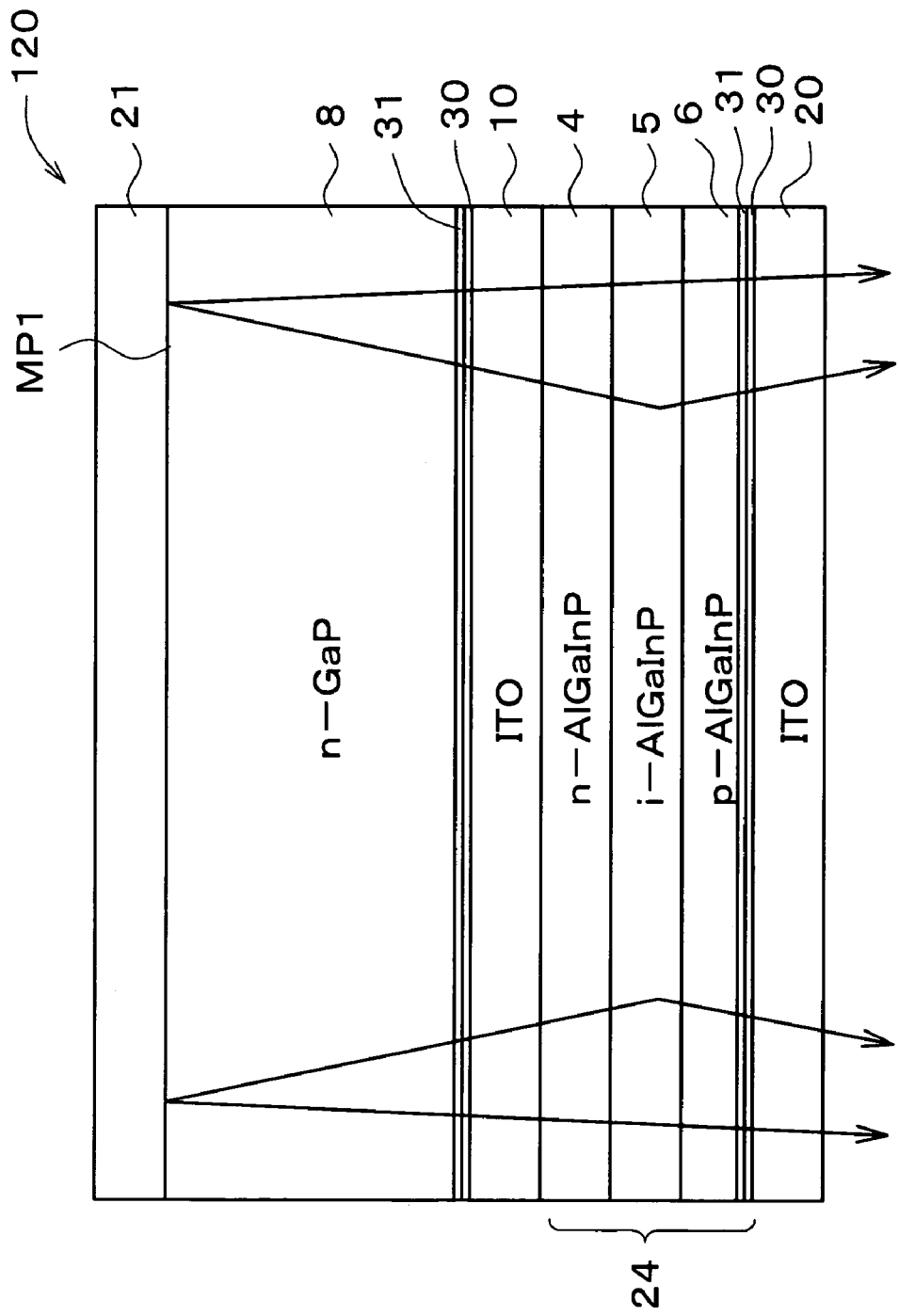
FIG. 9 is a schematic drawing showing a stacked structure of a third embodiment of the light-emitting device according to the first invention.

Referring now to a light-emitting device 110 shown in FIG. 8, it is also allowable to cover a main back surface MP6 of the ITO layer 20 with a metal reflective layer 21 composed of Au or the like. This configuration allows the light emitted backwardly from the light-emitting layer portion 24 to be reflected by the metal reflective layer 21, where the reflected light is superposed to the light emitted from the light-emitting layer portion 24 directly towards the p-GaP single crystal substrate 8 side, to thereby increase the emission intensity on this side to a considerable degree. It is still also allowable, as shown by a light-emitting device 120 in FIG. 9, to cover the entire portion of the main surface MP1 of the p-GaP single crystal substrate 8 with the metal reflective layer 21 which is available also as the electrode, so as to interpose the reflected light caused by the metal reflective layer 21 to the light emitted from the light-emitting layer portion 24 directly towards the main back surface, and to extract thus-obtained light from the ITO layer 20 side.

Figure 10:
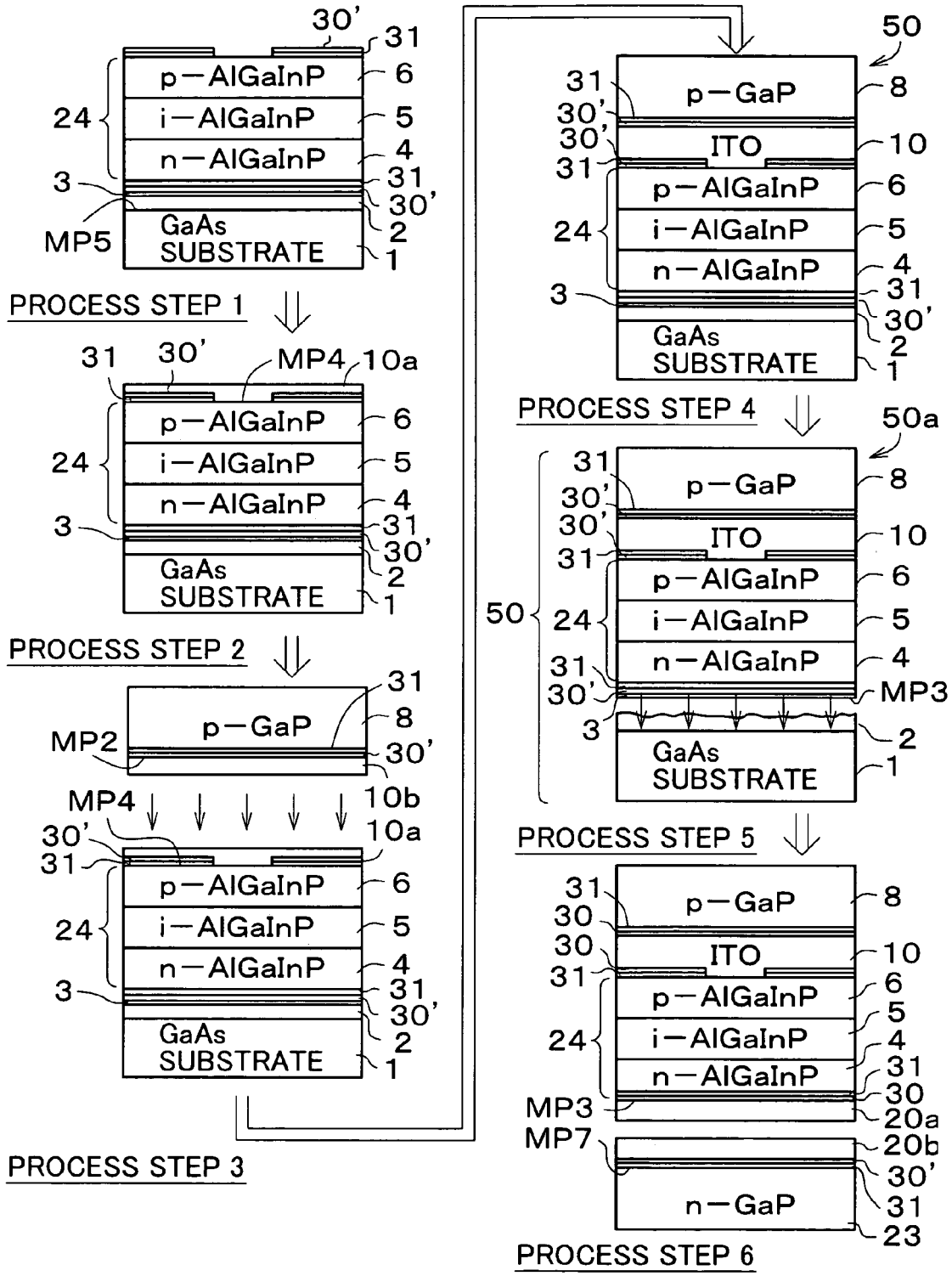
FIG. 10 is a drawing for explaining a first modified example of the process steps for fabrication shown in FIG. 2.
Figure 11:
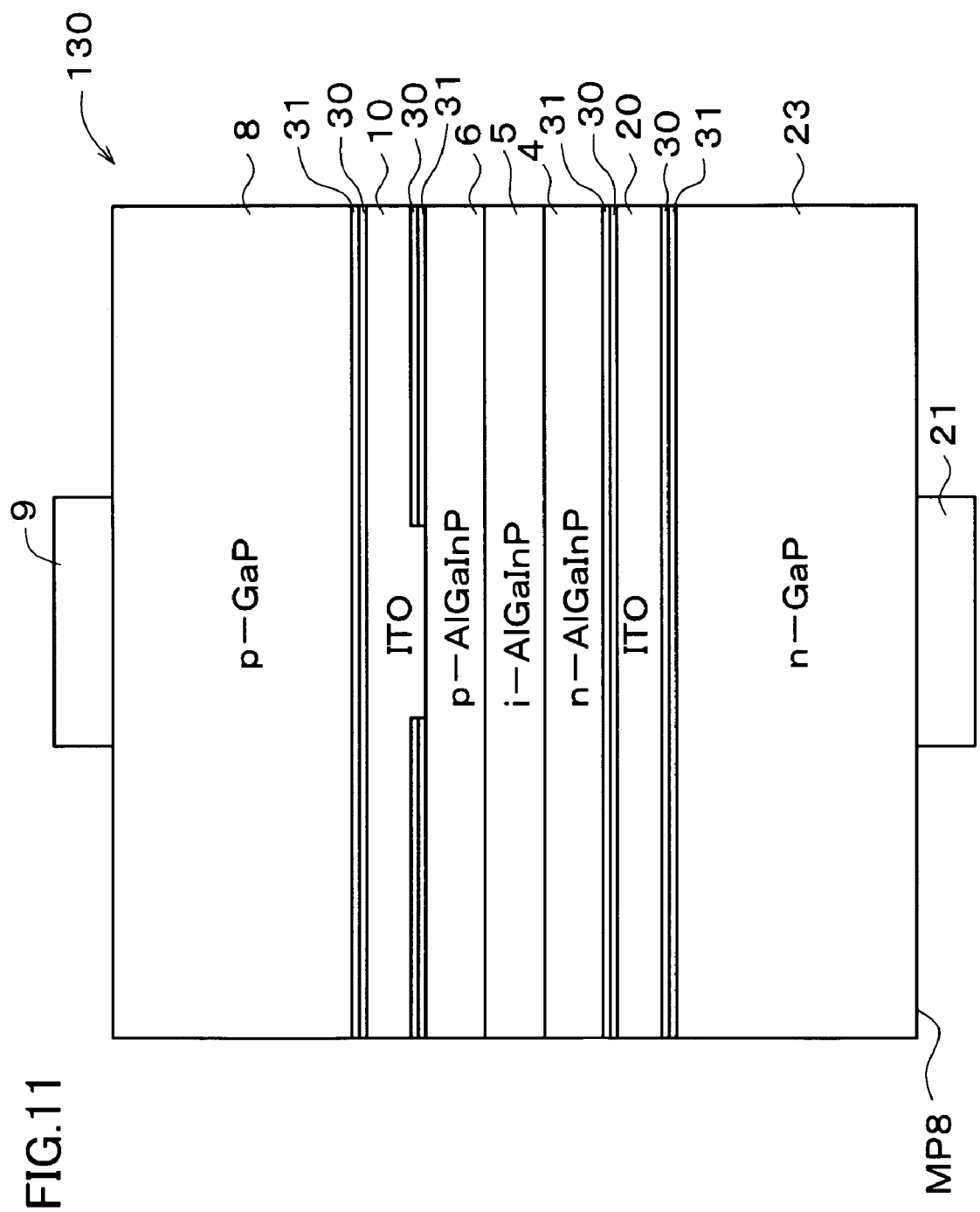
FIG. 11 is a schematic drawing showing a stacked structure of a fourth embodiment of the light-emitting device according to the first invention.

It is also allowable, as shown in FIG. 10, to carry out the process steps 1 to 5 similarly to as shown in FIG. 2, then separate the GaAs substrate 1, and bond a GaP single crystal substrate 23 (n-type in this embodiment), which is the other transparent conductive semiconductor substrate, on the main back surface MP3 side of the light-emitting layer portion 24. More specifically, the ITO layer 20a and the ITO layer 20b are formed on the main back surface MP3 of the light-emitting layer portion 24 and the main surface MP7 of the GaP single crystal substrate 23, respectively, while respectively placing the intermediate layer 31 and the GaAs layer 30' in between, and then bond them similarly to as shown in process steps 3 and 4 by annealing. After bonding, the metal electrode layer 21 is formed on the GaP single crystal substrate 23 typically as shown in FIG. 11, to thereby obtain a light-emitting device 130.

Figure 12:
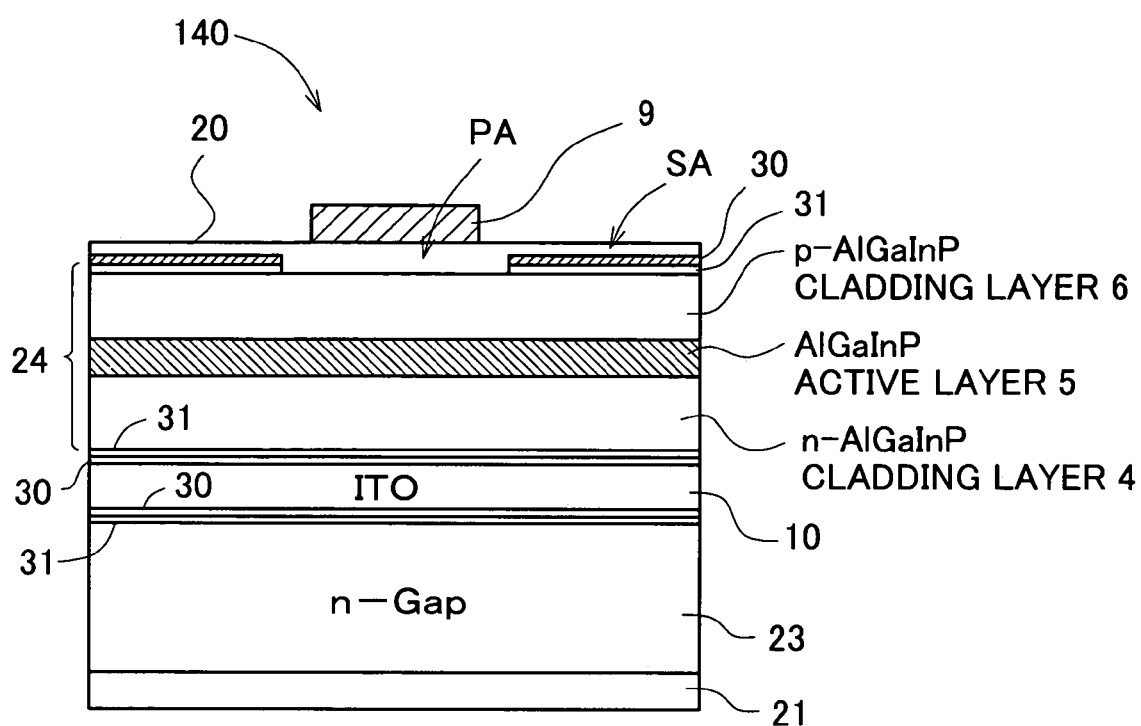
FIG. 12 is a schematic drawing showing a stacked structure of a fifth embodiment of the light-emitting device according to the first invention.

A light-emitting device 140 shown in FIG. 12 is configured so that the light-emitting layer portion 24 is covered, on the main surface thereof opposite to that facing to the transparent conductive semiconductor substrate 23, with the electrode-forming conductive oxide layer 20 also available as the transparent electrode, and the metal electrode 9 is formed so as to cover a part of the electrode-forming conductive oxide layer 20, allowing the area around the metal electrode 9 to serve as the light extraction surface. The transparent conductive semiconductor substrate 23 is composed of the n-GaP single crystal substrate 23, and the electrode-forming conductive oxide layer 20 is composed of the ITO layer 20. The n-GaP single crystal substrate 23 is bonded to the n-type cladding layer 4 side of the light-emitting layer portion 24, similarly to as the light-emitting device 100 shown in FIG. 1, while placing the ITO layer 10 which serves as the substrate-bonding conductive oxide layer (having on both surfaces thereof the contact layers 30 and the intermediate layers 31 formed in this order as viewed from the ITO layer 10 per se) in between. The entire portion of the back surface of the n-GaP single crystal substrate 23 is covered with the metal electrode 21 (e.g., Au electrode) which is also available as the reflective layer. On the other hand, between the ITO layer 20 and the p-type cladding layer 6, the contact layer 30 and the intermediate layer 31 are formed in this order as viewed from the ITO layer 20 side. The contact layer 30 is not formed is not formed in the primary region PA which locates right under the metal electrode 9 and can yield only a less amount of light extraction, and instead selectively formed only in the secondary region SA therearound which can yield a larger amount of light extraction. The composition and thickness of the contact layer 30 and intermediate layer 31 may be similar to those of the contact layer 30 and intermediate layer 31 formed, in the light-emitting device shown in FIG. 1, in contact with the p-type cladding layer 6, and can be patterned similarly to as shown in FIG. 7 (patterning of the intermediate layer 31 is omissible similarly to as in the device shown in FIG. 1).

Figure 13:
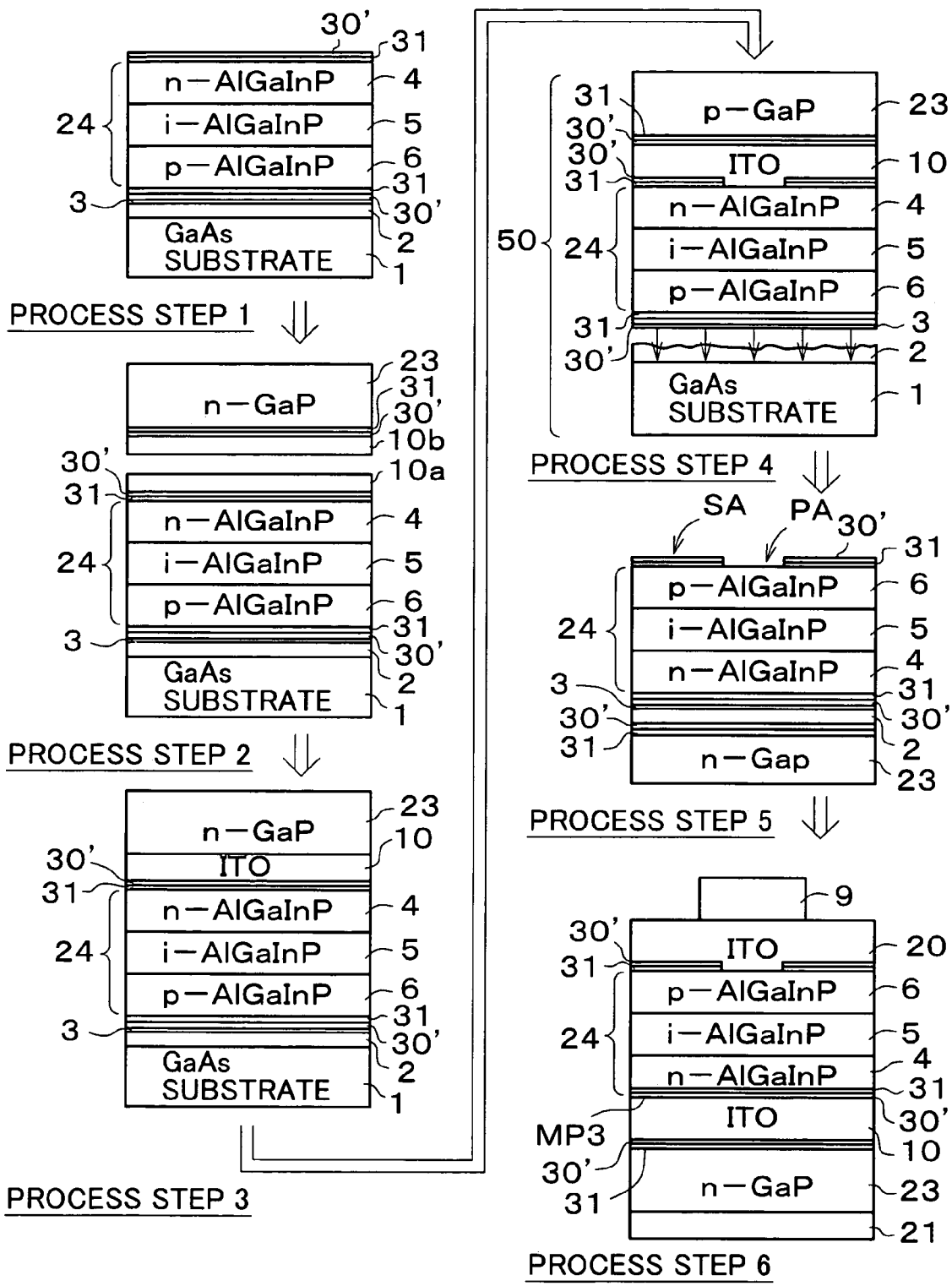
FIG. 13 is a drawing showing exemplary process steps of fabrication of the light-emitting device shown in FIG. 12.

An exemplary method of fabricating this device is shown in FIG. 13 (process steps similar to those shown in FIG. 2 are applicable unless otherwise specifically be noted). The process step 1 is almost similar to the process step 1 shown in FIG. 2, where a p-type GaAs substrate 1 is used, and thereon the p-type cladding layer 6, the active layer 5 and the n-type cladding layer 4, all of which composing the light-emitting layer portion 24, are formed in a reverse order from that shown in FIG. 2. Next in process step 2, on one main surface of the n-GaP single crystal substrate 23, the intermediate layer 31 and the GaAs layer 30' are formed in this order, and further thereon the ITO layer 10b is formed. On the other hand, also on the GaAs layer 30' on the n-type cladding layer 4 side of the light-emitting layer portion 24, the ITO layer 10a is formed. The n-GaP single crystal substrate 23 and the light-emitting layer portion 24 are then stacked and pressed so as to oppose the ITO layers 10b and 10a, and the stack is then bonded by annealing under predetermined conditions (e.g., at 450° C. for 30 minutes) (process step 3). The GaAs substrate 1 is then separated in process step 4, and next in process step 5, the exposed GaAs layer 30' is patterned by photolithography so as to remove the layer selectively in the primary region. Next as shown in process step 6, the ITO layer 20 is formed on thus-patterned GaAs layer 30', and the aforementioned short-term annealing for diffusing In is carried out. The electrodes 9 and 21 are formed thereafter.

Although the individual layers of the light-emitting layer portion 24 in the above-described embodiment were composed of AlGaInP alloy, a wide-gap-type, light-emitting device adapted for blue light emission or ultraviolet emission can be configured if the individual layers (p-type cladding layer 6, active layer 5 and n-type cladding layer 4) are formed using AlGaInN alloy. The light-emitting portion 24 can be formed by the MOVPE process similarly to the case for the light-emitting device 100 shown in FIG. 1. In this case, a sapphire substrate (insulating material), in place of GaAs single crystal substrate, is typically used for the semiconductor single crystal substrate which is the light-emitting-layer-growing substrate on which the light-emitting layer portion 24 is to be grown.

Although the active layer 5 in the aforementioned embodiment was composed of a single layer, this may be configured by a stack of a plurality of compound semiconductor layers having different band gap energies, and more specifically by a stack such as having a quantum well structure. The active layer having a quantum well structure is composed of two types of layers having the alloy compositions adjusted so as to have different band gap energies, that are a well layer having a smaller band gap energy and a barrier layer having a larger one, which layers individually having a thickness not larger than the mean free path of electron (generally equivalent to one atomic layer to several nanometers) are stacked in a lattice-matched manner. Since energy of electron (or hole) in the well layer is quantized in this structure, so that adoption of the structure to semiconductor laser, for example, is advantageous in that the oscillation wavelength can arbitrarily be adjusted by selecting the width or depth of the energy well layer, and in stabilizing the oscillation wavelength, improving the emission efficiency and reducing the oscillation threshold current density. The structure is also advantageous in that the oscillation wavelength can readily be expanded, since the well layer and barrier layer have very small thicknesses, and mismatching of the lattice constants can consequently be allowed up to as much as 2 to 3% or around. The quantum well structure may be either of multi-quantum-well structure having a plurality of quantum well layers, and of single-quantum-well structure having only a single well layer. The thickness of the barrier layer is defined typically as 50 nm or around only for those in contact with the cladding layer, and as 6 nm or around for others. The well layer may be 5 nm thick or around.

(Second Invention)

The following paragraphs will describe embodiments of the second invention referring to the attached drawings.

Figure 14:
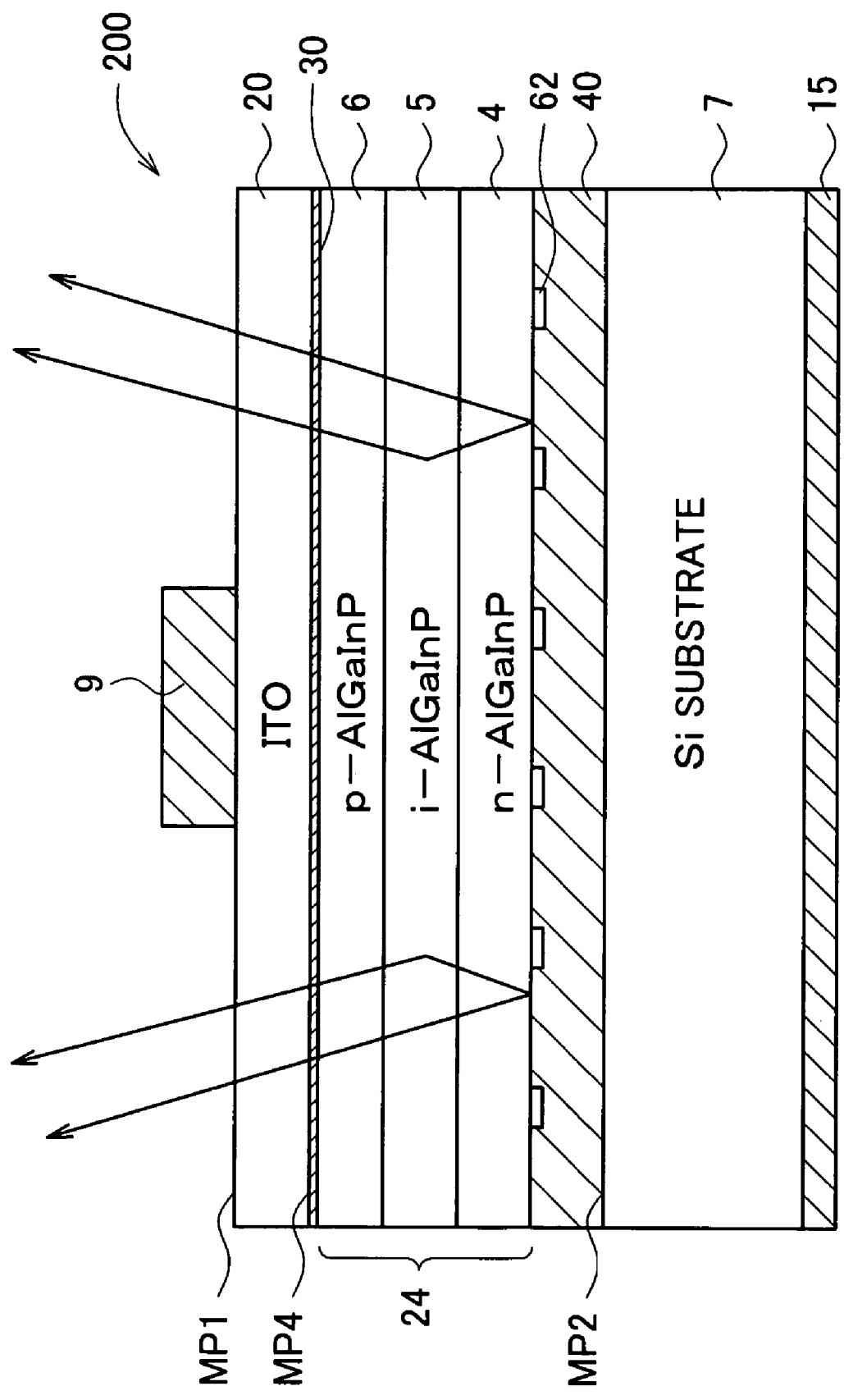
FIG. 14 is a schematic drawing showing a stacked structure of a first embodiment of the light-emitting device according to the second invention.

FIG. 14 is a conceptual drawing of a light-emitting device 200 of one embodiment according to the second invention. The light-emitting device 200 comprises an n-type Si (silicon) single crystal substrate 7 as the conductive semiconductor substrate, and the light-emitting layer portion 24 bonded to the main surface MP2 of the Si single crystal substrate 7, while placing a metal layer 40 composed of Au in between. The entire portion of the main surface MP4 of the light-emitting layer portion 24 is covered with an ITO layer 20 as the transparent oxide electrode. The ITO layer 20 functions as a current-spreading layer and a light extraction layer, and at around the center of the main surface MP1 thereof, a metal electrode (e.g., Au electrode) 9 is formed so as to cover a portion of the main surface MP1. The area around the metal electrode 9 on the main surface MP1 of the ITO layer 20 serves as an extraction area of the light emitted from the light-emitting layer portion 24. On the back surface of the Si single crystal substrate 7, a metal electrode 15 is formed so as to cover the entire portion thereof.

The light-emitting layer portion 24 is configured so that the active layer 5 composed of non-doped $(Al_xGa_{1-x})_yIn_{1-y}P$ (where, $0 \leq x \leq 0.55$, $0.45 \leq y \leq 0.55$) alloy is sandwiched by the p-type cladding layer 6 (first-conductivity-type cladding layer) composed of p-type $(Al_zGa_{1-z})_yIn_{1-y}P$ (where, $x<z \leq 1$) and the n-type cladding layer 4 (second-conductivity-type cladding layer) composed of n-type $(Al_zGa_{1-z})_yIn_{1-y}P$ (where, $x<z \leq 1$), and so as to adjust the emission wavelength from green to red regions (emission wavelength (center wavelength) of 550 nm to 650 nm) depending on the composition of the active layer 5. In the light-emitting device 200 shown in FIG. 14, the p-type AlGaInP cladding layer 6 is disposed on the metal electrode 9 side, and the n-type AlGaInP cladding layer 4 is disposed on the metal layer 40 side. The device thus has positive polarity on the metal electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

The Si single crystal substrate 7 is typically fabricated by slicing and polishing an Si single crystal ingot, and has a thickness typically within a range from 100 μm to 500 μm. The Si single crystal substrate 7 is bonded to the light-emitting layer portion 24 while placing the metal layer 40 in between. The thickness of a metal layer 40 is, for example, 100 nm or above. The thickness not larger than 100 nm may degrade the bonding strength or reflectivity. The upper limit of the thickness of the metal layer 40 is determined considering cost and time for the formation, and typically as 1 μm or around. Between the light-emitting layer portion 24 composed of AlGaInP and the metal layer 40 composed of an Au layer, a metal-layer-bonding layer 62 composed of AuGe is formed, which contributes to reduction in the series resistance of the device.

Between the ITO layer 20 and the light-emitting layer portion 24, the contact layer 30 composed of In-containing GaAs is formed. The contact layer 30 is made as thin as 1 nm to 20 nm (preferably 5 nm to 10 nm) so as to reduce influence of light absorption.

The following paragraphs will describe a method of fabricating the light-emitting device 200 shown in FIG. 14.

Figure 15:
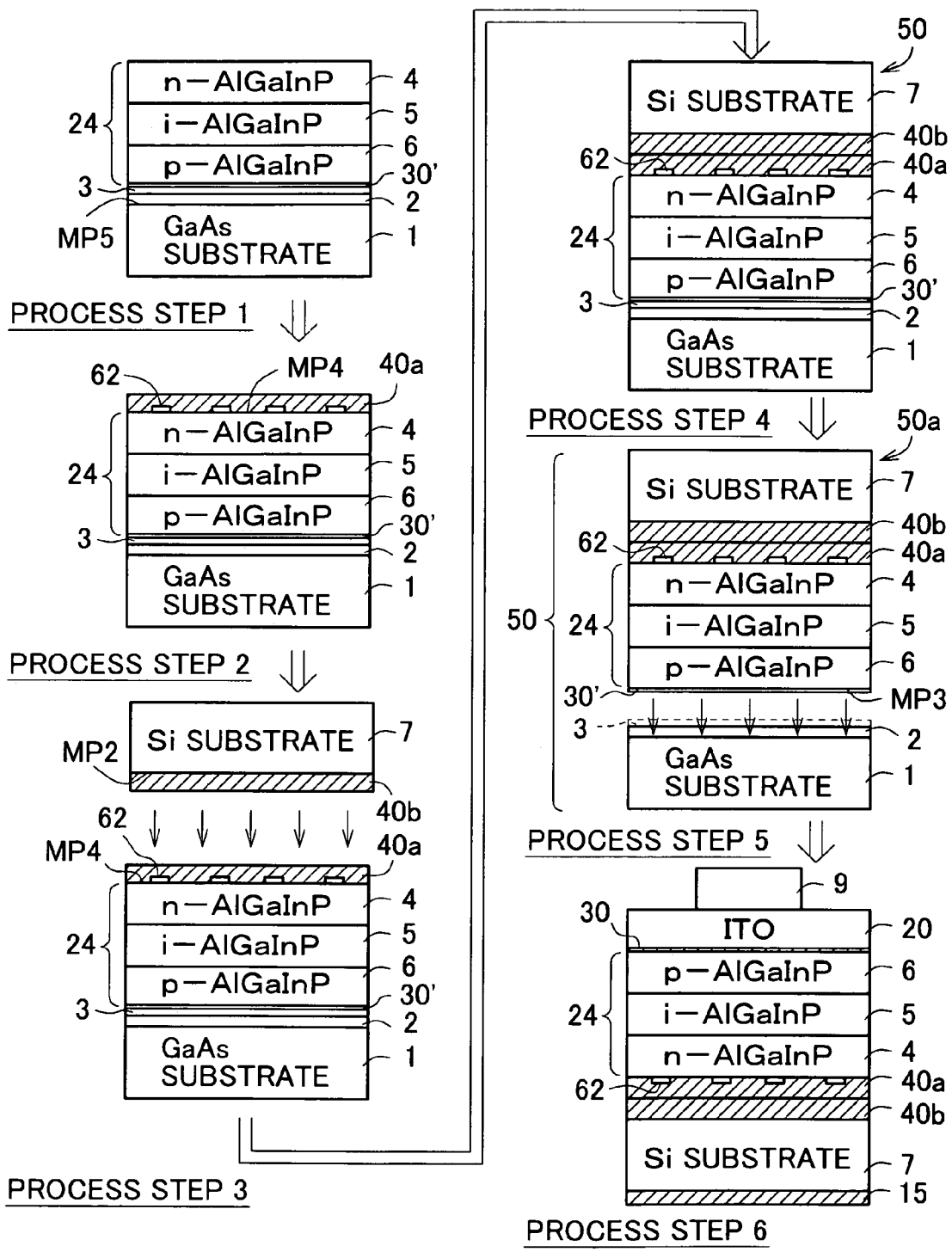
FIG. 15 is a drawing showing process steps of fabrication of the light-emitting device shown in FIG. 14.

First as shown in process step 1 in FIG. 15, on the main surface MP5 of the GaAs single crystal substrate 1 which is a semiconductor single crystal substrate used as the light-emitting-layer-growing substrate, the p-type GaAs buffer layer 2 typically of 0.5 μm thick, and a separating layer 3 composed of AlAs typically of 0.5 μm thick are formed by epitaxial growth. The GaAs layer 30' intended for later becoming the contact layer 30 is then epitaxially grown thereon, and the light-emitting layer portion 24 is formed further thereon by epitaxially growing the p-type AlGaInP cladding layer 6 of 1 μm thick, the (non-doped) AlGaInP active layer 5 of 0.6 μm thick, and the n-type AlGaInP cladding layer 4 of 1 μm thick in this order.

Next as shown in process step 2, the metal-layer-bonding layer 62 composed of AuGe is formed on the main surface MP4 of the light-emitting layer portion 24 in a discrete manner by sputtering, vacuum evaporation or the like. Annealing of the product in this status at 350° C. to 500° C. results in formation of an alloyed layer between the light-emitting layer portion 24 and the metal-layer-bonding layer 62, to thereby successfully reduces the series resistance to a considerable degree. On the other hand, as shown in process step 3, an Al layer 40*b* is formed on the main surface MP2 of the (n-type) Si single crystal substrate 7 separately obtained. The Si single crystal substrate 7 and the light-emitting layer portion 24 are then stacked and pressed so as to oppose the Al layer 40*b* and Au layer 40*a* formed on the light-emitting layer portion 24, and the stack is then annealed under predetermined conditions to thereby obtain the substrate bond 50. The Si single crystal substrate 7 is thus bonded to the light-emitting layer portion 24, while placing the Au layer 40*a* which serves as a reflective layer in between.

The process then advances to process step 5, where the substrate bond 50 is dipped in an etching solution typically comprising a 10% aqueous hydrofluoric acid solution, so as to selectively etch the AlAs separating layer 3 formed between the buffer layer 2 and the light-emitting layer portion 24, to thereby separate the GaAs single crystal substrate 1 (opaque to the light from the light-emitting layer portion 24) from the stack 50*a* which comprises the light-emitting layer portion 24 and the Si single crystal substrate 7 bonded thereto. Another possible process is such that the etching stop layer composed of AlInP is formed in place of the AlAs separating layer 3, the GaAs single crystal substrate 1 is then etched off together with the GaAs buffer layer 2 using a first etching solution (e.g., ammonia/hydrogen peroxide mixed solution) having an etching selectivity to GaAs, and the etching stop layer is then etched off using a second etching solution (e.g., hydrochloric acid, where addition of hydrofluoric acid for removing Al oxide layer also allowable) having an etching selectivity to AlInP. It is to be noted now that also the removal of the entire portion of the light-emitting-layer-growing substrate by etching belongs to a concept of "separation".

Next as shown in process step 6, the ITO layer 20 is formed so as to cover the entire portion of the main back surface MP3 of the GaAs layer 30' exposed after the separation of the GaAs single crystal substrate 1. The GaAs layer 30' is a layer intended for later becoming the contact layer 30, and the thickness thereof is adjusted to 1 nm to 20 nm (preferably 5 nm to 10 nm) so as to reduce influence of light absorption. The contact layer 30 is composed of In-containing GaAs, and can be formed originally as InGaAs layer typically by the MOVPE process, but it is also possible to adopt the production method as described in the next using the GaAs layer 30' considering that this layer is formed in contact with the In-containing ITO layer 20. That is, in the process step 1 in FIG. 15, the GaAs layer 30' is previously formed by the MOVPE process as described in the above prior to the formation of the p-type cladding layer 6, and thereon the ITO layer 20 is formed.

Figure 16:
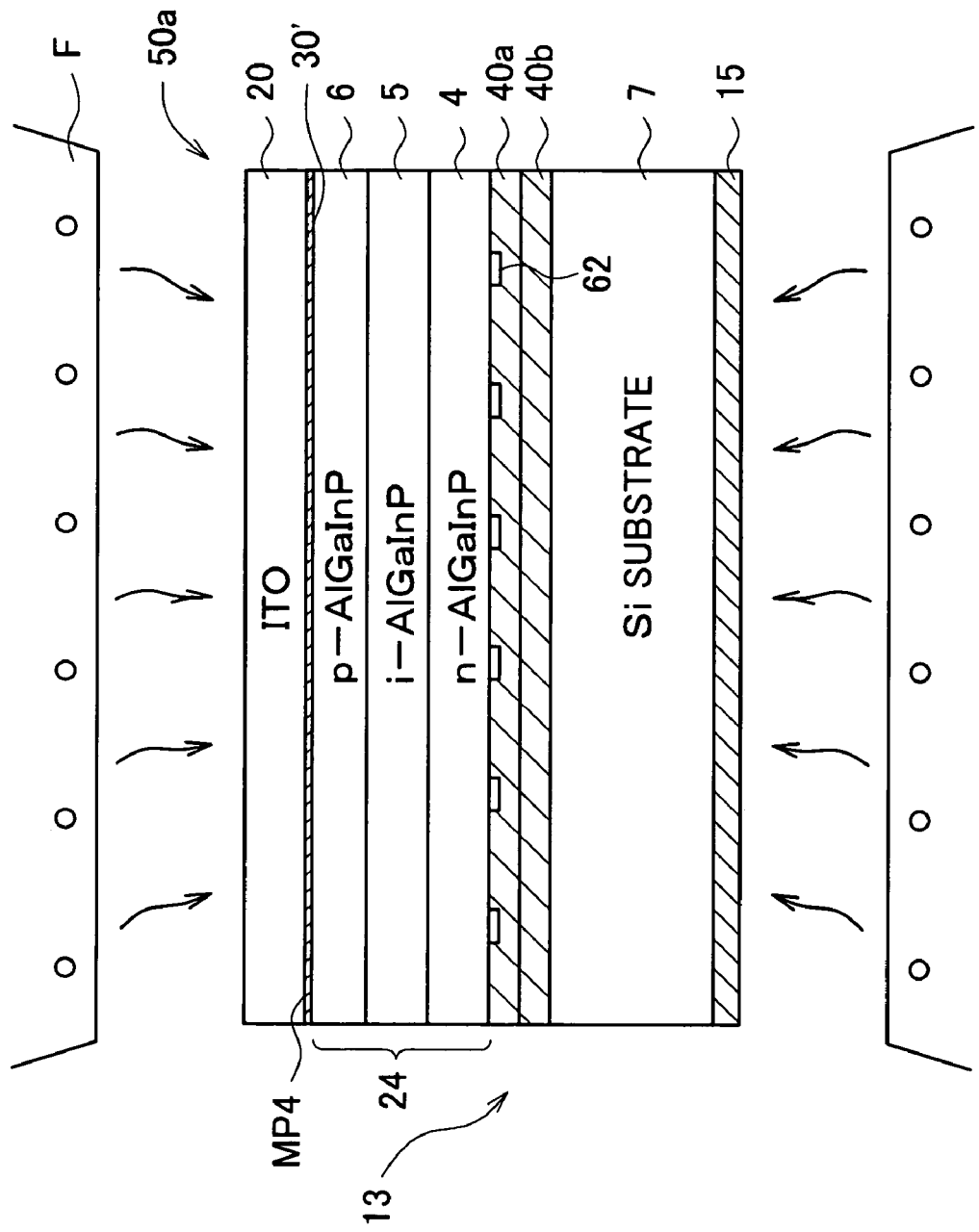
FIG. 16 is a drawing showing process steps as continued from FIG. 15.

Then as shown in FIG. 16, the stacked wafer 50*a* having the ITO layer 20 formed thereon is then disposed in a furnace F, and annealed under an inert gas atmosphere such as containing nitrogen or Ar, at a temperature as low as 600° C. to 750° C. (typically at 700° C.) for a duration of time as short as 5 seconds to 120 seconds (typically for 30 seconds). This allows In to diffuse from the individual ITO layer 20 towards the GaAs layer 30' to thereby form the contact layer 30 (FIG. 14) composed of In-containing GaAs.

Figure 17:
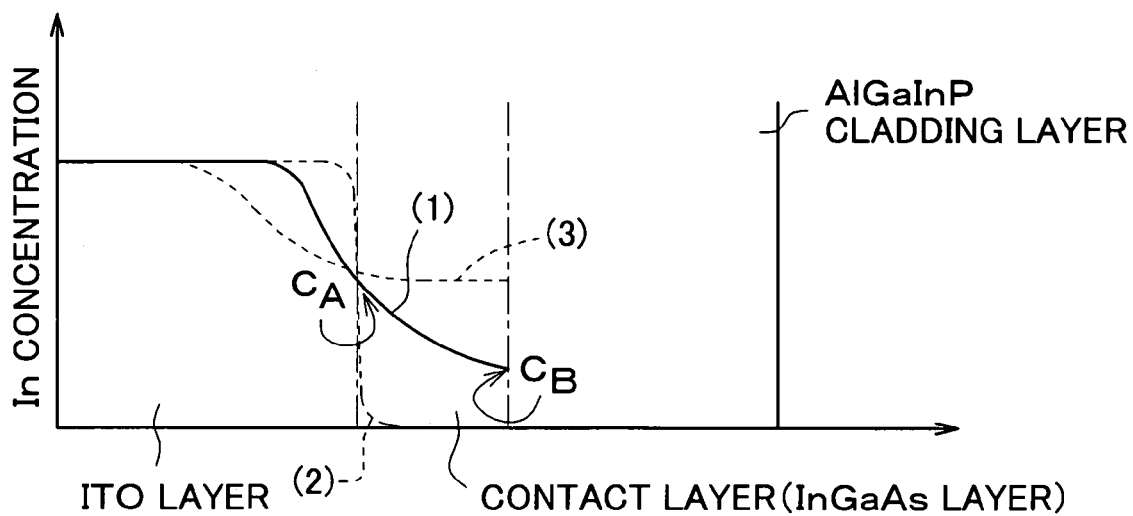
FIG. 17 is a conceptual drawing of an exemplary contact layer.

The contact layer 30 obtained by the annealing has an In concentration profile, as indicated by curve (1) in FIG. 17, in which In concentration, expressed by an atomic ratio of In to a total concentration of In and Ga, of 0.1 to 0.6 in the vicinity of the interface with the ITO layer. The In concentration continuously decreases as receding from the ITO layer in the thickness-wise direction, and is adjusted as having a ratio $C_B/C_A$ of 0.8 or below, where $C_A$ is In concentration in the vicinity of the interface with the ITO layer, and $C_B$ is In concentration in the vicinity of the opposite interface.

The contact layer 30 will have an appropriate In content, not excessive, a desirable uniformity and continuity when formed in such a way that the GaAs layer 30' showing a desirable lattice matching with the light-emitting layer portion 24 composed of AlGaInP is first formed, and annealing is carried out at relatively low temperatures for a relatively short duration of time. This is successful in effectively preventing quality degradation such as lowering in the emission intensity ascribable to the lattice mismatching with the light-emitting layer portion 24.

Figure 18:
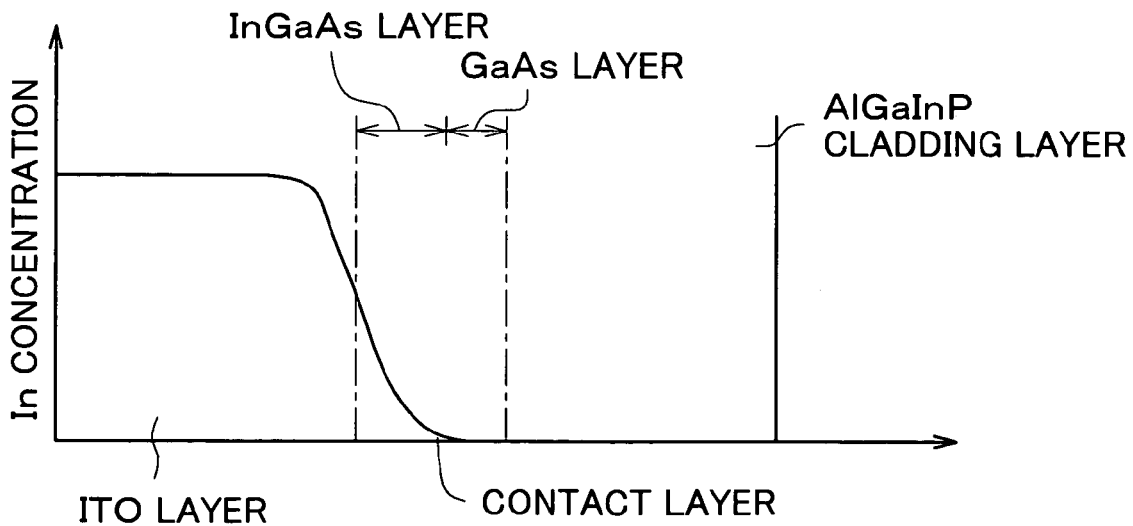
FIG. 18 is a conceptual drawing of a modified example of the contact layer.

While the contact layer 30 can be added with appropriate dopants so as to have the same conductivity type with the cladding layers 6 in contact therewith, the contact layer 30 having a small thickness as described in the above can also be formed as a low-doped layer having a small dopant concentration (e.g., $10^{17}/cm^3$ or below; or non-doped layer ($10^{13}/cm^3$ to $10^{16}/cm^3$)) without causing any problems because such layer does not excessively increase the series resistance. Moreover, adoption of the low-doped layer can attain the effects as described in the next depending on the operational voltage of the light-emitting device. That is, adoption of the low-doped layer as the contact layer 30 increases the electric resistivity thereof, and raises an electric field (that is, voltage per unit distance) applied in the thickness-wise direction of the contact layer 30 relative to the low-resistivity cladding layer or the ITO layer 20 holding thereof in between. The contact layer 30 herein composed of In-containing GaAs having a relatively small band gap energy is advantageous in view of achieving better ohmic contact, because application of the electric field causes an appropriate bend in the band structure of the contact layer 30. This effect becomes more distinctive by the In concentration of the contact layer 30 raised on the side in contact with the ITO layer 20 as shown in FIG. 18.

After the contact layer 30 and the ITO layer 20 are thus formed, the electrode 9 for wire bonding (bonding pad: FIG. 14), composed of Au or the like, is formed on the ITO layer 20. Also on the back surface of the Si single crystal substrate 7, the metal electrode 15 is formed. Thereafter, the dicing is carried out according to the general practice to thereby obtain semiconductor chips, and each chip is then mounted on a support, wire-bonded with lead wires, and molded with a resin to thereby produce a final product form of the light-emitting device.

Figure 19:
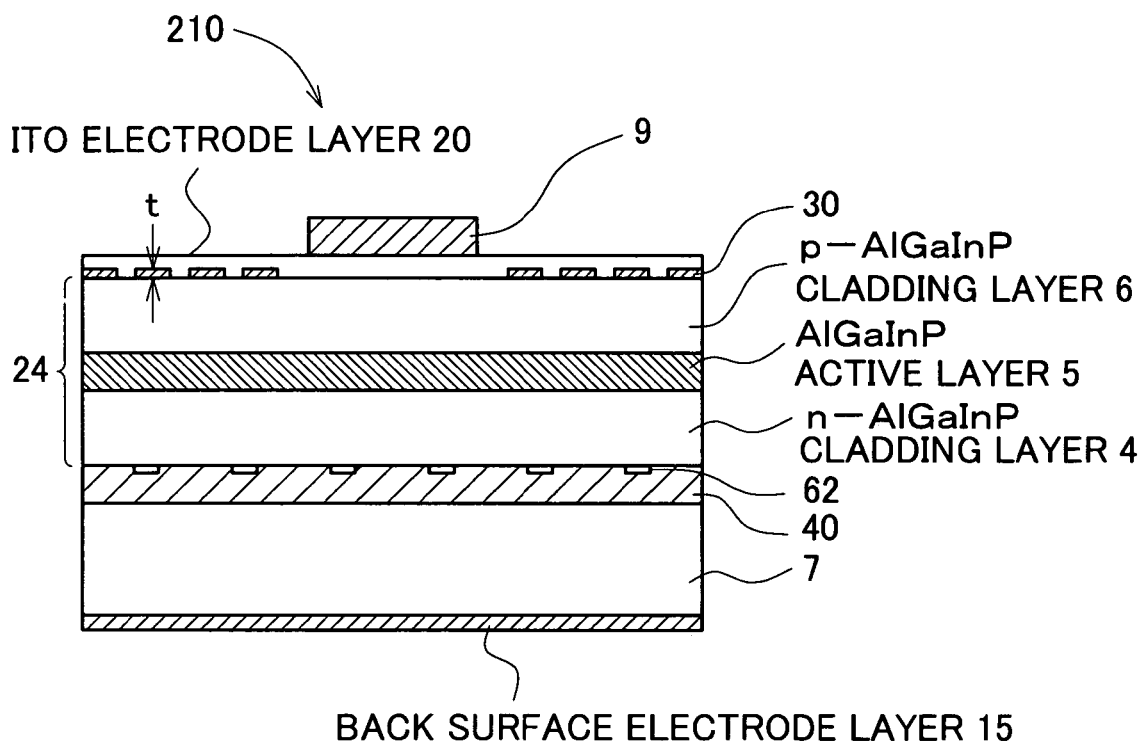
FIG. 19 is a schematic drawing showing a stacked structure of a second embodiment of the light-emitting device according to the second invention.

It is also allowable that the contact layer 30 is, as shown in FIG. 19, not formed in the primary region which locates right under the metal electrode 9 (bonding pad: FIG. 14) and can yield only a less amount of light extraction, and instead selectively formed only in a secondary region therearound which can yield a larger amount of light extraction. In an exemplary case shown in FIG. 19, the formation areas and non-formation areas of the contact layer 30 are interlaced in the secondary region. The ITO transparent electrode layer 20 in the non-formation area of the contact layer 30 is thus brought into direct contact with the light-emitting layer portion 24.

Figure 5:
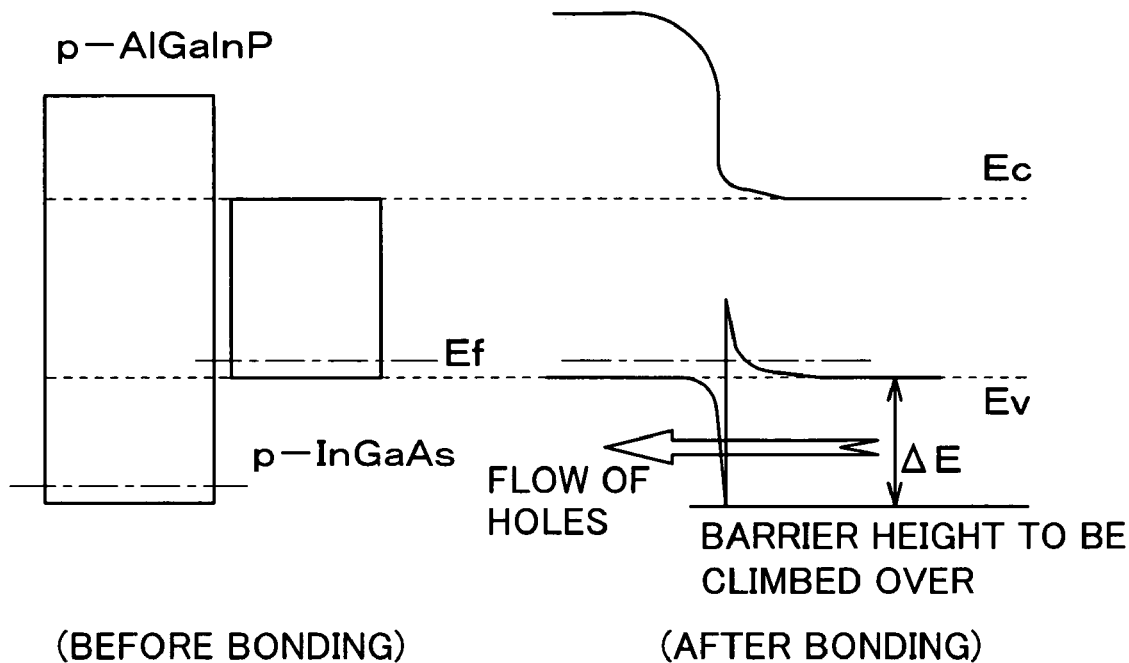
FIG. 5 is a schematic drawing of an exemplary band structure of the contact layer in the absence of the intermediate layer.
Figure 6:
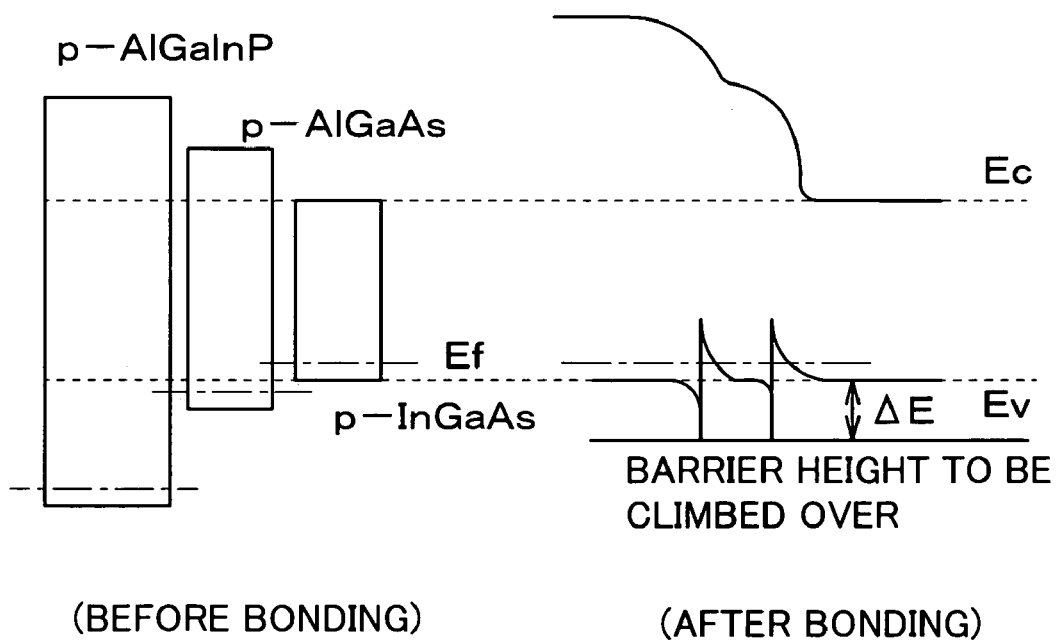
FIG. 6 is a schematic drawing of an exemplary band structure of the contact layer in the presence of the intermediate layer.
Figure 20:
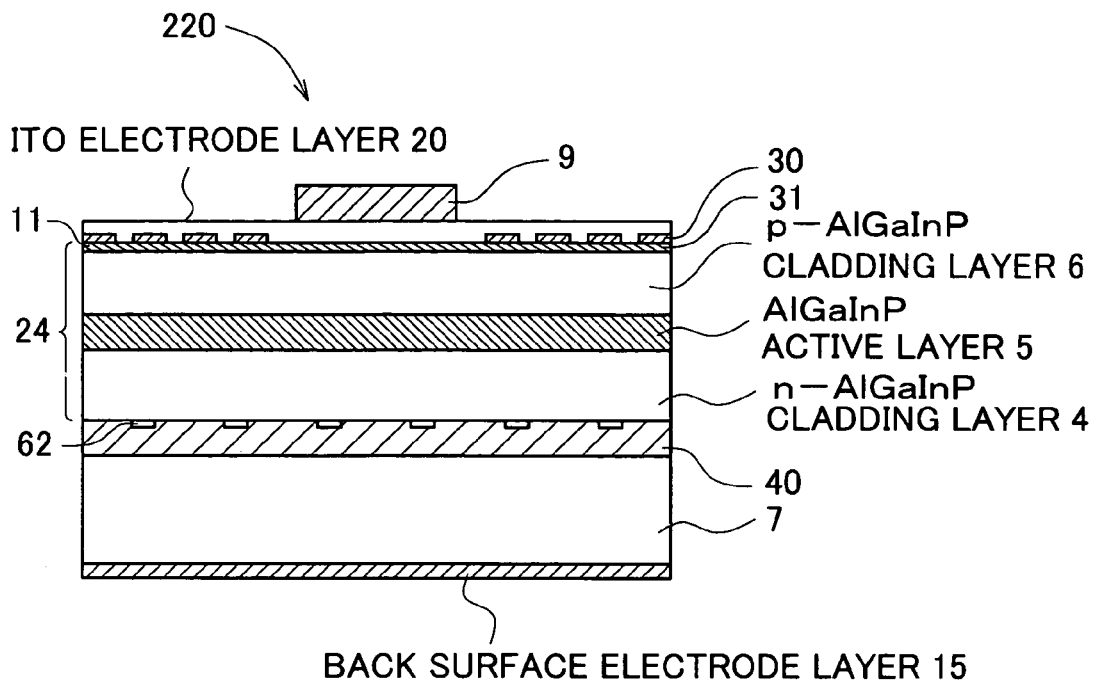
FIG. 20 is a schematic drawing showing a stacked structure of a third embodiment of the light-emitting device according to the second invention.
Figure 21:
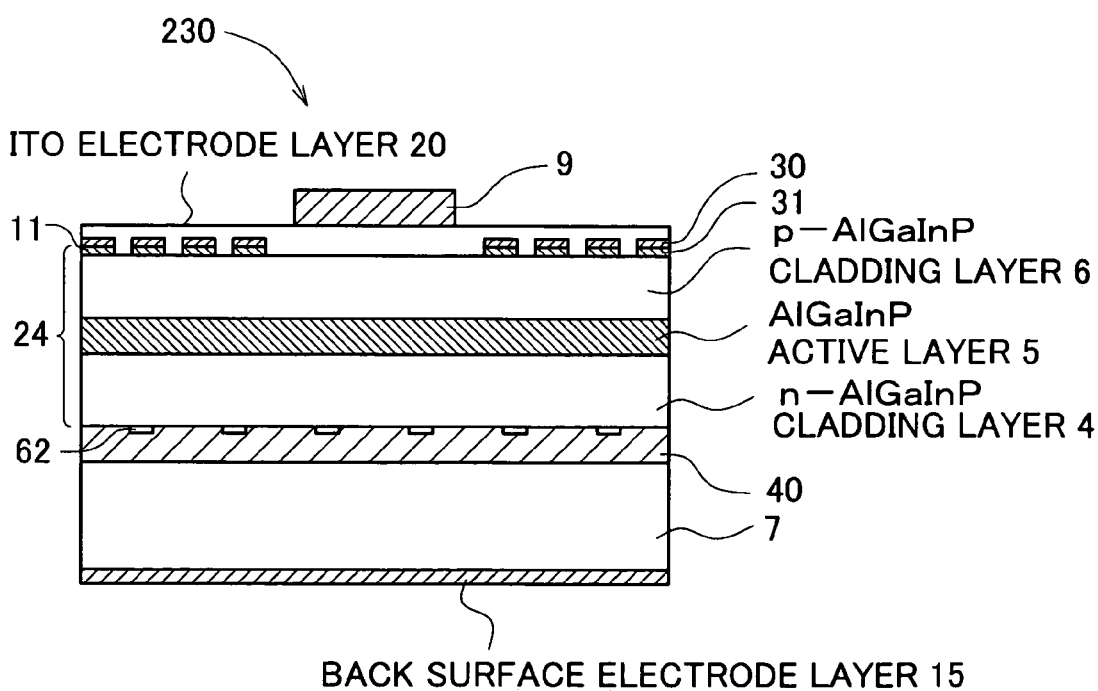
FIG. 21 is a schematic drawing showing a stacked structure of a fourth embodiment of the light-emitting device according to the second invention.

A problem may arise now in that the direct contact of the contact layer 30 with the light-emitting layer portion 24 results in a formation of a slightly higher hetero-barrier at the junction interface as shown in FIG. 5, and this is causative of increase in the series resistance component. To reduce this effect, it is allowable to interpose the intermediate layer 31 between the contact layer 30 in contact with the ITO layer 20 and the AlGaInP cladding layer 6 as shown in FIGS. 20 and 21, where the intermediate layer 31 having a band gap energy intermediate between those of the both. The intermediate layer 31 can be configured so as to contain at least any one of AlGaAs layer, GaInP layer and AlGaInP layer, and for example the entire portion thereof can be composed of a single AlGaAs layer. Because the thickness of the intermediate layer can be adjusted as thin as approximately 0.1 μm or below (but 0.01 μm or above: where thickness smaller than this value will ruin the bulk band structure, and will make it impossible to obtain a desired junction structure), this structure is successful enough in shortening the epitaxial growth time and improving the productivity by the merit of the thinning, so that the device will have only a small increase in the series resistance due to formation of the intermediate layer, and is less likely to lower the emission efficiency. In particular for the case where the contact layer 30 is formed only on a part of the ITO layer 20 formed on the light-extraction-surface side, current density during current supply for the light emission tends to increase selectively in the formation area of the contact layer 30. If a hetero-barrier formed between the contact layer 30 and the AlGaInP cladding layer 6 is undesirably high, a larger voltage drop will occur when the carrier passes through the junction interface between the contact layer 30 and the AlGaInP cladding layer 6 while being affected by the current concentration, and this undesirably tends to increase the apparent series contact. It can thus be concluded that more distinct effect of suppressing the series resistance can be achieved by lowering of the hetero-barrier height through formation of the intermediate layer 31, rather than by formation of the contact layer 30 over the entire surface of the ITO layer 20.

For the case where the intermediate layer 31 is less likely to adversely affect the light absorption, for example when it is formed to a very small thickness, the layer can be formed so as to cover the entire surface of the light-emitting layer portion 24 as shown in FIG. 20. This configuration needs patterning of the contact layer 30 only, and can thus facilitate the fabrication even for the case where the intermediate layer 31 cannot thoroughly be etched by etchant for the contact layer 30 in chemical etching. On the other hand, it is of course possible to form the intermediate layer 31 only in the formation area for the contact layer 30 as shown in FIG. 21, and this is advantageous in further reducing the influence of light absorption by the intermediate layer 31. In this case, a convenient process is such as forming both of the contact layer 30 and the intermediate layer 31 so as to cover the entire surface of the light-emitting layer portion 24, and then respectively patterning these layers by the aforementioned photolithography. In this patterning, the contact layer 30 and the intermediate layer 31 may concomitantly be etched by vapor-phase etching, or may sequentially be etched by chemical etching while exchanging the etchants between both layers. In some cases where the contact layer 30 is patterned by chemical etching, the intermediate layer 31 is available as an etching stop layer for stopping progress of the etching into the light-emitting layer portion 24. In an exemplary case where the contact layer 30 is composed of In-containing GaAs, the contact layer 30 can selectively be etched by using ammonia/hydrogen peroxide as etchant while using the intermediate layer 31 as the etching stop layer by composing the intermediate layer 31 with AlGaAs.

The ITO layer 20 is composed of ITO, a transparent conductive oxide, and acts as a transparent electrode which reconciles the light extraction function and current-spreading function. Further enhancement in the current spreading function essentially needs reduction in the sheet resistance (or resistivity) of the ITO layer 20, and further enhancement in the light extraction function essentially needs security of a sufficient light transmissivity even if the ITO layer 20 is formed to a large thickness if occasion demands.

Figure 22:
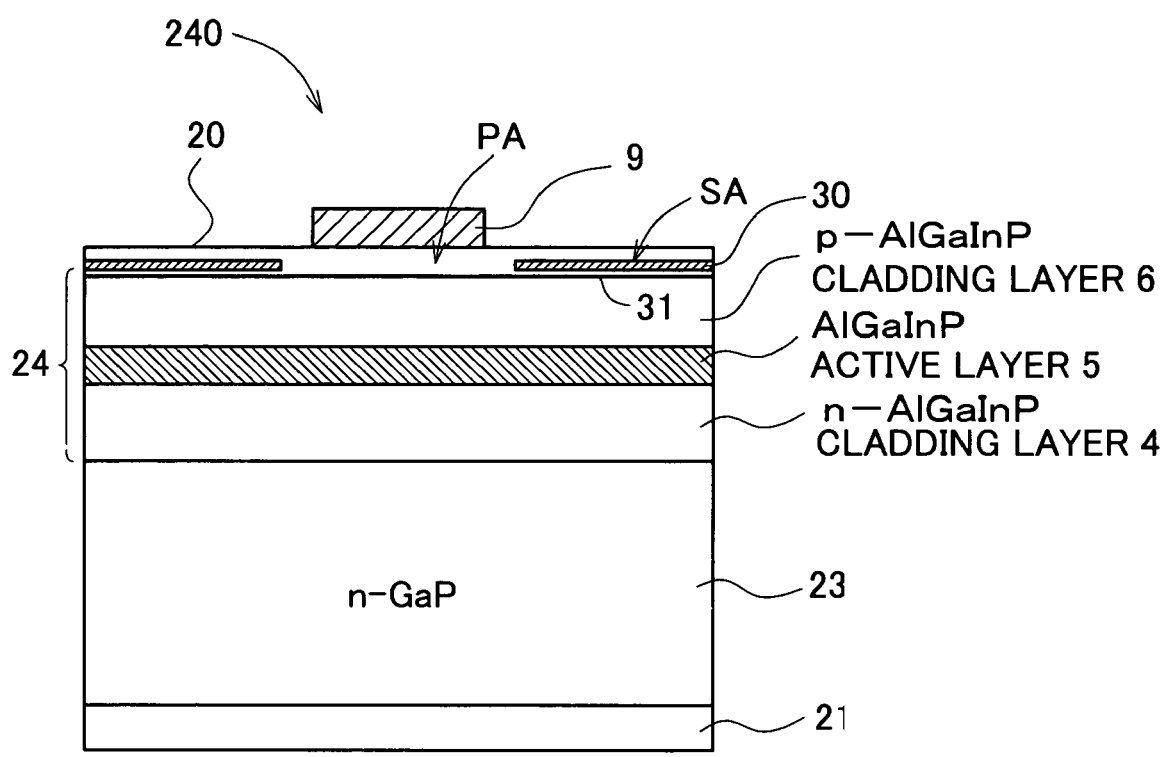
FIG. 22 is a schematic drawing showing a stacked structure of a fifth embodiment of the light-emitting device according to the second invention.

A light-emitting device 240 shown in FIG. 22 is configured so that the light-emitting layer portion 24 is bonded with the transparent conductive semiconductor substrate 23 on one main surface thereof, and is covered with the transparent conductive oxide layer 20 also available as the transparent electrode layer on the opposite main surface thereof. The metal electrode 9 is formed so as to cover a part of the transparent conductive oxide layer 20, allowing the area around the metal electrode 9 to serve as the light extraction surface. The transparent conductive semiconductor substrate 23 is typically composed of the n-GaP single crystal substrate 23, and the transparent conductive oxide layer 20 is composed of the ITO layer 20. The n-GaP single crystal substrate 23 is bonded to the n-type cladding layer 4 side of the light-emitting layer portion 24. The entire portion of the back surface of the n-GaP single crystal substrate 23 is covered with the metal electrode 21 (e.g., Au electrode), which is also available as the reflective layer. On the other hand, between the ITO layer 20 and the p-type cladding layer 6, the contact layer 30 and the intermediate layer 31 are formed in this order as viewed from the ITO layer 20 side. The contact layer 30 is not formed in the primary region PA which locates right under the metal electrode 9 and can yield only a less amount of light extraction, and instead selectively formed only in the secondary region SA therearound which can yield a larger amount of light extraction. The composition and thickness of the contact layer 30 and intermediate layer 31 may be similar to those of the contact layer 30 and intermediate layer 31 formed, in the light-emitting device shown in FIGS. 14, 20 and 21, in contact with the p-type cladding layer 6, and can be patterned similarly to as shown in FIGS. 20 and 21.

Figure 23:
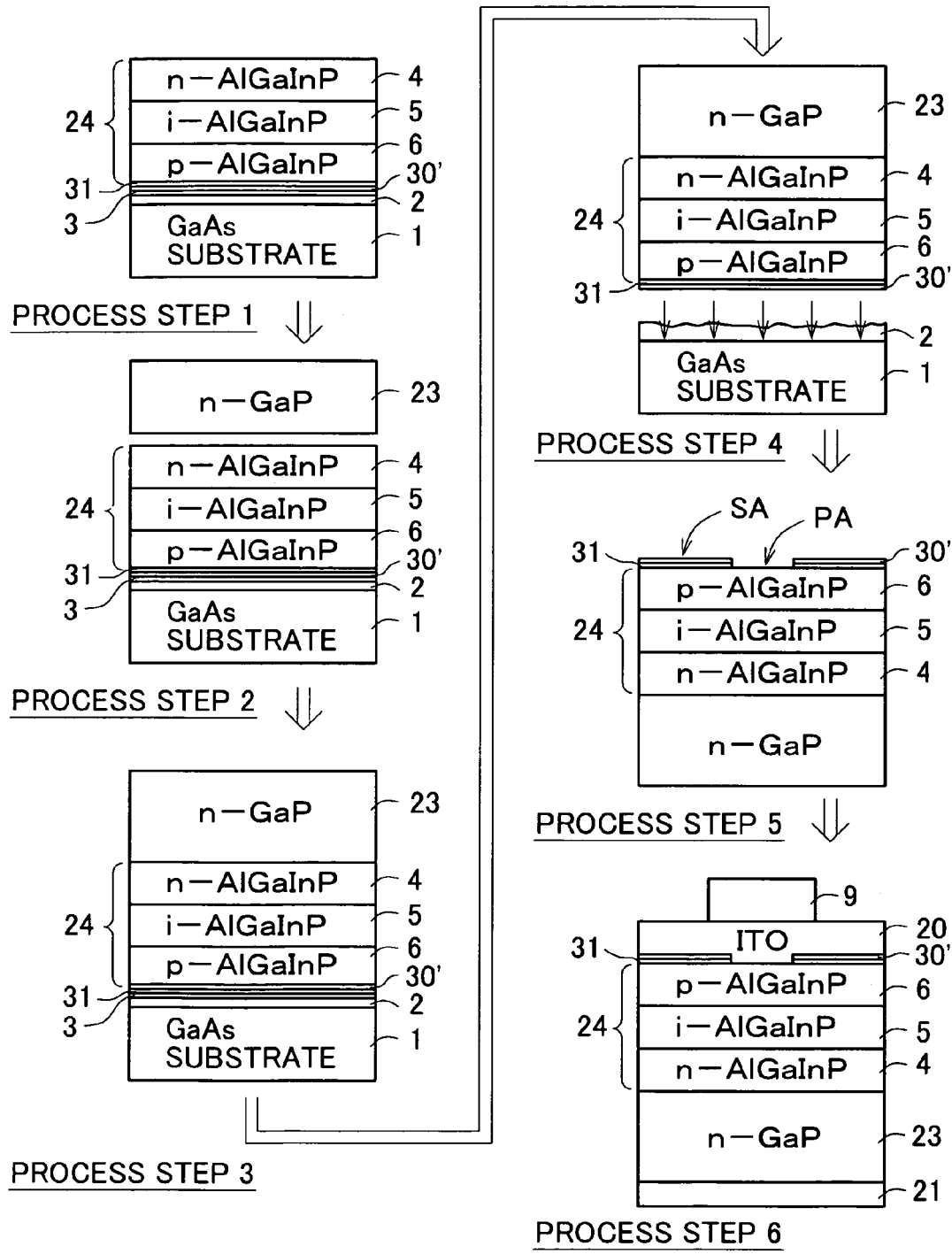
FIG. 23 is a drawing showing exemplary process steps of fabrication of the light-emitting device shown in FIG. 22.

An exemplary method of fabricating this device is shown in FIG. 23 (process steps similar to those shown in FIG. 15 are applicable unless otherwise specifically be noted). The process step 1 is the same with the process step 1 shown in FIG. 15. Next in process step 2, the n-GaP single crystal substrate 23 is obtained and stacked on the light-emitting layer portion 24, the stack is then pressed and annealed under predetermined conditions (process step 3). The GaAs substrate 1 is then separated in process step 4, and next in process step 5, the exposed GaAs layer 30' is patterned by photolithography so as to remove the layer selectively in the primary region. Next as shown in process step 6, the ITO layer 20 is formed on thus-patterned GaAs layer 30', and the aforementioned short-term annealing for diffusing In is carried out. The electrodes 9 and 21 are formed thereafter.

Although the individual layers of the light-emitting layer portion 24 in the above-described embodiment were composed of AlGaInP alloy, a wide-gap-type, light-emitting device adapted for blue light emission or ultraviolet emission can be configured if the individual layers (p-type cladding layer 6, active layer 5 and n-type cladding layer 4) are formed using AlGaInN alloy. The light-emitting portion 24 can be formed by the MOVPE process similarly to the case for the light-emitting device 200 shown in FIG. 14. In this case, a sapphire substrate (insulating material), in place of GaAs single crystal substrate, is typically used for the semiconductor single crystal substrate which is the light-emitting-layer-growing substrate on which the light-emitting layer portion 24 is to be grown.

Although the active layer 5 in the aforementioned embodiment was composed of a single layer, this may be configured by a stack of a plurality of compound semiconductor layers having different band gap energies, and more specifically by a stack such as having a quantum well structure. The active layer having a quantum well structure is composed of two types of layers having the alloy compositions adjusted so as to have different band gap energies, that are a well layer having a smaller band gap energy and a barrier layer having a larger one, which layers individually having a thickness not larger than the mean free path of electron (generally equivalent to one atomic layer to several nanometers) are stacked in a lattice-matched manner. Since energy of electron (or hole) in the well layer is quantized in this structure, so that adoption of the structure to semiconductor laser, for example, is advantageous in that the oscillation wavelength can arbitrarily be adjusted by selecting the width or depth of the energy well layer, and in stabilizing the oscillation wavelength, improving the emission efficiency and reducing the oscillation threshold current density. The structure is also advantageous in that the oscillation wavelength can readily be expanded, since the well layer and barrier layer have very small thicknesses, and mismatching of the lattice constants can consequently be allowed up to as much as 2 to 3% or around. The quantum well structure may be either of multi-quantum-well structure having a plurality of quantum well layers, and of single-quantum-well structure having only a single well layer. The thickness of the barrier layer is defined typically as 50 nm or around only for those in contact with the cladding layer, and as 6 nm or around for others. The well layer may be 5 nm thick or around.

(Third Invention)

The following paragraphs will describe embodiments of the third invention referring to the attached drawings.

Figure 24:
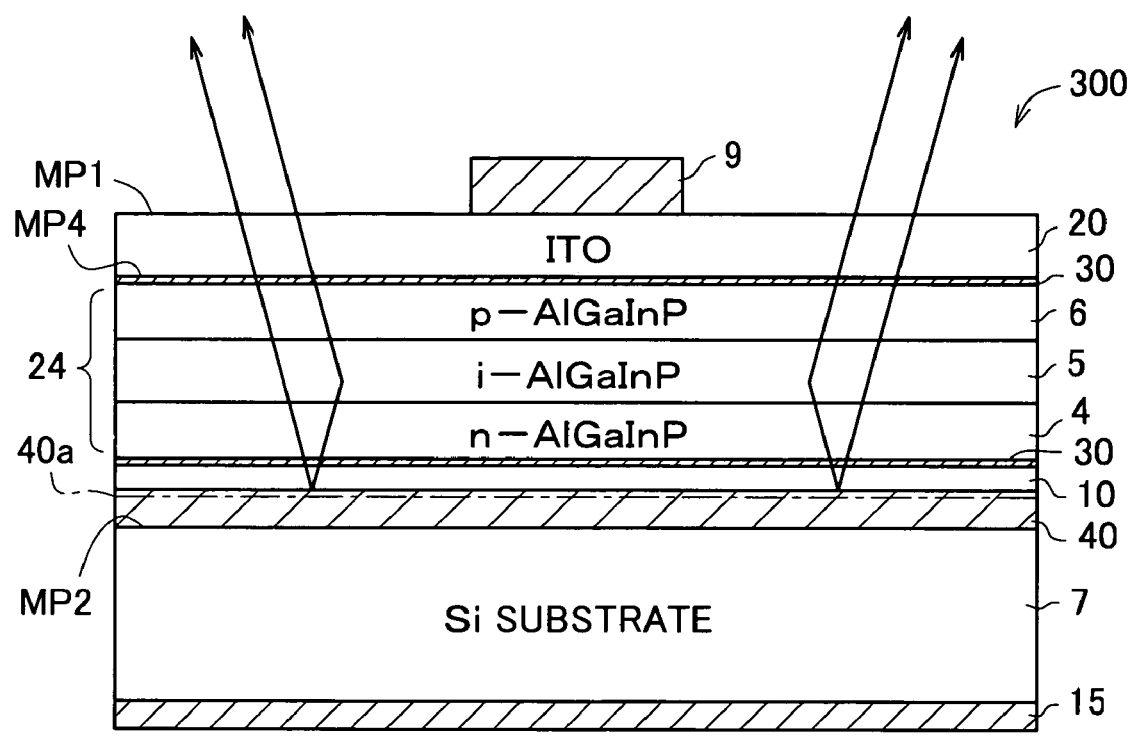
FIG. 24 is a schematic drawing showing a stacked structure of a first embodiment of the light-emitting device according to the third invention.

FIG. 24 is a conceptual drawing of a light-emitting device 300 of one embodiment according to the third invention. The light-emitting device 300 comprises an n-type Si (silicon) single crystal substrate 7 as the conductive semiconductor substrate, and the light-emitting layer portion 24 bonded to the main surface MP2 thereof, while placing an Au layer (metal layer: Au-base metal layer) 40 on the n-type Si single crystal substrate 7 side and the ITO layer (bonding-use transparent conductive oxide layer) 10 in contact therewith on the light-emitting layer side 24 in between. The entire portion of the main surface MP4 of the light-emitting layer portion 24 is covered with an ITO layer (electrode-forming transparent conductive oxide layer) 20 which serves as the light-extraction-surface-side electrode The ITO layer 20 also functions as a current-spreading layer and a light extraction layer, and at around the center of the main surface MP1 thereof, the metal electrode (e.g., Au electrode) 9 is formed so as to cover a portion of the main surface MP1. The area around the metal electrode 9 on the main surface MP1 of the ITO layer 20 serves as an extraction area of the light emitted from the light-emitting layer portion 24.

The light-emitting layer portion 24 is configured so that the active layer 5 composed of non-doped $(Al_xGa_{1-x})_yIn_{1-y}P$ (where, $0 \leq x \leq 0.55$, $0.45 \leq y \leq 0.55$) alloy is sandwiched by the p-type cladding layer 6 (first-conductivity-type cladding layer) composed of p-type $(Al_zGa_{1-z})_yIn_{1-y}P$ (where, $x<z \leq 1$) and the n-type cladding layer 4 (second-conductivity-type cladding layer) composed of n-type $(A_zGa_{1-z})_yIn_{1-y}P$ (where, $x<z \leq 1$), and so as to adjust the emission wavelength from green to red regions (emission wavelength (center wavelength) of 550 nm to 650 nm) depending on the composition of the active layer 5. In the light-emitting device 300 shown in FIG. 24, the p-type AlGaInP cladding layer 6 is disposed on the metal electrode 9 side, and the n-type AlGaInP cladding layer 4 is disposed on the metal layer 10 side. The device thus has positive polarity on the metal electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

The Si single crystal substrate 7 is typically fabricated by slicing and polishing an Si single crystal ingot, and has a thickness typically within a range from 100 µm to 500 µm. The Si single crystal substrate 7 is bonded to the light-emitting layer portion 24 while placing the metal layer 40 in between. The thickness of the metal layer 40 is preferably within a range typically from 100 nm to 1,000 nm.

Between the ITO layer 20 and the light-emitting layer portion 24, and between the ITO layer 10 and the light-emitting layer portion 24, the contact layers 30 composed of In-containing GaAs is respectively formed. The contact layers 30 are made as thin as 1 nm to 20 nm (preferably 5 nm to 10 nm) so as to reduce influence of light absorption.

The following paragraphs will describe a method of fabricating the light-emitting device 300 shown in FIG. 24.

Figure 25:
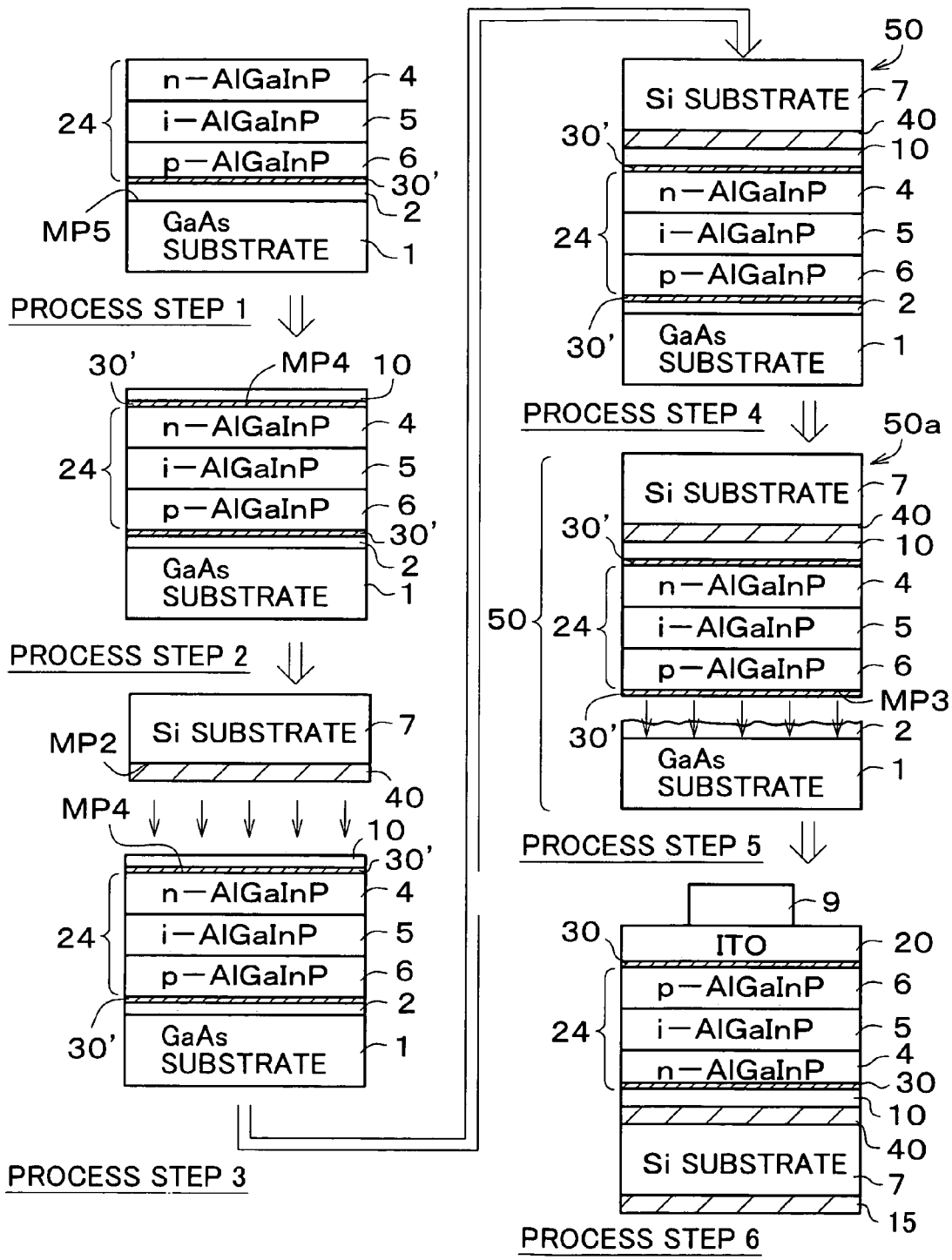
FIG. 25 is a drawing showing exemplary process steps of fabrication of the light-emitting device shown in FIG. 24.

First as shown in process step 1 in FIG. 25, on the main surface MP5 of the GaAs single crystal substrate 1 which is a semiconductor single crystal substrate used as the light-emitting-layer-growing substrate, the p-type GaAs buffer layer 2 typically of 0.5 µm thick, and a separating layer (not shown) composed of AlAs typically of 0.5 µm thick are formed by epitaxial growth. The GaAs layer 30 (intended for later becoming the contact layer 30 with the ITO layer 20) is then formed, and the light-emitting layer portion 24 is formed further thereon by epitaxially growing the p-type AlGaInP cladding layer 6 of 1 µm thick, the (non-doped) AlGaInP active layer 5 of 0.6 µm thick, and the n-type AlGaInP cladding layer 4 of 1 µm thick in this order. Lastly the GaAs layer 30' (intended for later becoming the contact layer 30 with the ITO layer 10) is formed.

Next as shown in process step 2, the ITO layer 10 is formed by sputtering on the main surface MP4 of the light-emitting layer portion 24 having the GaAs layer 30' formed thereon. On the other hand, as shown in process step 3, the Au layer 40 is formed on the main surface MP2 of the Si single crystal substrate 7 separately obtained. The Si single crystal substrate 7 and the light-emitting layer portion 24 are then stacked and pressed so as to oppose the Au layer 40 and the ITO layer 10, and the stack is then annealed under predetermined conditions as shown in process step 4, to thereby obtain the substrate bond 50.

The Au layer 40 does not directly contact with the light-emitting layer portion 24 due to interposition of the ITO layer 10 in between, so that it is not causative of alloying with the light-emitting layer portion 24. The Au layer 40 is less likely to cause an excessive chemical reaction with the ITO layer 10 even under annealing for the bonding or for In diffusion into the GaAs layer 30' described later, and can keep a desirable metallic gross even after the bonding to thereby realize a large reflectivity. Of course, it is no more necessary to carry out the annealing for alloying for reducing contact resistance between the Au layer 40 and the light-emitting layer portion 24, which has been necessary in the prior art.

The aforementioned annealing for bonding is successful in achieving a generally desirable bonding strength between the Au layer 40 and the ITO layer 10, and in sufficiently reducing the contact resistance between the both to a practically unharmful level. It is, however, possible to further improving the bonding strength by composing the outermost portion of the Au layer 40 with Sn-containing Au—Sn alloy layer 40a. This makes it also possible to obtain a desirable ohmic contact.

Referring now back to FIG. 25, the process then advances to process step 5, where the substrate bond 50 is dipped in an etching solution typically comprising a 10% aqueous hydrofluoric acid solution, so as to selectively etch the AlAs separating layer formed between the buffer layer 2 and the light-emitting layer portion 24, to thereby separate the GaAs single crystal substrate 1 (opaque to the light from the light-emitting layer portion 24) from the stack 50a which comprises the light-emitting layer portion 24 and the Si single crystal substrate 7 bonded thereto. Another possible process is such that the etching stop layer composed of AlInP is formed in place of the AlAs separating layer, the GaAs single crystal substrate 1 is then etched off together with the GaAs buffer layer 2 using a first etching solution (e.g., ammonia/hydrogen peroxide mixed solution) having an etching selectivity to GaAs, and the etching stop layer is then etched off using a second etching solution (e.g., hydrochloric acid, where addition of hydrofluoric acid for removing Al oxide layer also allowable) having an etching selectivity to AlInP. It is to be noted now that also the removal of the entire portion of the light-emitting-layer-growing substrate by etching belongs to a concept of "separation".

Next as shown in process step 6, the ITO layer 20 is formed so as to cover the entire portion of the main back surface MP3 (on the p-type cladding layer 6 side) of the GaAs layer 30' exposed after the separation of the GaAs single crystal substrate 1. The thickness of the GaAs layer 30' (intended for later becoming the contact layer 30) is adjusted to 1 nm to 20 nm (preferably 5 nm to 10 nm) so as to reduce influence of light absorption. The contact layer 30 is such as finally becoming an In-containing GaAs layer, and more specifically such as having a composition of InGaAs (at least) at the junction interface with the ITO layers 10, 20. While the contact layer 30 can be formed originally as InGaAs layer typically by the MOVPE process, it is also possible to adopt a simple production method as described in the next considering that this layer is formed in contact with the In-containing ITO layer 10 or 20. That is, the GaAs layer 30' is formed as described in the above, and then the ITO layers 10, 20 are formed.

Figure 26:
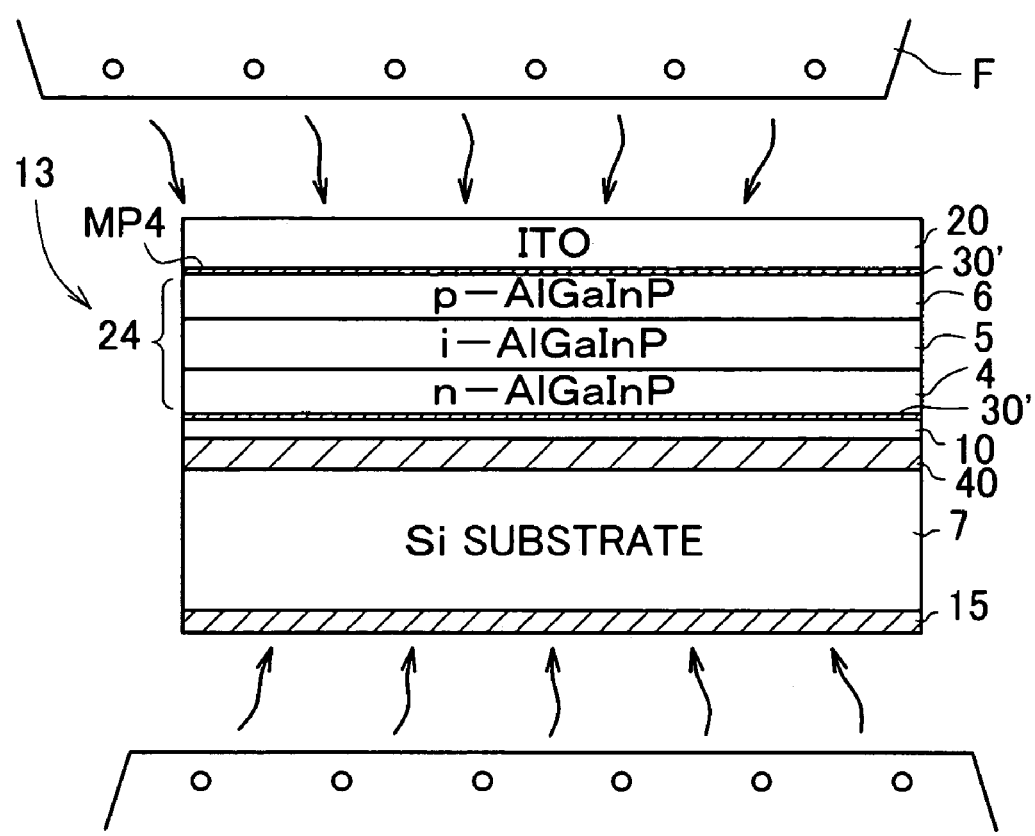
FIG. 26 is a drawing showing process steps as continued from FIG. 25.

Then as shown in FIG. 26, the stacked wafer 13 having the ITO layers 10, 20 formed thereon is then disposed in a furnace F, and annealed under an inert gas atmosphere such as containing nitrogen or Ar, at a temperature of as low as 600° C. to 750° C. (typically at 700° C.) for a duration of time as short as 5 seconds to 120 seconds (typically for 30 seconds). This allows In to diffuse respectively from the ITO layers 10, 20 towards the GaAs layer 30' to thereby form the contact layer 30 (FIG. 24) composed of In-containing GaAs.

After the contact layer 30 and the ITO layer 20 are thus formed, the metal electrode 9 for wire bonding (bonding pad: FIG. 24), composed of Au or the like, is formed on the ITO layer 20. Thereafter, the dicing is carried out according to the general practice to thereby obtain semiconductor chips, and each chip is then mounted on a support, wire-bonded with lead wires, and molded with a resin to thereby produce a final product form of the light-emitting device.

Figure 27:
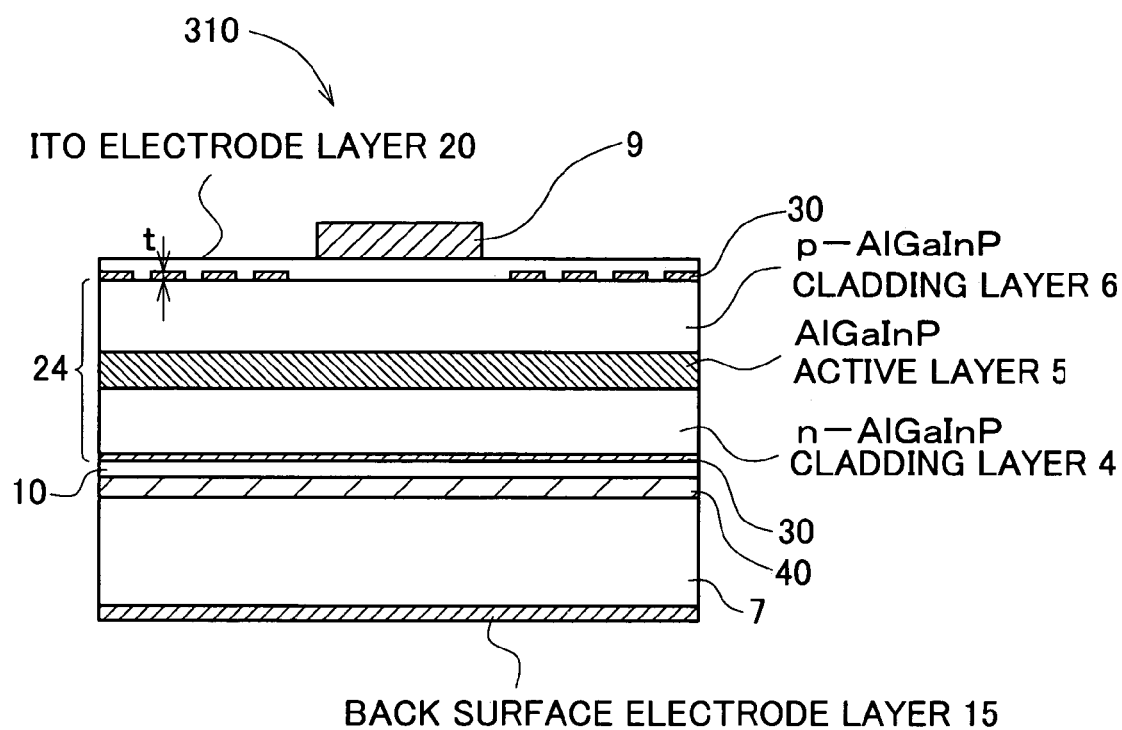
FIG. 27 is a schematic drawing showing a stacked structure of a second embodiment of the light-emitting device according to the third invention.

It is also allowable that the contact layer 30 is, as in a light-emitting device 310 shown in FIG. 27, not formed in the primary region which locates right under the metal electrode 9 (bonding pad: FIG. 24) and can yield only a less amount of light extraction, and instead selectively formed only in a secondary region therearound which can yield a larger amount of light extraction. In an exemplary case shown in FIG. 27, the formation areas and non-formation areas of the contact layer 30 are interlaced in the secondary region. The ITO layer 20 in the non-formation area of the contact layer 30 is thus brought into direct contact with the light-emitting layer portion 24.

A problem may arise now in that the direct contact of the contact layer with the AlGaInP layer results in a formation of a slightly higher hetero-barrier at the junction interface, and this is causative of increase in the series resistance component. To reduce this effect, it is allowable to interpose the intermediate layer 31 between the contact layer 30 in contact with the ITO layers 10, 20 and the light-emitting layer portion 24 (cladding layers 4, 6) as shown by light-emitting devices 320, 330 in FIGS. 28 and 29, where the intermediate layer 31 having a band gap energy intermediate between those of the both. The intermediate layer 31 can be configured so as to contain at least any one of AlGaAs layer, GaInP layer and AlGaInP layer, and for example the entire portion thereof can be composed of a single AlGaAs layer. Because the thickness of the intermediate layer can be adjusted as thin as approximately 0.1 µm or below (but 0.01 µm or above: where thickness smaller than this value will ruin the bulk band structure, and will make it impossible to obtain a desired junction structure), this structure is successful enough in shortening the epitaxial growth time and improving the productivity by the merit of the thinning, so that the device will have only a small increase in the series resistance due to formation of the intermediate layer, and is less likely to lower the emission efficiency. In particular for the case where the contact layer 30 is formed only on a part of the ITO layer 20 (formed on the p-type cladding layer 6 side having a larger probability of emission recombination in this embodiment), current density during current supply for the light emission tends to increase selectively in the formation area of the contact layer 30. If a hetero-barrier formed between the contact layer 30 and the AlGaInP cladding layer 6 is undesirably high, a larger voltage drop will occur when the carrier passes through the junction interface between the contact layer 30 and the AlGaInP cladding layer 6 while being affected by the current concentration, and this undesirably tends to increase the apparent series contact. It can thus be concluded that more distinct effect of suppressing the series resistance can be achieved by lowering of the hetero-barrier height through formation of the intermediate layer 31, rather than by formation of the contact layer 30 over the entire surface of the ITO layer 20.

Figure 28:
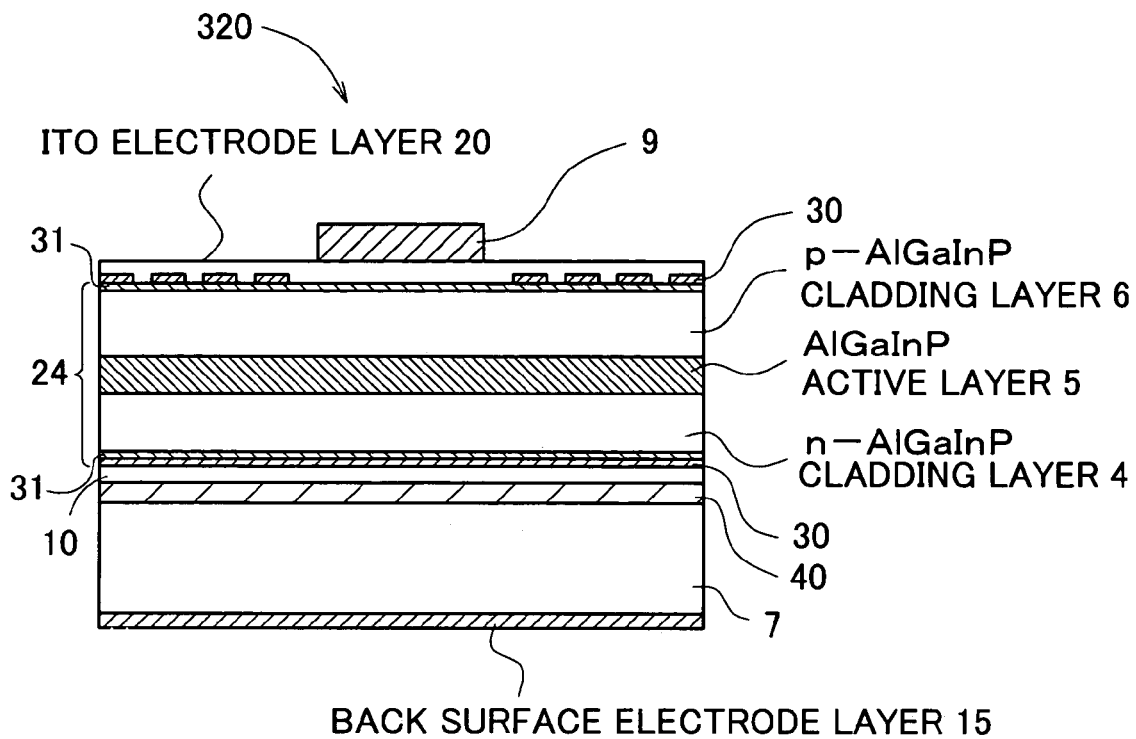
FIG. 28 is a schematic drawing showing a stacked structure of a third embodiment of the light-emitting device according to the third invention.
Figure 29:
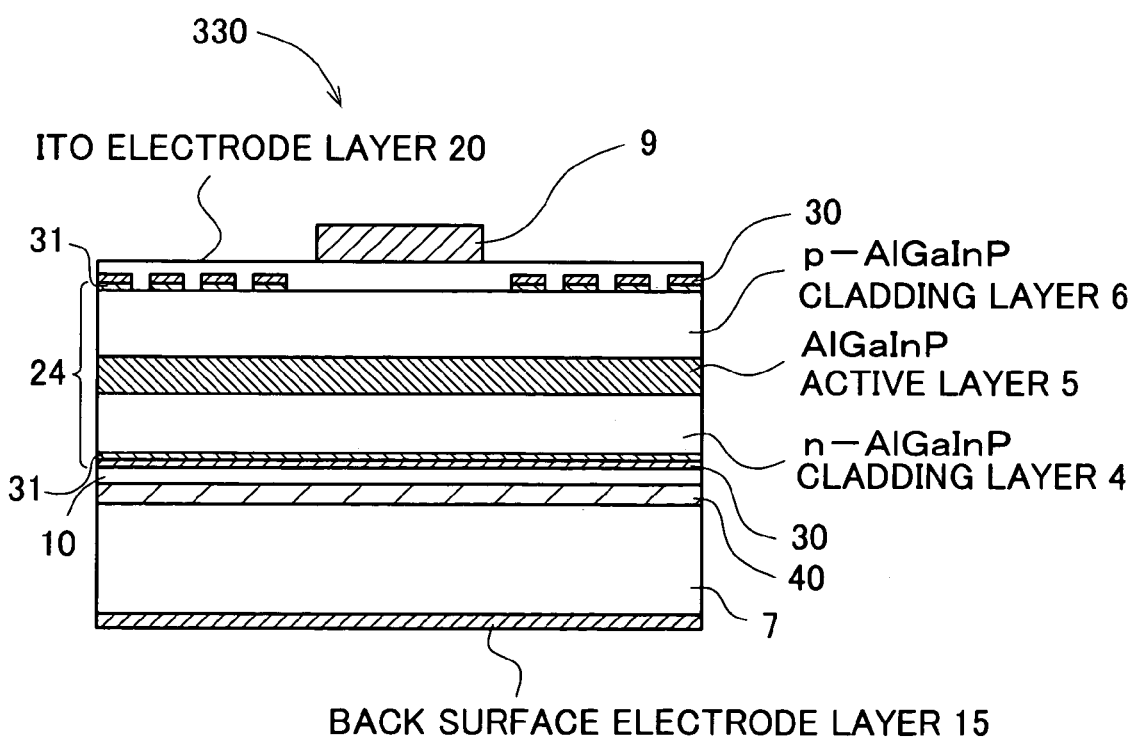
FIG. 29 is a schematic drawing showing a stacked structure of a fourth embodiment of the light-emitting device according to the third invention.

For the case where the intermediate layer 31 is less likely to adversely affect the light absorption, for example when it is formed to a very small thickness, the layer can be formed so as to cover the entire surface of the light-emitting layer portion 24 as in a light-emitting device 320 shown in FIG. 28. This configuration needs patterning of the contact layer

30 only, and can thus facilitate the fabrication even for the case where the intermediate layer 31 cannot thoroughly be etched by etchant for the contact layer 30 in chemical etching. On the other hand, it is of course possible to form the intermediate layer 31 only in the formation area for the contact layer 30 as shown by a light-emitting device 330 in FIG. 29, and this is advantageous in further reducing the influence of light absorption by the intermediate layer 31. In this case, a convenient process is such as forming both of the contact layer 30 and the intermediate layer 31 so as to cover the entire surface of the light-emitting layer portion 24, and then respectively patterning these layers by the aforementioned photolithography. In this patterning, the contact layer 30 and the intermediate layer 31 may concomitantly be etched by vapor-phase etching, or may sequentially be etched by chemical etching while exchanging the etchants between both layers.

The ITO layer 20 is composed of ITO, a transparent conductive oxide, and acts as a transparent electrode which reconciles the light extraction function and current-spreading function. Further enhancement in the current spreading function essentially needs reduction in the sheet resistance (or resistivity) of the ITO layer 20, and further enhancement in the light extraction function essentially needs security of a sufficient light transmissivity even if the ITO layer 20 is formed to a large thickness if occasion demands.

Figure 30:
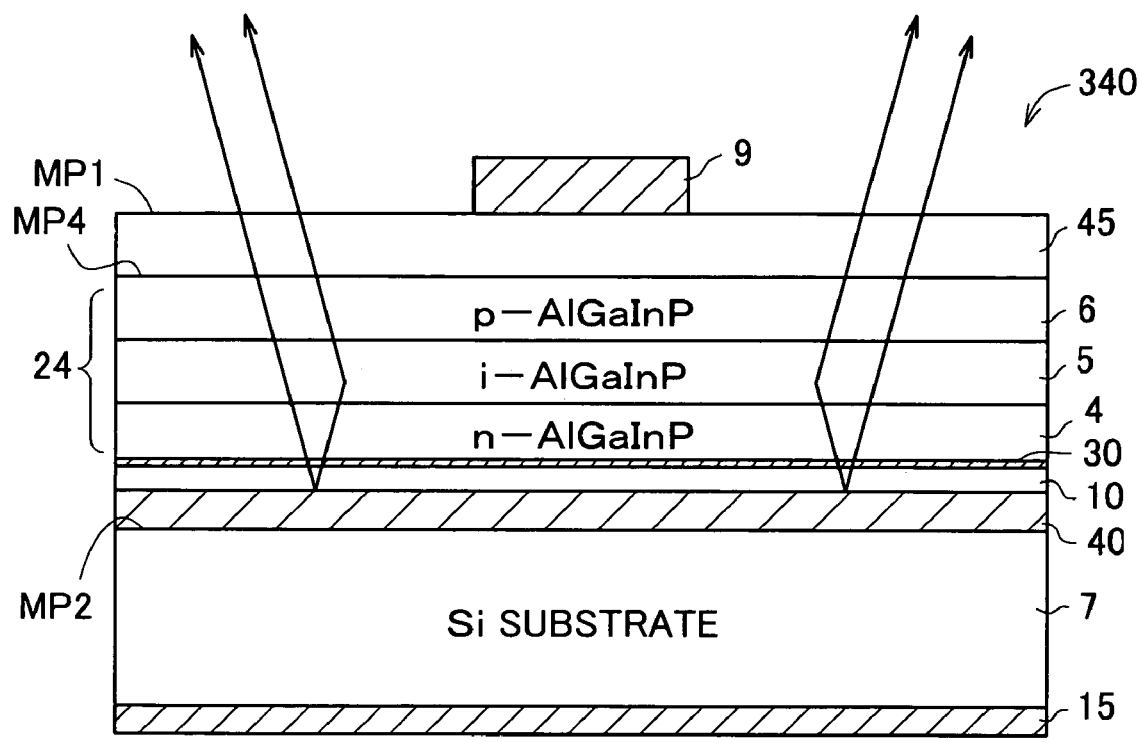
FIG. 30 is a schematic drawing showing a stacked structure of a fifth embodiment of the light-emitting device according to the third invention.

In place of the ITO layer 20 which serves as the electrode-forming transparent conductive material layer, it is also allowable to dispose a current-spreading layer 45 composed of a compound semiconductor such as GaP, as in a light-emitting device 340 shown in FIG. 30.

Although the individual layers of the light-emitting layer portion 24 in the above-described embodiment were composed of AlGaInP alloy, a wide-gap-type, light-emitting device adapted for blue light emission or ultraviolet emission can be configured if the individual layers (p-type cladding layer, active layer and n-type cladding layer) are formed using AlGaInN alloy. The light-emitting portion 24 can be formed by the MOVPE process similarly to the case for the light-emitting device 300 shown in FIG. 24. In this case, a sapphire substrate (insulating material), in place of GaAs single crystal substrate, is typically used for the semiconductor single crystal substrate which is the light-emitting-layer-growing substrate on which the light-emitting layer portion 24 is to be grown.

Although the active layer 5 in the aforementioned embodiment was composed of a single layer, this may be configured by a stack of a plurality of compound semiconductor layers having different band gap energies, and more specifically by a stack such as having a quantum well structure. The active layer having a quantum well structure is composed of two types of layers having the alloy compositions adjusted so as to have different band gap energies, that are a well layer having a smaller band gap energy and a barrier layer having a larger one, which layers individually having a thickness not larger than the mean free path of electron (generally equivalent to one atomic layer to several nanometers) are stacked in a lattice-matched manner. Since energy of electron (or hole) in the well layer is quantized in this structure, so that adoption of the structure to semiconductor laser, for example, is advantageous in that the oscillation wavelength can arbitrarily be adjusted by selecting the width or depth of the energy well layer, and in stabilizing the oscillation wavelength, improving the emission efficiency and reducing the oscillation threshold current density. The structure is also advantageous in that the oscillation wavelength can readily be expanded, since the well layer and barrier layer have very small thicknesses, and mismatching of the lattice constants can consequently be allowed up to as much as 2 to 3% or around. The quantum well structure may be either of multi-quantum-well structure having a plurality of quantum well layers, and of single-quantum-well structure having only a single well layer. The thickness of the barrier layer is defined typically as 50 nm or around only for those in contact with the cladding layer, and as 6 nm or around for others. The well layer may be 5 nm thick or around.

(Fourth Invention)

The following paragraphs will describe embodiments of the fourth invention referring to the attached drawings.

Figure 31:
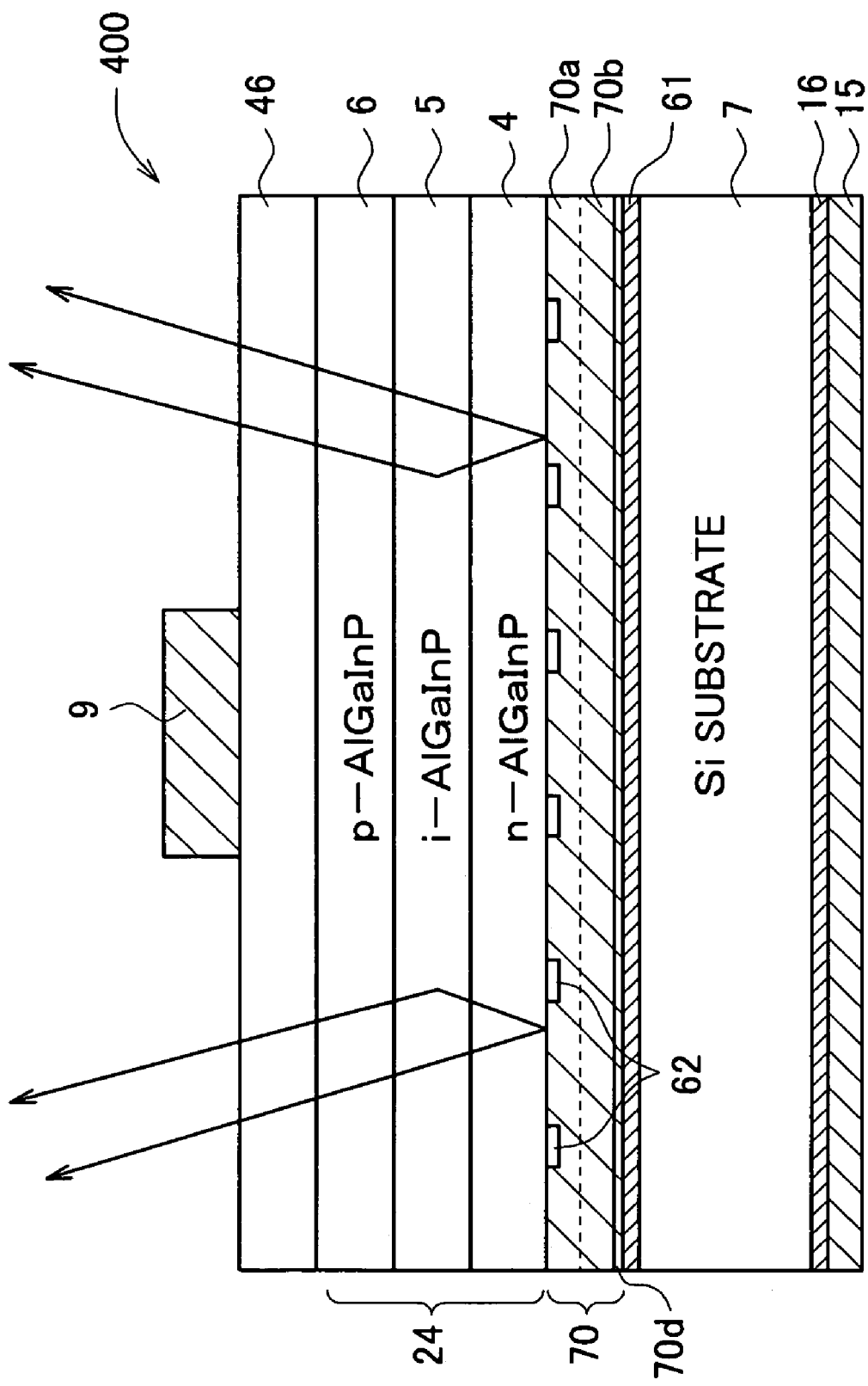
FIG. 31 is a schematic drawing showing a stacked structure of a first embodiment of the light-emitting device according to the fourth invention.

FIG. 31 is a conceptual drawing of a light-emitting device 400 of one embodiment according to the fourth invention. The light-emitting device 400 comprises an n-type Si (silicon) single crystal substrate 7 as the conductive semiconductor substrate which serves as the device substrate, and the light-emitting layer portion 24 bonded to a first main surface of the Si single crystal substrate 7, while placing a main metal layer 70 in between.

The light-emitting layer portion 24 is configured so that the active layer 5 composed of non-doped $(Al_xGa_{1-x})_yIn_{1-y}P$ (where, $0 \leq x \leq 0.55$, $0.45 \leq y \leq 0.55$) alloy is sandwiched by the p-type cladding layer 6 composed of a first-conductivity-type cladding layer, which is p-type $(Al_zGa_{1-z})_yIn_{1-y}P$ (where, $x<z \leq 1$) in this embodiment, and n-type cladding layer 4 composed of a second-conductivity-type cladding layer different from the first-conductivity-type cladding layer, which is n-type $(Al_zGa_{1-z})_yIn_{1-y}P$ (where, $x<z \leq 1$) in this embodiment, and so as to adjust the emission wavelength from green to red regions (emission wavelength (peak emission wavelength) of 550 nm to 670 nm) depending on the composition of the active layer 5. In the light-emitting device 400, the p-type AlGaInP cladding layer 6 is disposed on the metal electrode 9 side, and the n-type AlGaInP cladding layer 4 is disposed on the main metal layer 70 side. The device thus has positive polarity on the metal electrode 9 side. It is to be noted now that "non-doped" in this context means that "the dopant is not intentionally added", and is not precluded from being inevitably added with the dopant component during normal fabrication processes (where the upper limit set at $10^{13}$ to $10^{16}/cm^3$ or around).

On the main surface of the light-emitting layer portion 24 opposite to that facing to the substrate 7, a current-spreading layer 46 composed of AlGaAs is formed, and at around the center of the main surface thereof, the metal electrode (e.g., Au electrode) 9 for applying emission drive voltage to the light-emitting layer portion 24 is formed so as to cover a portion of the main surface. The area around the metal electrode 9 on the main surface of the current-spreading layer 46 serves as an extraction area of the light emitted from the light-emitting layer portion 24. On the back surface of the Si single crystal substrate 7, a metal electrode (back surface electrode: typically Au electrode) 15 is formed so as to cover the entire portion thereof. For the case where the metal electrode 15 is composed of an Au electrode, an AuSb bonding metal layer 16 as the substrate-side bonding metal layer is interposed between the metal electrode 15 and the Si single crystal substrate 7. It is also allowable herein to use an AuSn bonding metal layer as the substrate-side bonding metal layer, in place of the AuSb bonding metal layer 16.

The Si single crystal substrate 7 is typically fabricated by slicing and polishing an Si single crystal ingot, and has a thickness typically within a range from 100 μm to 500 μm. The Si single crystal substrate 7 is bonded to the light-emitting layer portion 24 while placing the main metal layer 70 in between. The main metal layer 70 is configured as an Au-base layer as a whole.

Between the light-emitting layer portion 24 and the main metal layer 70, an AuGeNi bonding metal layer 62 (e.g., Ge=15 wt %, Ni=0.10 wt %), which contributes to reduction in the series resistance of the device. The AuGeNi bonding metal layer 62 is formed on the main surface of the main metal layer 70 in a discrete manner, where the ratio of formation area falls within a range from 1% to 25%. Between the Si single crystal substrate 7 and the main metal layer 70, an AuSb bonding metal layer 61 (e.g., Sb=5 wt %) as the substrate-side bonding metal layer is formed so as to contact with the main surface of the Si single crystal substrate 7. It is also allowable herein to use an AuSn bonding metal layer in place of the AuSb bonding metal layer 61.

The entire surface of the AuSb bonding metal layer 61 is covered with the ITO layer 70$d$ as the diffusion-blocking layer. The thickness of the ITO layer 70$d$ is adjusted within a range from 1 nm to 10 μm (1 μm in this embodiment). It is also allowable herein to compose the diffusion-blocking layer with a ZnO layer, in place of the ITO layer. The main metal layer 70 (Au-base layer) is disposed so as to cover the entire surface of the ITO layer 70$d$ so as to contact therewith. The Au-base layer comprises pure Au or an Au alloy having an Au content of 95 wt % or more.

The light emitted from the light-emitting layer portion 24 is extracted in a form such that the light directly emitted towards the light extraction surface side is superposed with the light reflected on the main metal layer 70. The thickness of the main metal layer 70 is preferably adjusted to 80 nm or above in view of ensuring a sufficient reflective effect. There is no special limitation on the upper limit of the thickness, but any excessive thickness only results in saturated reflective effect, so that it may properly be determined considering the balance with the cost (e.g., 1 μm or around).

The following paragraphs will describe a method of fabricating the light-emitting device 400 shown in FIG. 31.

Figure 32:
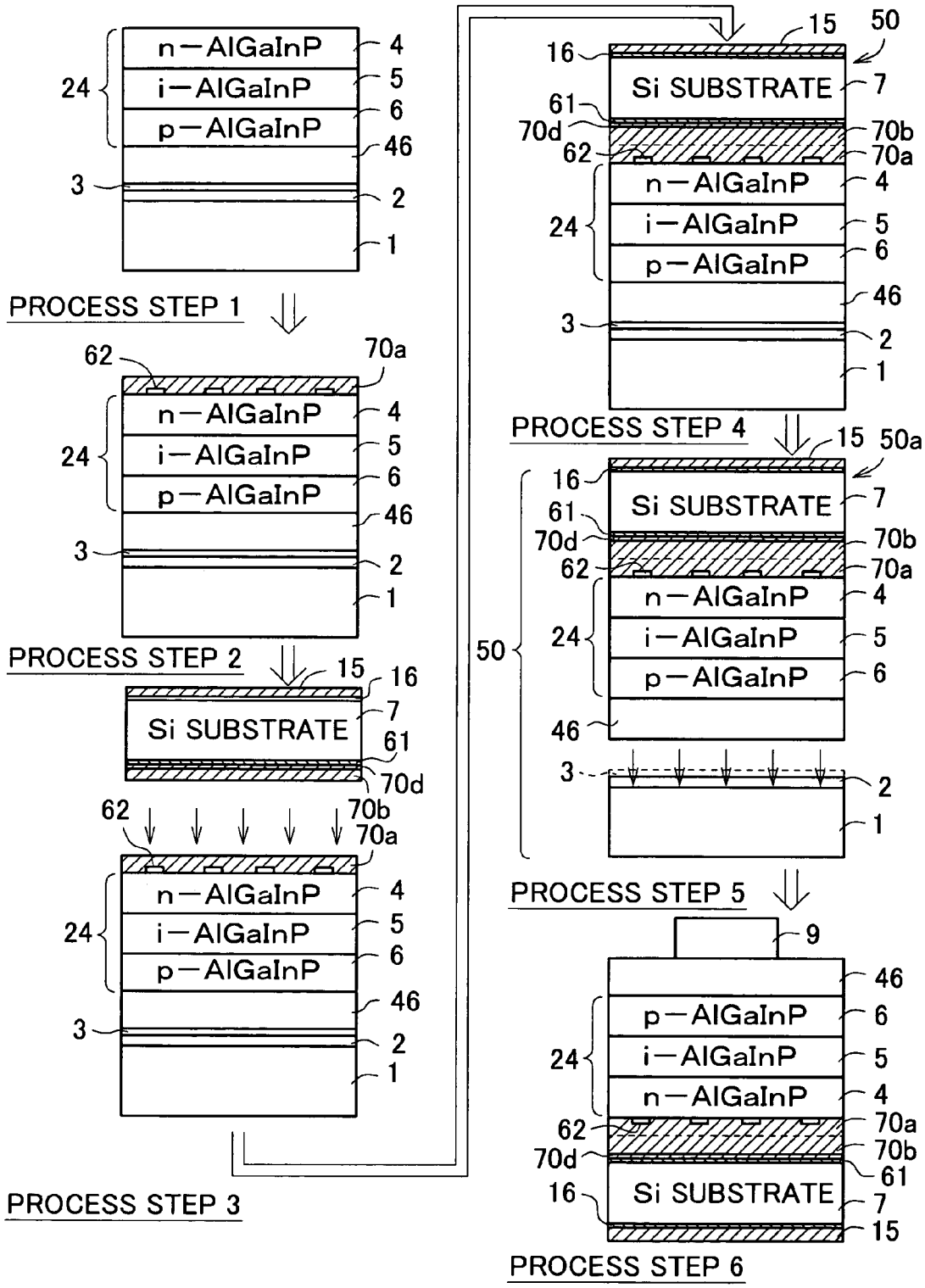
FIG. 32 is a drawing showing exemplary process steps of fabrication of the light-emitting device shown in FIG. 31.

First as shown in process step 1 in FIG. 32, on the main surface of the GaAs single crystal substrate 1 which is a semiconductor single crystal substrate used as the light-emitting-layer-growing substrate, the p-type GaAs buffer layer 2 typically of 0.5 μm thick, the separating layer 3 composed of AlAs typically of 0.5 μm thick, and the current-spreading layer 46 composed of p-type AlGaAs typically of 5 μm thick are formed by epitaxial growth sequentially in this order. Thereafter the light-emitting layer portion 24 is formed by epitaxially growing the p-type AlGaInP cladding layer 6 of 1 μm thick, the (non-doped) AlGaInP active layer 5 of 0.6 μm thick, and the n-type AlGaInP cladding layer 4 of 1 μm thick, sequentially in this order.

Next as shown in process step 2, the AuGeNi bonding metal layer 62 is formed on the main surface of the light-emitting layer portion 24 in a discrete manner. After the AuGeNi bonding metal layer 62 is formed, annealing for alloying is carried out in a temperature range from 350° C. to 500° C. A first Au-base layer 70$a$ is then formed so as to cover the AuGeNi bonding metal layer 62. The above-described annealing for alloying allows an alloyed layer to be formed between the light-emitting layer portion 24 and the AuGeNi bonding metal layer 62, and this is successful in considerably reducing the series resistance. On the other hand, as shown in process step 3, AuSb bonding metal layers 61, 16 (AuSn bonding metal layers also allowable as described in the above) as the substrate-side bonding metal layers are formed on both main surfaces of the Si single crystal substrate 7 (n-type) separately obtained, and the product is annealed for alloying in a temperature range from 100° C. to 500° C. On the AuSb bonding metal layer 61, the ITO layer 70$d$ (typically 1 μm thick) and a second Au-base layer 70$b$ are formed in this order. On the AuSb bonding metal layer 16, the back surface electrode layer 15 (typically composed of an Au-base metal) is formed. The individual metal layers and ITO layer 70$d$ in the above-described process steps can be formed by sputtering, vacuum evaporation or the like. In the present embodiment, the ITO layer 70$d$ is formed by RF sputtering, and the metal layers are formed by vacuum evaporation.

Next as shown in process step 4, the Si single crystal substrate 7 and the light-emitting layer portion 24 are then stacked and pressed so as to oppose the second Au-base layer 70$b$ and the first Au-base layer 70$a$, and the stack is then bonded by annealing at 80° C. to 500° C., typically at 200° C., to thereby obtain a substrate bond 50. The Si single crystal substrate 7 is bonded to the light-emitting layer portion 24 while placing the first Au-base layer 70$a$ and the second Au-base layer 70$b$ in between. The first Au-base layer 70$a$ and the second Au-base layer 70$b$ are united by the annealing for bonding to thereby give the main metal layer 70. The annealing for bonding can be carried out without causing any problem in the air, for example, because both of the first Au-base layer 70$a$ and the second Au-base layer 70$b$ contain less oxidative Au as a major component.

Between the second Au-base layer 70$b$ and the Si single crystal substrate 7 (AuSb bonding metal layer 61), the ITO layer 70$d$ which functions as the diffusion-blocking layer is interposed. The ITO layer 70$d$ successfully prevents Si component from diffusing from the Si single crystal substrate 7 towards the second Au-base layer 70$b$ during the annealing for bonding, to thereby effectively suppress effusion of the Si component towards the second Au-base layer 70$b$ side, and moreover, towards the side of the main metal layer 70 united by the bonding. This is successful in realizing a desirable reflectivity of the main metal layer 70 (Au-base layer) to be finally obtained, because the reflective surface thereof will not be disturbed by eutectic reaction between Au and Si, or the Au-base layer per se will not be blackened due to the Si component. This is also advantageous in keeping the bonding strength between the Si single crystal substrate 7 and the light-emitting layer portion (compound semiconductor layers) 24 with the aid of the main metal layer 70.

The temperature of the annealing for alloying of the substrate-side bonding metal layer (AuSb bonding metal layers 61, 16) can be adjusted within a range from 100° C. to 500° C. as described in the above, where the range overlaps an allowable temperature range for the annealing for bonding of 80° C. to 500C. Adoption of the overlapping temperature range (100° C. to 500° C.) for that of the annealing for bonding therefore, makes it possible to proceed the bonding concomitantly with the alloying for forming ohmic contact between the substrate-side bonding metal layer and the Si single crystal substrate (device substrate), without specially carrying out the annealing for alloying before the ITO layer 70$d$ is formed. In other words, the annealing for bonding is also used for the annealing for alloying of the substrate-side bonding metal layer, and this simplifies the process steps. On the other hand, in some cases, elevation of temperature of the substrate 7 before the ITO layer 70$d$ is formed may be more advantageous in view of raising the conductivity of the ITO layer. In this case, adjustment of the substrate temperature within the aforementioned desirable range makes it possible to incorporate the annealing for alloying of the substrate-side bonding metal layer into the formation process step of the ITO layer 70*d*, and this contributes to simplified processes.

The process then advances to process step 5, where the substrate bond 50 is dipped in an etching solution typically comprising a 10% aqueous hydrofluoric acid solution, so as to selectively etch the AlAs separating layer 3 formed between the buffer layer 2 and the light-emitting layer portion 24, to thereby separate the GaAs single crystal substrate 1 (opaque to the light from the light-emitting layer portion 24) from the stack 50*a* which comprises the light-emitting layer portion 24 and the Si single crystal substrate 7 bonded thereto. Another possible process is such that the etching stop layer composed of AlInP is formed in place of the AlAs separating layer 3, the GaAs single crystal substrate 1 is then etched off together with the GaAs buffer layer 2 using a first etching solution (e.g., ammonia/hydrogen peroxide mixed solution) having an etching selectivity to GaAs, and the etching stop layer is then etched off using a second etching solution (e.g., hydrochloric acid, where addition of hydrofluoric acid for removing Al oxide layer also allowable) having an etching selectivity to AlInP. It is to be noted now that also the removal of the entire portion of the light-emitting-layer-growing substrate by etching belongs to a concept of "separation".

Next as shown in process step 6, the metal electrode 9 for wire bonding (bonding pad: FIG. 31) is formed so as to cover a part of the main surface of the current-spreading layer 46 exposed after the separation of the GaAs single crystal substrate 1. Thereafter, the dicing is carried out according to the general practice to thereby obtain semiconductor chips, and each chip is then mounted on a support, wire-bonded with lead wires, and molded with a resin to thereby produce a final product form of the light-emitting device.

Figure 33:
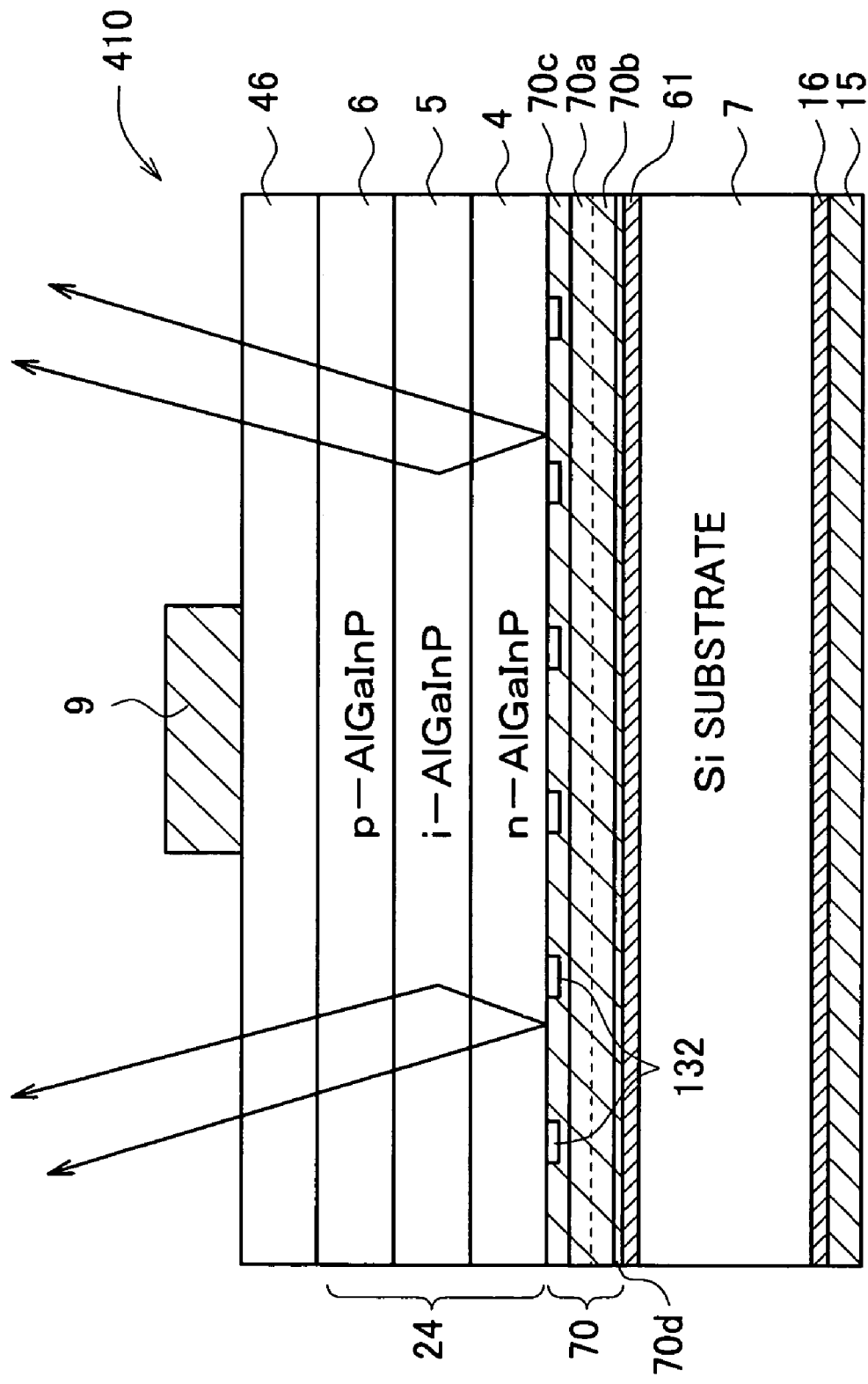
FIG. 33 is a schematic drawing showing a stacked structure of a second embodiment of the light-emitting device according to the fourth invention.
Figure 34:
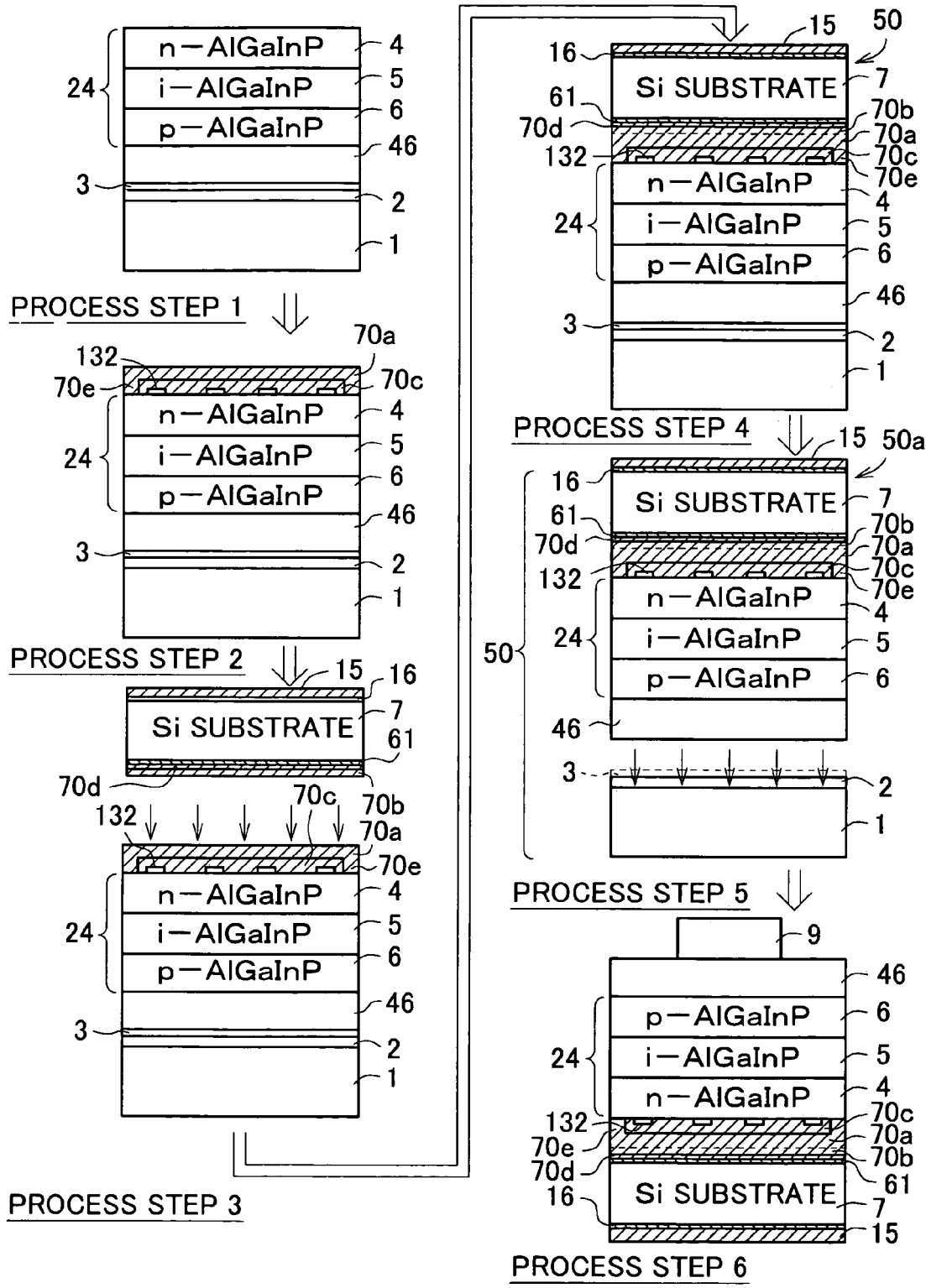
FIG. 34 is a drawing showing exemplary process steps of fabrication of the light-emitting device shown in FIG. 33.

While the first Au-base layer 70*a* composed the reflective layer in the above-described embodiment, it is also allowable, as shown by a light-emitting device 410 in FIG. 33, to interpose an Ag-base layer 70*c* between the first Au-base layer 70*a* and the light-emitting layer portion 24. In this case, an Ag-base bonding metal layer 132 composed of AgGeNi (e.g., Ge=15 wt %, Ni=10 wt %) is formed in a discrete manner as the light-emitting-layer-portion-side bonding metal layer, in place of the Au-base bonding metal layer. Other portions are similar to those in the light-emitting device 400 shown in FIG. 31. FIG. 34 shows exemplary fabrication process steps therefor. The process steps are different from those shown in FIG. 32 in that the Ag-base bonding metal layer 132 is formed in a discrete manner in place of the Au-base bonding metal layer 32 in process step 2, the annealing for alloying is carried out in a temperature range from 350° C. to 660° C., and thereafter the Ag-base layer 70*c* and the first Au-base layer 70*a* are formed in this order. The other process steps are basically similar to those shown in FIG. 32.

For the case where the etching solution used for the separation (removal) by etching of the light-emitting-layer-growing substrate may erode the Ag-base layer 70*c*, a recommendable process is such as follows. That is, as shown in process step 3, the first Au-base layer 70*a* in contact with the Ag-base layer 70*c* is formed in a larger area than the Ag-base layer 70*c*, so as to allow the outer contour of the first Au-base layer 70*a* fall within the outer contour of the first Au-base layer 70*a*. The Ag-base layer 70*c* is therefore surrounded by the first Au-base layer 70*a*, and the outer circumferential plane of the Ag-base layer 70*c* is protected by the outer circumferential plane 70*e* of the first Au-base layer 70*a*. Therefore the Ag-base layer 70*c* becomes unlikely to be affected even in the etching process of the light-emitting-layer-growing substrate (GaAs single crystal substrate 1) in process step 5. The GaAs single crystal substrate 1 used as the light-emitting-layer-growing substrate is dissolved and removed using a mixed solution of ammonia/hydrogen peroxide, where adoption of the aforementioned configuration is successful in dissolving and removing the GaAs single crystal substrate 1 without causing any problems on Ag which is especially likely to be corroded by the etching solution.

It is also allowable to form the individual layers of the light-emitting portion 24 using AlGaInN alloy. A sapphire substrate (insulating material) or SiC single crystal substrate is preferably used in this case as the light-emitting-layer-growing substrate on which such light-emitting layer portion 24 is to be grown. It is to be noted now that while the light-emitting layer portion 24 in the above-described embodiment was configured so that the n-type cladding layer 4, the active layer 5 and the p-type cladding layer 6 are formed in this order as viewed from the substrate side, the reverse order is also allowable, that is p-type cladding layer, the active layer and the n-type cladding layer are stacked in this order as viewed from the substrate side.

Figure 35:
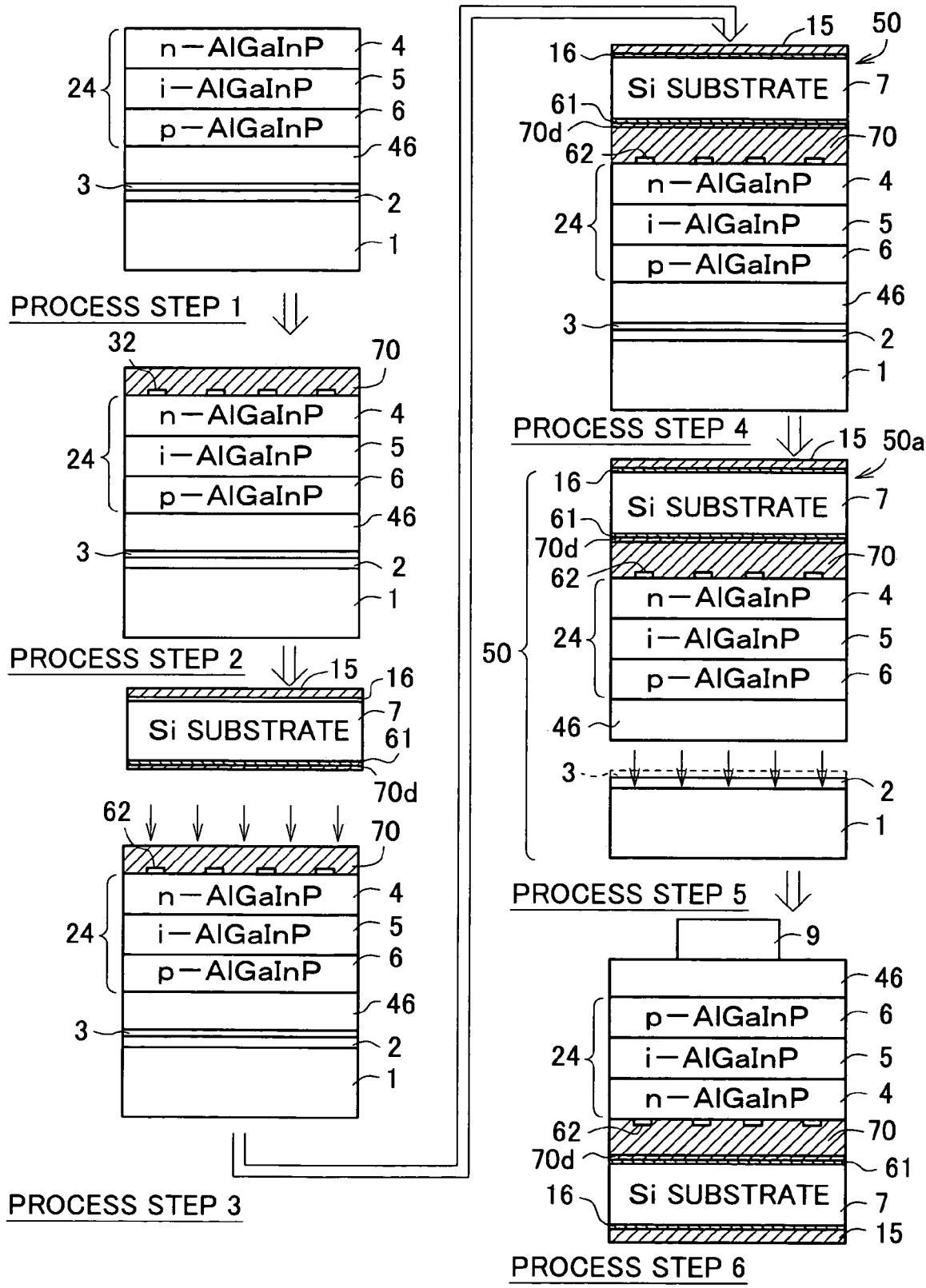
FIG. 35 is a drawing showing another example of the process steps of fabrication of the light-emitting device shown in FIG. 31.
Figure 36:
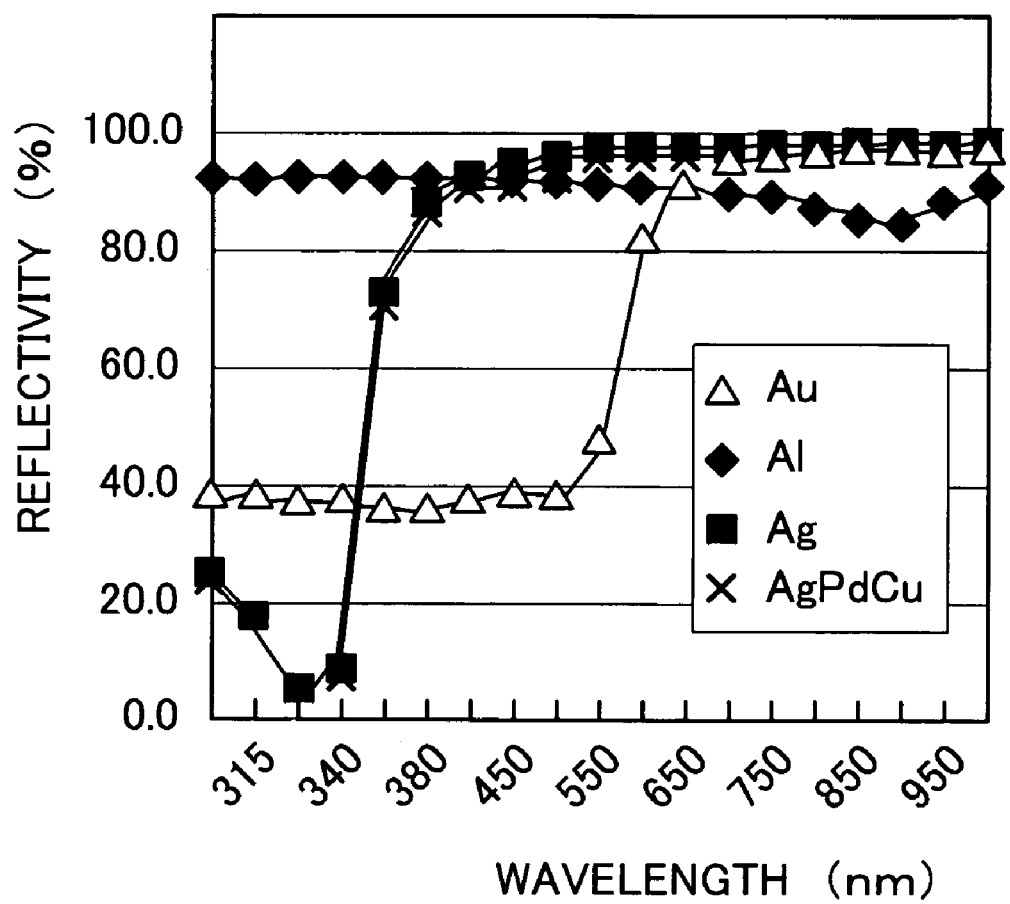
FIG. 36 is a graph showing reflectivity of various metals.

It is also allowable that, as shown in FIG. 35 (process step 3), the Au-base layer (main metal layer) 70 is formed on only either one of the Si single crystal substrate 7 (device substrate) and the light-emitting layer portion 24 (compound semiconductor layer) before the bonding. For example, as shown in FIG. 35, for the case where the Au-base layer 70 is formed on the light-emitting layer portion 24 (compound semiconductor layer) side, and the Au-base layer 70 is allowed to bond with the ITO layer 70*d* on the Si single crystal substrate 7 side, the temperature of annealing for bonding is adjusted to 200° C. to 700° C. Further, it is also allowed that, the ITO layer (or ZnO layer) 70*d* is formed on the Si single crystal substrate 7 (device substrate) side, the Au-base layer (main metal layer) 70 is formed further thereon, and then the Au-base layer 70 bond with the light-emitting layer portion 24 (compound semiconductor layer). In this case, the temperature of annealing for bonding is adjusted to 80° C. to 500° C. Although the temperatures in the above two cases seem to be considerably high as compared with the temperature of annealing for bonding of the Au-base layers (100° C. to 500° C.) shown in FIG. 32, the bonding can be proceeded without causing any problems, because the ITO layer (or ZnO layer) 70*d* is thermally stable, almost not causative of any metallurgical reaction with the Si single crystal substrate 7 or Au-base layer (main metal layer) 70 in the above temperature range, and has a sufficiently large diffusion-blocking effect against Si.

What is claimed is:

1. A method of fabricating a light-emitting device which comprises a transparent conductive semiconductor substrate, and a light-emitting layer portion composed of a compound semiconductor and bonded on one main surface of the transparent conductive semiconductor substrate while placing a substrate-bonding conductive oxide layer composed of a conductive oxide in between; and further comprises a contact layer for reducing junction resistance of the substrate-bonding conductive oxide layer, disposed between the light-emitting layer portion and the substrate-bonding conductive oxide layer so as to contact with the substrate-bonding conductive oxide layer; comprising:

a light-emitting layer portion growth step for epitaxially growing the light-emitting layer portion composed of a compound semiconductor on a first main surface of a light-emitting-layer-growing substrate;

a contact layer forming step for forming a layer for becoming the contact layer for reducing junction resistance with the substrate-bonding conductive oxide layer;

a substrate-bonding conductive oxide layer forming step for forming the substrate-bonding conductive oxide layer on the bonding surface side of the light-emitting layer portion and/or the transparent conductive semiconductor substrate;

a bonding step for bonding the light-emitting layer portion and the transparent conductive semiconductor substrate while placing the substrate-bonding conductive oxide layer in between, to thereby produce a substrate bond in which the layer for becoming the contact layer is disposed so as to contact with the substrate-bonding conductive oxide layer; and a separating step for separating the light-emitting-layer-growing substrate from the substrate bond.

2. The method of fabricating a light-emitting device as claimed in claim 1, wherein in the contact layer forming step, a GaAs layer is formed as the layer intended for becoming the contact layer, an ITO layer as the substrate-bonding conductive oxide layer is then formed so as to contact with the GaAs layer, and the layers are annealed so as to diffuse indium from the ITO layer into the GaAs layer to thereby form the contact layer as an indium-containing GaAs layer.

3. A method of fabricating a light-emitting device which comprises a transparent conductive semiconductor substrate, and a light-emitting layer portion composed of a compound semiconductor and bonded on one main surface of the transparent conductive semiconductor substrate while placing a substrate-bonding conductive oxide layer composed of a conductive oxide in between; comprising:

a light-emitting layer portion growth step for epitaxially growing the light-emitting layer portion composed of a compound semiconductor on a first main surface of a light-emitting-layer-growing substrate;

a substrate-bonding conductive oxide layer forming step for forming by sputtering an amorphous substrate-bonding conductive oxide layer on the bonding surface side of the light-emitting layer portion and/or the transparent conductive semiconductor substrate;

a bonding step for bonding the light-emitting layer portion and the transparent conductive semiconductor substrate while placing the substrate-bonding conductive oxide layer in between, to thereby produce a substrate bond; and a separating step for separating the light-emitting-layer-growing substrate from the substrate bond.

4. A method of fabricating a light-emitting device comprising:

a light-emitting layer portion growth step for epitaxially growing the light-emitting layer portion composed of a compound semiconductor on a main surface of a light-emitting-layer-growing substrate;

a separating step for separating the light-emitting-layer-growing substrate from the light-emitting layer portion;

a transparent conductive oxide layer forming step for covering a separation-side main surface, which is defined as the main surface on the light-emitting layer portion side exposed after the separation of the light-emitting-layer-growing substrate, with a transparent conductive oxide layer also available as a transparent electrode for applying voltage to the light-emitting layer portion; and a contact layer forming step for forming a layer for becoming a contact layer for reducing junction resistance of the transparent conductive oxide layer on the separation-side main surface prior to the transparent conductive oxide layer forming step.

5. The method of fabricating a light-emitting device as claimed in claim 4, further comprising a bonding step for producing a substrate bond by bonding a conductive substrate to the light-emitting layer portion on the main surface thereof opposite to that contacting with the light-emitting-layer-growing substrate.

6. The method of fabricating a light-emitting device as claimed in claim 5, wherein the conductive substrate is bonded to the light-emitting layer portion while placing a metal layer intended for a reflective layer in between.

7. The method of fabricating a light-emitting device as claimed in claim 6, wherein the conductive substrate is an Si substrate or a metal substrate.

8. The method of fabricating a light-emitting device as claimed in claim 6, wherein the reflective layer is an Au-base metal layer.

9. The method of fabricating a light-emitting device as claimed in claim 6, wherein the conductive layer is an Si substrate, the reflective layer is an Au-base metal layer contacting with both of the light-emitting layer portion and the Si substrate, and the Si substrate is bonded to the light-emitting layer portion while placing the Au-base metal layer in contact with the Si substrate in between by bonding annealing at 80° C. to 360° C., both ends inclusive.

10. The method of fabricating a light-emitting device as claimed in claim 9, wherein after the bonding annealing, the transparent conductive oxide layer is grown by sputtering on the separation-side main surface of the transparent conductive oxide layer.

11. The method of fabricating a light-emitting device as claimed in claim 10, wherein the transparent conductive oxide layer is formed as an amorphous oxide layer.

12. The method of fabricating a light-emitting device as claimed in claim 4, wherein the transparent conductive oxide layer is an ITO layer.

13. The method of fabricating a light-emitting device as claimed in claim 4, wherein a GaAs layer is formed as the layer intended for becoming the contact layer, an ITO layer as the transparent conductive oxide layer is then formed so as to contact with the GaAs layer, and the layers are annealed so as to diffuse indium from the ITO layer into the GaAs layer to thereby form the contact layer as an In-containing GaAs layer.

14. The method of fabricating a light-emitting device as claimed in claim 13, wherein the conductive substrate is an Si substrate, the Si substrate is then bonded to the light-emitting layer portion while placing an Au-base metal layer in contact with the Si substrate in between by bonding annealing at 80° C. to 360° C., both ends inclusive, and thereafter the annealing for diffusing indium into the GaAs layer is carried out.

15. The method of fabricating a light-emitting device as claimed in claim 14, wherein the annealing for diffusing indium into the GaAs layer is carried out at 600° C. to 750° C., both ends inclusive, for 5 seconds to 120 seconds, both ends inclusive.

16. A method of fabricating a light-emitting device comprising:

a light-emitting layer portion growth step for epitaxially growing the light-emitting layer portion composed of a compound semiconductor on a light-emitting-layer-growing substrate;

a metal layer forming step for forming a metal layer on a first main surface side of the conductive substrate;

a bonding-use transparent conductive oxide layer forming step for forming a bonding-use transparent conductive oxide layer on the first main surface side of the light-emitting layer portion; and a bonding step for bonding the conductive substrate and the light-emitting layer portion so as to allow the metal layer to contact with the bonding-use transparent conductive oxide layer, where all steps are sequentially carried out in this order.

17. The method of fabricating a light-emitting device as claimed in claim 16, wherein the bonding step is responsible for bonding between the bonding-use transparent conductive oxide layer and the metal layer.

18. The method of fabricating a light-emitting device as claimed in claim 16, wherein, after the bonding, a portion of the metal layer in contact with the bonding-use transparent conductive oxide layer is composed of an Au-base metal layer.

19. The method of fabricating a light-emitting device as claimed in claim 18, wherein the bonding-use transparent conductive oxide layer is an ITO layer, and the portion of the metal layer in contact with the bonding-use transparent conductive oxide layer is an Sn-containing, Au-base metal layer.

20. The method of fabricating a light-emitting device as claimed in claim 16, wherein the conductive substrate is an Si substrate, and the Si substrate is bonded to the light-emitting layer portion while placing the Au-base metal layer in contact with the Si substrate in between by bonding annealing at 80° C. to 360° C., both ends inclusive.

21. The method of fabricating a light-emitting device as claimed in claim 16, further comprising a contact layer forming step for forming a contact layer for reducing junction resistance of the bonding-use transparent conductive oxide layer on the first main surface side of the light-emitting layer portion prior to the bonding-use transparent conductive oxide layer forming step.

22. The method of fabricating a light-emitting device as claimed in claim 16, wherein, prior to the formation of the bonding-use transparent conductive oxide layer, a GaAs layer is formed on the first main surface side of the light-emitting layer portion, an ITO layer as the bonding-use transparent conductive oxide layer is then formed so as to contact with the GaAs layer, and the layers are annealed so as to diffuse indium from the ITO layer into the GaAs layer to thereby form the contact layer composed of indium-containing GaAs.

23. The method of fabricating a light-emitting device as claimed in claim 22, wherein the conductive substrate is an Si substrate, the Si substrate is then bonded to the light-emitting layer portion while placing an Au-base metal layer in contact with the Si substrate in between by bonding annealing at 80° C. to 360° C., both ends inclusive, and thereafter the annealing for diffusing indium into the GaAs is carried out.

24. The method of fabricating a light-emitting device as claimed in claim 23, wherein the annealing for diffusing indium into the GaAs layer is carried out at 600° C. to 750° C., both ends inclusive, for 5 seconds to 120 seconds, both ends inclusive.

25. A method of fabricating a light-emitting device which comprises a compound semiconductor layer having a light-emitting layer portion, of which first main surface being used as a light extraction surface, and a device substrate bonded to the second main surface side of the compound semiconductor layer while placing a main metal layer having a reflective surface for reflecting light from the light-emitting layer portion towards the light extraction surface side; comprising the steps of:

forming a diffusion-blocking layer, which is composed of an inorganic conductive material, and is provided for blocking diffusion of components derived from the device substrate into the main metal layer, on the surface of the device substrate on the side to which the compound semiconductor layer is to be bonded;

forming the main metal layer on at least either one of the second main surface of the compound semiconductor layer, and the main surface of the diffusion-blocking layer formed on the device substrate; and thereafter bonding the device substrate and the compound semiconductor while placing the diffusion-blocking layer and the main metal layer in between.

26. The method of fabricating a light-emitting device as claimed in claim 25, wherein the device substrate and the compound semiconductor layer are stacked while placing the diffusion-blocking layer and the main metal layer in between, and subjected to bond annealing in this status to thereby bond the device substrate and the compound semiconductor layer.

27. The method of fabricating a light-emitting device as claimed in claim 25, wherein the diffusion blocking layer is composed of a conductive oxide.

28. The method of fabricating a light-emitting device as claimed in claim 27, wherein the conductive oxide is ITO.

29. The method of fabricating a light-emitting device as claimed in claim 28, wherein the thickness of the diffusion-blocking layer is 1 nm to 10 µm, both ends inclusive.

30. The method of fabricating a light-emitting device as claimed in claim 25, wherein a substrate-side bonding metal layer for reducing junction resistance between the device substrate and the diffusion-blocking layer is formed in on the main surface of the device substrate, and the diffusion-blocking layer is formed on the substrate-side bonding metal layer.

31. The method of fabricating a light-emitting device as claimed in claim 25, wherein the main metal layer is composed of an Au-base layer containing Au as a major component at least at the portion thereof including the interface with the diffusion-blocking layer, and the device substrate is an Si substrate.

32. The method of fabricating a light-emitting device as claimed in claim 31, wherein the device substrate is an n-type Si substrate, and further comprises a substrate-side bonding metal layer which is composed of an AuSb alloy or an AuSn alloy, and is provided for reducing junction resistance between the Si substrate and the diffusion-blocking layer, interposed between the diffusion-blocking layer and the Si substrate.

33. The method of fabricating a light-emitting device as claimed in claim 25, further comprising the steps of:

disposing a first Au-base layer intended for becoming the main metal layer and containing Au as a major component on a bonding-side surface of the compound semiconductor layer, where the bonding-side surface being assumed as the main surface of the compound semiconductor layer opposite to that serves as the light extraction surface as a bonding-side surface;

disposing a second Au-base layer intended for becoming the main metal layer and containing Au as a major component on a bonding-side surface of the device substrate, where the bonding-side surface is the main surface of the device substrate for being located on the light-emitting layer portion side; and bonding the first Au-base layer and the second Au-base layer under close contact.

34. The method of fabricating a light-emitting device as claimed in claim 33, wherein an Si substrate is used as the device substrate.

35. The method of fabricating a light-emitting device as claimed in claim 33, wherein the reflective layer is formed by the first Au-base layer.

* * * * *